(12) United States Patent
Saito et al.

(10) Patent No.: US 7,266,012 B2
(45) Date of Patent: Sep. 4, 2007

(54) MAGNETORESISTIVE EFFECT ELEMENT AND MAGNETIC MEMORY

(75) Inventors: Yoshiaki Saito, Kawasaki (JP); Hideyuki Sugiyama, Yokohama (JP); Tomoaki Inokuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 11/373,305

(22) Filed: Mar. 13, 2006

(65) Prior Publication Data
US 2007/0019463 A1    Jan. 25, 2007

(30) Foreign Application Priority Data
Jul. 20, 2005   (JP)   ............... 2005-210370

(51) Int. Cl.
*G11C 11/00* (2006.01)
(52) U.S. Cl. .................. 365/158; 365/171; 365/173
(58) Field of Classification Search ................ 365/158, 365/171, 173
See application file for complete search history.

(56) References Cited

U.S. PATENT DOCUMENTS

| | | | |
|---|---|---|---|
| 6,256,223 B1 | 7/2001 | Sun | |
| 6,611,405 B1 | 8/2003 | Inomata et al. | |
| 6,714,444 B2 | 3/2004 | Huai et al. | |
| 6,751,074 B2 | 6/2004 | Inomata et al. | |
| 6,807,033 B2 * | 10/2004 | Zhu | 360/324 |
| 6,956,766 B2 | 10/2005 | Nakamura et al. | |
| 6,987,653 B2 | 1/2006 | Inomata et al. | |
| 7,016,161 B2 * | 3/2006 | Hayakawa | 360/322 |
| 7,038,894 B2 | 5/2006 | Inomata et al. | |
| 2005/0057960 A1 | 3/2005 | Saito et al. | |
| 2005/0195532 A1 | 9/2005 | Sugiyama et al. | |

OTHER PUBLICATIONS

U.S. Appl. No. 11/228,326, filed Sep. 19, 2005, Tomoaki Inokuchi et al.
U.S. Appl. No. 11/368,383, filed Mar. 7, 2006, Yoshiaki Saito et al.

* cited by examiner

*Primary Examiner*—Richard T. Elms
*Assistant Examiner*—Hien Nguyen
(74) *Attorney, Agent, or Firm*—Oblon, Spivak, McClelland, Maier & Neustadt, P.C.

(57) ABSTRACT

It is made possible to provide a highly reliable magnetoresistive effect element and magnetic memory that operate with low power consumption and low current writing. The magnetoresistive effect element includes: a magnetization free layer including at least two magnetic layers subject to antiferromagnetic coupling and a non-magnetic layer provided between the magnetic layers; a tunnel barrier layer provided on one surface of the magnetization free layer; a first magnetization pinned layer provided on an opposite surface of the tunnel barrier layer from the magnetization free layer; a non-magnetic metal layer provided on an opposite surface of the magnetization free layer from the tunnel barrier layer; and a second magnetization pinned layer provided on an opposite surface of the non-magnetic metal layer from the magnetization free layer. The first and second magnetization pinned layers are substantially the same in magnetization direction. The non-magnetic metal layer includes Cu, Ag, Au, or an alloy of them. The non-magnetic layer in the magnetization free layer includes Ru, Rh, Ir or an alloy of them.

44 Claims, 44 Drawing Sheets

US 7,266,012 B2

MAGNETORESISTIVE EFFECT ELEMENT AND MAGNETIC MEMORY

CROSS-REFERENCE TO RELATED APPLICATION

This application is based upon and claims the benefit of priority from prior Japanese Patent Application No. 2005-210370 filed on Jul. 20, 2005 in Japan, the entire contents of which are incorporated herein by reference.

BACKGROUND OF THE INVENTION

1. Field of the Invention

The present invention relates to a magnetoresistive effect element and a magnetic memory.

2. Related Art

Magnetoresistive effect elements using magnetic material films are used in, for example, magnetic heads and magnetic sensors. In addition, it is proposed to use the magnetoresistive effect elements in solid state MRAMs (Magnetic Random Access Memories).

As a magnetoresistive effect element which has a sandwich structure film formed by inserting a single layer of a dielectric between two ferromagnetic layers, which causes a current to flow perpendicularly to the surface, and utilizes a tunnel current, the so-called "ferromagnetic TMR (Tunneling Magneto-Resistance effect) element" is proposed in recent years. Since it has become possible to obtain a magnetoresistance change rate of 20% or more in the TMR element, technical development for public welfare application of the element to the MRAM is being conducted vigorously.

This TMR element can be implemented by forming a thin Al (aluminum) layer having a thickness in the range of 0.6 to 2.0 nm on a ferromagnetic layer, exposing a surface of the Al layer to oxygen glow discharge or oxygen gas, and thereby forming a tunnel barrier layer formed of $Al_2O_3$.

A ferromagnetic single tunnel junction having a structure obtained by providing one of the ferromagnetic layers having the tunnel barrier layer of a ferromagnetic single tunnel junction between with an antiferromagnetic layer is proposed. Furthermore, a ferromagnetic tunnel junction having magnetic particles scattered in a dielectric, and a ferromagnetic double tunnel junction having a continuous film as each of the ferromagnetic layers.

These magnetoresistive effect elements also have a possibility of being applied to the MRAMs because it has become possible to obtain a magnetoresistance change rate in the range of 20 to 50% and the decrease of the magnetoresistance change rate can also be suppressed by raising the voltage value applied to the TMR element to obtain a desired output voltage value.

The magnetic recording element using the ferromagnetic single tunnel junction or the ferromagnetic double tunnel junction is non-volatile, and has a potential that a write and read time is 10 nanoseconds or less and the number of times of rewriting is also $10^{15}$ or more. Especially in the magnetic recording element using the ferromagnetic double tunnel junction, the decrease of the magnetoresistance change rate can be suppressed even if the voltage value applied to the ferromagnetic tunnel junction element is raised, as described above. Therefore, a large output voltage is obtained, and characteristics that are favorable as the magnetic recording element are obtained.

Since inversion is conducted using a current magnetic field based on a current pulse when writing to the magnetic recording layer is executed, power consumption is high. When the capacity is increased, there is a limit in allowable current density for wiring and consequently a large capacity cannot be obtained. Unless the absolute value of the current is 1 mA or less, or it is 0.2 mA or less for substitution for DRAMs, the area of the driver for letting flow a current increases. As compared with other non-volatile solid-state magnetic memories, such as ferro-electric random access memories using ferroelectric capacitors or flash memories, there is a problem that the chip size becomes large and competitive power is lost.

In order to solve the above-described problem, a solid-state magnetic storage device having a thin film formed of a high permeability magnetic material around writing wiring is proposed. According to these magnetic memories, a high permeability magnetic film is provided around wiring, and consequently a current value required to write information into the magnetic recording layer can be reduced efficiently.

Even if high permeability magnetic films are used, however, it is very difficult to cause the write current value to become 1 mA or less.

In order to solve these problems, a write method using a spin injection method is proposed (see, for example, U.S. Pat. No. 6,256,223). This spin injection method utilizes inversion of the magnetization direction of the magnetic recording layer obtained by injecting a spin-polarized current into the magnetic recording layer of the memory element.

In the case where the spin injection method is applied to the TMR element, there is a problem of element destruction such as breakdown of a tunnel insulation film and there is a problem in element reliability.

Therefore, it is necessary to provide a material, structure and architecture of a new magnetoresistive effect element and a spin memory which are small in current density at the time of writing to the extent that element destruction is not caused even if writing is conducted using the spin injection method, which have resistance to heat fluctuation, and which are small in interaction with adjacent cells.

As described heretofore, a material, structure and architecture of a new magnetoresistive effect element and a spin memory which operate with low power consumption and low current writing, which are highly reliable without element destruction, which have resistance to heat fluctuation, and which are small in interaction with adjacent cells are needed.

SUMMARY OF THE INVENTION

The present invention has been achieved on the basis of recognition of such problems. An object of the present invention is to provide a highly reliable magnetoresistive effect element that operates with low power consumption and low current writing, and a magnetic memory using such a magnetoresistive effect element.

A magnetoresistive effect element according to a first aspect of the present invention includes: a magnetization free layer which includes at least two magnetic layers subject to antiferromagnetic coupling and a non-magnetic layer provided between the magnetic layers and of which a magnetization direction is changeable, the non-magnetic layer including Ru, Rh, Ir or an alloy of them; a tunnel barrier layer provided on one surface of the magnetization free layer; a first magnetization pinned layer which is provided on an opposite surface of the tunnel barrier layer from the magnetization free layer and of which a magnetization direction is pinned; a non-magnetic metal layer provided on an opposite surface of the magnetization free layer from the tunnel barrier layer, the non-magnetic metal layer including Cu, Ag, Au, or an alloy of them; and a second magnetization pinned layer which is provided on an opposite surface of the non-magnetic metal layer from the magnetization free layer and of which a magnetization direction is pinned, the first and second magnetization pinned layers being substantially the same in magnetization direction.

A magnetoresistive effect element according to a second aspect of the present invention includes: a magnetization free layer which includes at least two magnetic layers subject to antiferromagnetic coupling and a non-magnetic layer provided between the magnetic layers and of which a magnetization direction is changeable, the non-magnetic layer including Ru, Rh or an alloy of them; a tunnel barrier layer provided on one surface of the magnetization free layer; a first magnetization pinned layer which is provided on an opposite surface of the tunnel barrier layer from the magnetization free layer and of which a magnetization direction is pinned; a non-magnetic metal layer provided on an opposite surface of the magnetization free layer from the tunnel barrier layer, the non-magnetic metal layer including Ru, Rh or an alloy of them; and a second magnetization pinned layer which is provided on an opposite surface of the non-magnetic metal layer from the magnetization free layer and of which a magnetization direction is pinned, the first and second magnetization pinned layers being substantially opposite to each other in magnetization direction.

Interlayer coupling energy $J_{EX}$ between the magnetic layers in the magnetization free layer can be greater than 0.5 erg/cm$^2$.

A magnetoresistive effect element according to a third aspect of the present invention includes: a magnetization free layer which includes at least two magnetic layers subject to antiferromagnetic coupling and a non-magnetic layer provided between the magnetic layers and of which a magnetization direction is changeable, interlayer coupling energy $J_{EX}$ between the magnetic layers in the magnetization free layer being greater than 0.5 erg/cm$^2$; a tunnel barrier layer provided on one surface of the magnetization free layer; a first magnetization pinned layer which is provided on an opposite surface of the tunnel barrier layer from the magnetization free layer and of which a magnetization direction is pinned; a non-magnetic metal layer provided on an opposite surface of the magnetization free layer from the tunnel barrier layer; and a second magnetization pinned layer which is provided on an opposite surface of the non-magnetic metal layer from the magnetization free layer and of which a magnetization direction is pinned.

The magnetoresistive effect element can further includes a dielectric layer provided on a first region in an opposite surface of the magnetization free layer from the tunnel barrier layer, the non-magnetic metal layer can be provided on a second region other than the first region in the opposite surface of the magnetization free layer from the tunnel barrier layer, and the second magnetization pinned layer can be provided so as to cover opposite surfaces respectively of the non-magnetic metal layer and the dielectric layer from the magnetization free layer.

An interface between the dielectric layer and the second magnetization pinned layer and an interface between the non-magnetic metal layer and the second magnetization pinned layer can be substantially coplanar.

An interface between the dielectric layer and the second magnetization pinned layer can be located farther from an interface between the tunnel barrier layer and the magnetization free layer than an interface between the non-magnetic metal layer and the second magnetization pinned layer.

An interface between the dielectric layer and the magnetization free layer can be located nearer an interface between the tunnel barrier layer and the magnetization free layer than an interface between the non-magnetic metal layer and the magnetization free layer.

The magnetoresistive effect element can further include a dielectric layer provided on a first region in an opposite surface of the non-magnetic metal layer from the magnetization free layer, the second magnetization pinned layer can be provided so as to cover a second region other than the first region in the opposite surface of the non-magnetic metal layer from the magnetization free layer and an opposite surface of the dielectric layer from the non-magnetic metal layer.

An interface between the dielectric layer and the second magnetization pinned layer and an interface between the non-magnetic metal layer and the second magnetization pinned layer can be substantially coplanar.

The magnetoresistive effect element can further include a dielectric layer provided on a first region in the opposite surface of the magnetization free layer from the tunnel barrier layer, the non-magnetic metal layer can be provided on a second region other than the first region in the opposite surface of the magnetization free layer from the tunnel barrier layer so as to cover an opposite surface of the dielectric layer from the magnetization free layer, and the second magnetization pinned layer can be provided on the opposite surface of the non-magnetic metal layer from the magnetization free layer.

An interface between the dielectric layer and the magnetization free layer and an interface between the non-magnetic metal layer and the magnetization free layer can be substantially coplanar.

At least one of the first and second magnetization pinned layers can have a three-layer structure including a magnetic layer/a non-magnetic layer/a magnetic layer, or a five-layer structure including a magnetic layer/a non-magnetic layer/a magnetic layer/a non-magnetic layer/a magnetic layer.

The magnetoresistive effect element can further include an anti-ferromagnetic film being in contact with at least one of the first and second magnetization pinned layers.

A magnetic memory according to a fourth aspect of the present invention includes: a memory cell including a magnetoresistive effect element above-described; a first wiring electrically connected to a first end of the magnetoresistive effect element; and a second wiring electrically connected to a second end of the magnetoresistive effect element.

A magnetic memory according to a fifth aspect of the present invention includes: a memory cell comprising first and second magnetoresistive effect elements above-described; a first wiring electrically connected to first ends of the first and second magnetoresistive effect elements; a second wiring electrically connected to a second end of the first magnetoresistive effect element; and a third wiring electrically connected to a second end of the second magnetoresistive effect element, wherein a layer arrangement of the first magnetoresistive effect element in a direction directed from the first wiring to the second wiring is opposite to a layer arrangement of the second magnetoresistive effect element in a direction directed from the first wiring to the third wiring.

The magnetic memory further includes: a first readout transistor having a first end connected to the second wiring; a second readout transistor having a first end connected to the third wiring; and a differential amplifier circuit connected to a second end of the first readout transistor and a second end of the second readout transistor.

DETAILED DESCRIPTION OF THE INVENTIONS

Hereafter, embodiments of the present invention will be described in detail with reference to the drawings.

Prior to description of embodiments according to the present invention, the principle of the present invention will now be described.

As to a TMR element including an antiferromagnetic layer, a magnetization pinned layer provided on the antiferromagnetic layer, a tunnel barrier layer provided on the magnetization pinned layer, a magnetic recording layer (magnetization free layer) provided on the tunnel barrier layer so as to have a laminated film including a first magnetic layer/a non-magnetic layer/a second magnetic layer, and a non-magnetic metal layer provided on the magnetic recording layer, three kinds are fabricated. In the magnetic recording layer of these TMR elements, the first magnetic layer and the second magnetic layer are subject to antiferromagnetic coupling. The magnetic recording layer is a magnetization free layer of antiferromagnetic coupling.

The fabricated TMR elements have the antiferromagnetic layer formed of IrMn (12 nm), the magnetization pinned layer formed of $Co_{90}Fe_{10}$ (3 nm), the tunnel barrier layer formed of AlOx (1.4 nm), the magnetic recording layer formed of $Co_{90}Fe_{10}$ (3 nm)/Ru/$Co_{90}Fe_{10}$ (5 nm), and the non-magnetic metal layer formed of Ru. Each of the numerical values in ( ) indicates the film thickness. Three kinds which are 0.95 nm, 1.05 nm and 1.15 nm in thickness of the Ru layer in the magnetic recording layer are fabricated. In addition, TMR elements having different junction areas are fabricated for each kind. Measured junction areas are 0.28 $\mu m^2$, 0.39 $\mu m^2$, 0.52 $\mu m^2$ and 0.67 $\mu m^2$.

The fabricated TMR elements of the three kinds have the following configurations.

1) IrMn (12 nm)/$Co_{90}Fe_{10}$ (3 nm)/AlOx (1.4 nm)/$Co_{90}Fe_{10}$ (3 nm)/Ru (0.95 nm)/$Co_{90}Fe_{10}$ (5 nm)/Ru

2) IrMn (12 nm)/$Co_{90}Fe_{10}$ (3 nm)/AlOx (1.4 nm)/$Co_{90}Fe_{10}$ (3 nm)/Ru(1.05 nm)/$Co_{90}Fe_{10}$ (5 nm)/Ru

3) IrMn (12 nm)/$Co_{90}Fe_{10}$ (3 nm)/AlOx (1.4 nm)/$Co_{90}Fe_{10}$ (3 nm)/Ru (1.15 nm)/$Co_{90}Fe_{10}$ (5 nm)/Ru

Figure 3:
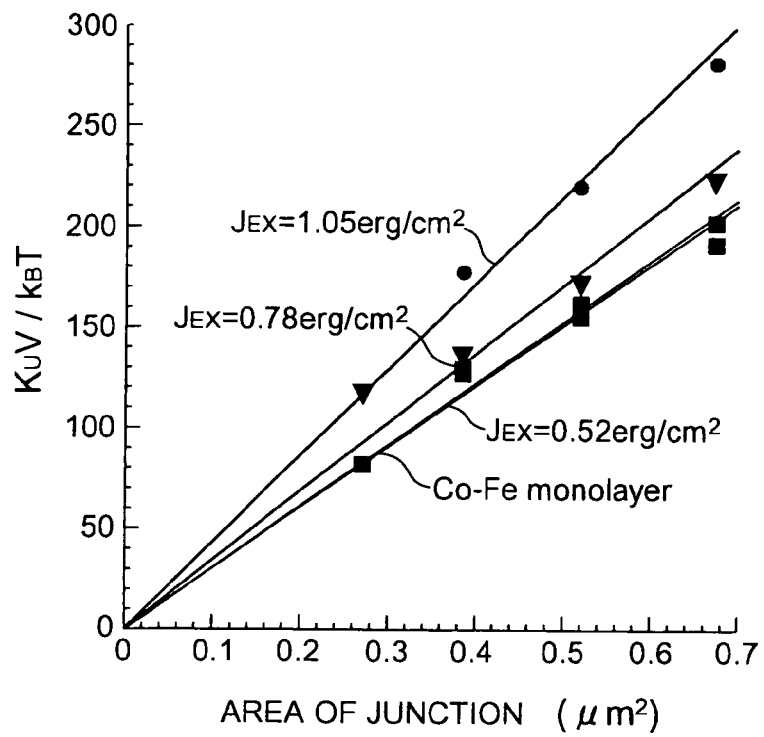
FIG. 3 is a diagram showing dependence of a thermal agitation resistance factor of a TMR element upon an element junction area.

A current is caused to flow through wiring separately provided over these TMR elements to generate a magnetic field and MR characteristics of the TMR elements are measured. And a thermal agitation resistance factor ($K_uV/k_BT$), which is a ratio of magnetic energy to thermal energy of the magnetic layer, is found on the basis of dependence of the MR characteristics upon the sweep rate. In addition, dependence of the thermal agitation resistance factor upon the area of the junction is found. This result is shown in FIG. 3. Here, $K_u$ is a magnetic anisotropy energy density of the magnetic layer, V is a volume of the magnetic layer, $k_B$ is the Boltzmann's constant, and T is an absolute temperature of the magnetic layer.

Figure 4:
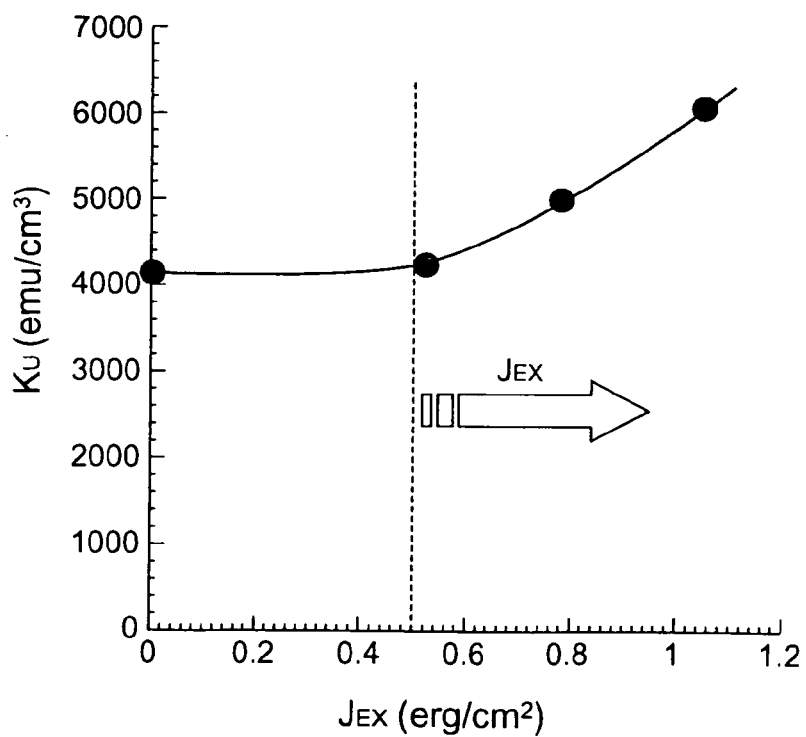
FIG. 4 is a diagram showing dependence of a thermal agitation resistance factor of a TMR element upon interaction between magnetic layers in a synthetic antiferromagnetic coupling free layer.

Furthermore, interlayer exchange coupling energy $J_{EX}$, which is intensity of interaction between the first and second magnetic layers, in the TMR elements of the above-described three kinds, which differ in thickness of the Ru layer in the magnetic recording layer, is calculated. Thus, dependence of the magnetic anisotropy energy density $K_u$ upon the interlayer exchange coupling energy $J_{EX}$ is found. This result is shown in FIG. 4.

As a comparative example, a TMR element having a single magnetic recording layer is also fabricated. The TMR element of this comparative example has the following configuration.

4) IrMn (12 nm)/$Co_{90}Fe_{10}$ (3 nm)/AlOx (1.4 nm)/$Co_{90}Fe_{10}$ (3 nm)/Ru

Measurements are conducted on the comparative example as well in the same way as the above-described TMR element. Results are shown in FIGS. 3 and 4.

If the intensity of the interaction between magnetic recording layers having a synthetic laminated structure of antiferromagnetic coupling including the first magnetic layer/the non-magnetic layer/the second magnetic layer is Jex>0.5 erg/cm², then the thermal agitation resistance at the time when the structure is made fine is improved as evident from results shown in FIGS. 3 and 4. Therefore, it becomes possible to prevent element information from being erased by thermal fluctuation when the structure is made fine.

It has been found that use of a magnetic recording layer having a synthetic antiferromagnetic coupling structure brings about a merit that false operation caused by a leakage field from adjacent memory cells is eliminated even when the distance between adjacent memory cells becomes shorter than 0.1 µm.

Therefore, embodiments of the present invention relate to a magnetoresistive effect element including a magnetic recording layer having a synthetic antiferromagnetic coupling structure and a magnetic memory including this magnetoresistive effect element.

FIRST EMBODIMENT

Figure 1:
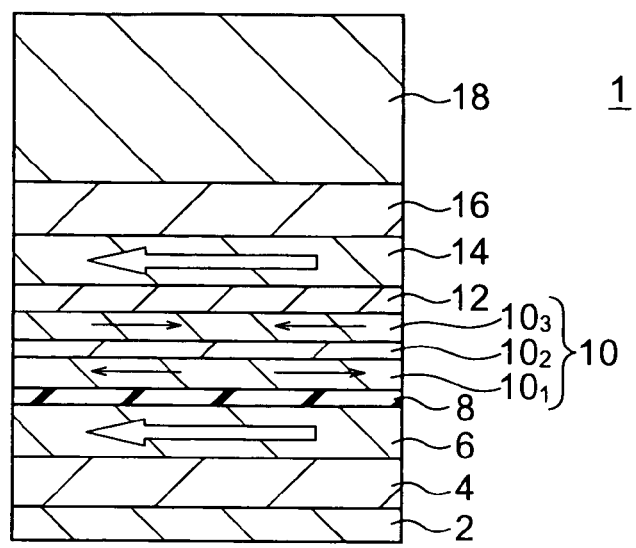
FIG. 1 is a sectional view showing a magnetoresistive effort element according to a first embodiment of the present invention.

A magnetoresistive effect element according to a first embodiment of the present invention is shown in FIG. 1. A magnetoresistive effect element 1 according to this embodiment includes an antiferromagnetic layer 4 provided on an underlying layer 2, a first magnetization pinned layer 6 provided on the antiferromagnetic layer 4 and pinned in direction of magnetization (spin), a tunnel barrier layer 8 provided on the first magnetization pinned layer 6, a magnetic recording layer (magnetization free layer) 10 provided on the tunnel barrier layer 8 so as to have a changeable direction of magnetization and have a synthetic antiferromagnetic coupled and laminated film including a magnetic layer $10_1$/a non-magnetic layer $10_2$/a magnetic layer $10_3$, a non-magnetic metal layer 12 provided on the magnetic recording layer 10, a second magnetization pinned layer 14 provided on the non-magnetic metal layer 12 and pinned in magnetization direction, an antiferromagnetic layer 16 provided on the second magnetization pinned layer 14, and a metal hard mask or metal protection film 18 formed on the antiferromagnetic layer 16. The magnetization direction in the magnetic recording layer is inverted by letting flow a spin-polarized current.

In the first magnetization pinned layer 6, the magnetization direction is pinned by exchange coupling force between the first magnetization pinned layer 6 and the antiferromagnetic layer 4. In the second magnetization pinned layer 14, the magnetization direction is pinned by exchange coupling force between the second magnetization pinned layer 14 and the antiferromagnetic layer 16. Furthermore, in the present embodiment, the first magnetization pinned layer 6 and the second magnetization pinned layer 14 are substantially parallel to each other in magnetization direction. Here, "directions of magnetization are parallel" means that "directions of magnetization are the same." "Directions of magnetization are antiparallel" means that "directions of magnetization are opposite.

In the magnetic recording layer 10 including the laminated film of the magnetic layer $10_1$/the non-magnetic layer $10_2$/the magnetic layer $10_3$ having the synthetic antiferromagnetic coupling, the interlayer coupling energy $J_{EX}$ is greater than 0.5 erg/cm². Therefore, the magnetoresistive effect element 1 according to the present embodiment has thermal agitation resistance. In addition, when it is used in memory cells, interaction between adjacent memory cells is slight and false operation occurs scarcely.

In the present embodiment, Cu, Ag, Au or an alloy of them is used as the non-magnetic metal layer 12. In this case, it becomes possible to write data "1" and "0" by conducting spin injection, i.e., letting flow a spin-polarized current. The present inventors have found that the write current can be reduced as compared with the case where spin injection writing is conducted on the ordinary tunnel junction element.

As the non-magnetic layer $10_2$ in the magnetic recording layer 10, Ru, Rh, Ir or an alloy of them which is small in reflection effect of the magnetic layers $10_1$ and $10_3$ and which is small in interaction between the magnetic layers $10_1$ and $10_3$ is used. However, it is more desirable to use Ru.

In general, the spin injection writing principle of an ordinary GMR element obtained by laminating a magnetization pinned layer/a non-magnetic layer/a magnetic recording layer, and an ordinary tunnel junction element obtained by laminating a magnetization pinned layer/a tunnel barrier layer/a magnetic recording layer will be described hereafter.

a) In the case where the spin moment of the magnetization pinned layer and the magnetic recording layer is spin-inverted from antiparallel to parallel:

Electrons are injected from the magnetization pinned layer side, and electrons spin-polarized in the magnetization pinned layer tunnel the tunnel barrier layer (or the non-magnetic layer) and exert spin torque on the magnetic recording layer. As a result, the spin of the magnetic recording layer are inverted from antiparallel to parallel.

b) In the case where the spin moment of the magnetization pinned layer and the magnetic recording layer is spin-inverted from parallel to antiparallel:

Electrons are injected from the magnetic recording layer, and electrons spin-polarized in the magnetization pinned layer tunnel the tunnel barrier layer. At that time, electrons having the same spin direction as that of the magnetization pinned layer have a high tunnel probability and tunnel easily. However, the antiparallel spin is reflected. Electrons reflected to the magnetic recording layer exert spin torque on the magnetic recording layer. Thus, the spin of the magnetic recording layer is inverted from parallel to antiparallel.

The current required at this time can be represented by the following expressions.

In the case of antiparallel to parallel:

$$IC^P = e\alpha MA_t[H-Hk-2\pi M]/hg(\pi)$$

In the case of parallel to antiparallel:

$$IC^{AP} = e\alpha MA_t[H+H_k+2\pi M]/hg(0)$$

Here, e is the elementary charge, α is the Gilbert damping parameter, M is magnetization, $A_t$ is the volume of the magnetic recording layer, H is the magnetic field, $H_k$ is the anisotropy constant, and h is the Plank's constant. Furthermore, g(0) and g(π) depend upon the spin at the interface between the magnetization pinned layer and the non-magnetic layer, and they are given by the following equation.

$$g(\theta) = [-4+(1+p)^3(3+\cos\theta)/4p^{3/2}]^{-1}$$

Here, p is a spin polarization factor. From this equation, it follows that g(π)>g(0). In general, therefore, the current $IC^P$ in the case where the spin is inverted from antiparallel to parallel is smaller than the current $IC^{AP}$ in the case where the spin is inverted from parallel to antiparallel.

On the other hand, the magnetoresistive effect element 1 has a configuration obtained by providing the first magnetization pinned layer 6 on one side of the magnetic recording layer 10 via the tunnel barrier layer 8 and providing the second magnetization pinned layer 14 on the other side of the magnetic recording layer via the non-magnetic metal layer 12 so as to sandwich the magnetic recording layer 10 including the magnetic layer $10_1$/non-magnetic layer $10_2$/the magnetic layer $10_3$ between them.

In the present embodiment, therefore, resistances among the first magnetization pinned layer 6, the tunnel barrier layer 8 and the magnetic recording layer 10 become greater than resistance values among the magnetic recording layer 10, the non-magnetic metal layer 12 and the second magnetization pinned layer 14. The change in resistance value depends upon relative spin direction among the first magnetization pinned layer 6, the tunnel barrier layer 8 and the magnetic recording layer 10.

In the present embodiment, electrons are injected from the first magnetization pinned layer 6 side to the magnetic recording layer 10 when the spin moment in the magnetic layer $10_1$ included in the magnetic recording layer 10 and located near the tunnel barrier layer 8 is inverted from antiparallel to parallel and the spin moment in the magnetic layer $10_3$ included in the magnetic recording layer 10 and located near the non-magnetic metal layer 12 is inverted from parallel to antiparallel. In this case, electrons spin-polarized in the same direction as the direction of magnetization of the first magnetization pinned layer 6 in the first magnetization pinned layer 6 tunnel the tunnel barrier layer 8, and exert spin torque on the magnetic recording layer 10. In addition, electrons are injected from the magnetic recording layer 10 including the magnetic layer $10_1$/the non-magnetic layer $10_2$/the magnetic layer $10_3$ subjected to antiferromagnetic coupling to the second magnetization pinned layer 14 via the non-magnetic metal layer 12. At this time, the spin moment in the second magnetization pinned layer 14 is parallel to the spin moment in the magnetic layer $10_3$ in the magnetic recording layer 10 while the spin moment in the magnetic layer $10_1$ is antiparallel to the spin moment in the first magnetization pinned layer 6. By selecting the above-described material (Cu, Ag, Au or an alloy of them) as the non-magnetic metal layer 12, therefore, electrons having a spin moment antiparallel to the direction of the spin moment of the second magnetization pinned layer are reflected by the second magnetization pinned layer 14 and exert spin torque on the magnetic recording layer 10. In the magnetic recording layer 10, therefore, the spin moment in the magnetic layer $10_1$ located near the tunnel barrier layer 8 is inverted from antiparallel to parallel with respect to the spin moment in the first magnetization pinned layer 6, whereas the spin moment in the magnetic layer $10_3$ located near the non-magnetic metal layer 12 is inverted from parallel to antiparallel. The current value of spin injection is remarkably lowered by the two spin torques as compared with the ordinary TMR element having the single magnetic recording layer.

In the present embodiment, electrons are injected from the second magnetization pinned layer 14 to the magnetic recording layer 10 when the spin moment in the magnetic layer $10_1$ included in the magnetic recording layer 10 and located near the tunnel barrier layer 8 is inverted from parallel to antiparallel and the spin moment in the magnetic layer $10_3$ included in the magnetic recording layer 10 and located near the non-magnetic metal layer 12 is inverted from antiparallel to parallel. In this case, electrons spin-polarized in the second magnetization pinned layer 14 pass through the non-magnetic metal layer 12, flow to the magnetic recording layer 10 and exert spin torque on the magnetic recording layer 10. At this time, the spin-polarized electrons attempt to tunnel the tunnel barrier layer 8 and flow to the first magnetization pinned layer 6. When passing through the tunnel barrier layer 8, electrons having the same spin moment direction as that of the first magnetization pinned layer 6 have a high tunnel probability and tunnel easily. However, electrons having an antiparallel spin moment direction are reflected. Electrons reflected to the magnetic recording layer including the magnetic layer $10_1$/the non-magnetic layer $10_2$/the magnetic layer $10_3$ exert spin torque on the magnetic recording layer 10. The spin moment of the magnetic recording layer 10 is inverted to the opposite direction by the two spin torques. In this case as well, the current value of spin injection is remarkably lowered as compared with the ordinary TMR element having the single magnetic recording layer.

Therefore, it becomes possible to write data "1" and "0" with low power consumption by conducting spin injection in the magnetoresistive effect element according to the present embodiment. In addition, the write current can be reduced as compared with the case where spin injection writing is conducted to the ordinary tunnel junction element in which the magnetic recording layer has a single layer. When conducting writing, therefore, it becomes possible to prevent the tunnel barrier layer from being broken down in insulation. And a highly reliable magnetic memory can be obtained.

By the way, in the first embodiment, the non-magnetic metal layer 12 may be replaced by a tunnel barrier layer.

In the present embodiment, the first magnetization pinned layer 6 is substantially parallel in spin moment direction to the second magnetization pinned layer 14. In order to eliminate the leakage field from the first and second magnetization pinned layers 6 and 14, however, it is more desirable to use a three-layer laminated film including a magnetic layer $6_1$/a non-magnetic layer $6_2$/a magnetic layer $6_3$ as the first magnetization pinned layer 6 and use a three-layer laminated film including a magnetic layer $14_1$/a non-magnetic layer $14_2$/a magnetic layer $14_3$ as the second magnetization pinned layer 14 as in the magnetoresistive effect element 1A according to the modification shown in FIG. 2. It is desirable to use this structure, because the magnetization pinning in the first and second magnetization pinned layers 6 and 14 becomes firmer and the magnetization pinned layers become more stable when spin injection writing is conducted. Furthermore, if such a magnetoresistive effect element is used in a memory cell, interaction between adjacent memory cells is also reduced.

SECOND EMBODIMENT

Figure 5:
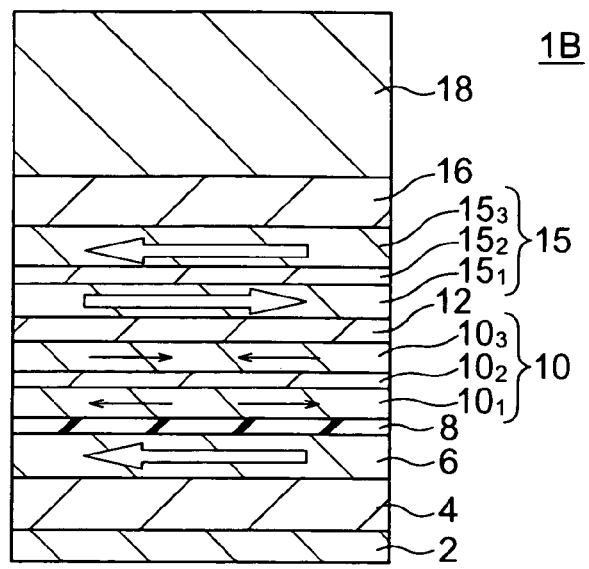
FIG. 5 is a sectional view showing a magnetoresistive effort element according to a second embodiment of the present invention.

A magnetoresistive effect element according to a second embodiment of the present invention is shown in FIG. 5. A magnetoresistive effect element 1B according to this embodiment has a configuration obtained by replacing the second magnetization pinned layer 14 in the magnetoresistive effect element 1 according to the first embodiment shown in FIG. 1 with a second magnetization pinned layer 15 and forming the non-magnetic metal layer 12 of Ru or Rh. The second magnetization pinned layer 15 includes a magnetic layer $15_1$ provided on the non-magnetic metal layer 12 side, a non-magnetic layer $15_2$ provided on the magnetic layer $15_1$, and a magnetic layer $15_3$ provided on the non-magnetic layer $15_2$. And the direction of magnetization in the magnetic layer 151 is substantially antiparallel to the direction of magnetization in the first magnetization pinned layer 6.

In the magnetic recording layer 10 according to the present embodiment including the laminated film of the magnetic layer $10_1$/the non-magnetic layer $10_2$/the magnetic layer $10_3$ having the synthetic antiferromagnetic coupling, the interlayer coupling energy $J_{EX}$ is greater than 0.5 erg/cm$^2$, in the same way as the first embodiment. Therefore, the magnetoresistive effect element 1B according to the present embodiment has thermal agitation resistance. In addition, when it is used in memory cells, interaction between adjacent memory cells is slight and false operation occurs scarcely.

In the present embodiment, Ru, Rh or an alloy of them is used as the non-magnetic metal layer 12. In this case, it becomes possible to write information "1" and "0" by conducting spin injection, i.e., letting flow a spin-polarized current. The write current can be reduced as compared with the case where spin injection writing to the ordinary tunnel junction element is conducted.

As the non-magnetic layer $10_2$ in the magnetic recording layer 10, Ru, Rh, or an alloy of them which is small in reflection effect of the magnetic layers $10_1$ and $10_3$ and which is small in interaction between the magnetic layers $10_1$ and $10_3$ is used. However, it is more desirable to use Rh.

In the present embodiment, Ru, Rh or an alloy of them is used. As compared with the first embodiment using Cu, Ag, Au or an alloy of them, therefore, the direction of the spin moment of reflected conduction electrons becomes opposite. In other words, the direction of the spin moment of electrons reflected by the second magnetization pinned layer becomes the same as the direction of the magnetization in the second magnetization pinned layer. As in the present invention, therefore, it is necessary to make spin moment directions of the magnetic layers included in the first and second magnetization pinned layers having the magnetic recording layer 10 between and located closest to the magnetic recording layer 10 differ by substantially 180 degrees, i.e., make them antiparallel to each other.

In the present embodiment, electrons are injected from the first magnetization pinned layer 6 side to the magnetic recording layer 10 when the spin moment in the magnetic layer $10_1$ included in the magnetic recording layer 10 and located near the tunnel barrier layer 8 is inverted from antiparallel to parallel and the spin moment in the magnetic layer $10_3$ included in the magnetic recording layer 10 and located near the non-magnetic metal layer 12 is inverted from parallel to antiparallel. In this case, electrons spin-polarized in the same direction as the direction of magnetization of the first magnetization pinned layer 6 in the first magnetization pinned layer 6 tunnel the tunnel barrier layer 8, and exert spin torque on the magnetic recording layer 10. In addition, electrons are injected from the magnetic recording layer including the magnetic layer $10_1$/the non-magnetic layer $10_2$/the magnetic layer $10_3$ subjected to antiferromagnetic coupling to the second magnetization pinned layer 15 via the non-magnetic metal layer 12. At this time, the spin moment in the second magnetization pinned layer 15 is antiparallel to the spin moment in the magnetic layer $10_3$ in the magnetic recording layer 10 while the spin moment in the magnetic layer $10_1$ is antiparallel to the spin moment in the first magnetization pinned layer 6. By selecting the above-described material (Ru, Rh or an alloy of them) as the non-magnetic metal layer 12, therefore, electrons having a spin moment parallel to the direction of the spin moment of the magnetic layer $15_1$ in the second magnetization pinned layer 15 are reflected by the second magnetization pinned layer 15 and exert spin torque on the magnetic recording layer 10. In the magnetic recording layer 10, therefore, the spin moment in the magnetic layer $10_1$ located near the tunnel barrier layer 8 is inverted from antiparallel to parallel with respect to the spin moment in the first magnetization pinned layer 6, whereas the spin moment in the magnetic layer $10_3$ located near the non-magnetic metal layer 12 is inverted from parallel to antiparallel. The current value of spin injection is remarkably lowered by the two spin torques as compared with the ordinary TMR element having the single magnetic recording layer.

In the present embodiment, electrons are injected from the second magnetization pinned layer 15 to the magnetic recording layer 10 when the spin moment in the magnetic layer $10_1$ included in the magnetic recording layer 10 and located near the tunnel barrier layer 8 is inverted from parallel to antiparallel and the spin moment in the magnetic layer $10_3$ included in the magnetic recording layer 10 and located near the non-magnetic metal layer 12 is inverted from antiparallel to parallel. In this case, electrons having a spin moment opposite to that of the magnetic layer $15_1$ in the second magnetization pinned layer 15 flow to the magnetic recording layer 10 through the non-magnetic metal layer 12 and exert spin torque on the magnetic recording layer 10. At this time, the spin-polarized electrons attempt to tunnel the tunnel barrier layer 8 and flow to the first magnetization pinned layer 6. When passing through the tunnel barrier layer 8, electrons having the same spin moment direction as that of the first magnetization pinned layer 6 have a high tunnel probability and tunnel easily. However, electrons having an antiparallel spin moment direction are reflected. Electrons reflected to the magnetic recording layer including the magnetic layer $10_1$/the non-magnetic layer $10_2$/the magnetic layer $10_3$ exert spin torque on the magnetic recording layer 10. The spin moment of the magnetic recording layer 10 is inverted to the opposite direction by the two spin torques. In this case as well, the current value of spin injection is remarkably lowered as compared with the ordinary TMR element having the single magnetic recording layer.

If this arrangement is used, torque is applied to the magnetic recording layer doubly in the same way as the first embodiment. When conducting writing, therefore, it becomes possible to prevent the tunnel barrier layer from being broken down in insulation. Thus, a highly reliable magnetoresistive effect element can be obtained.

By the way, in the second embodiment, the non-magnetic metal layer 12 may be replaced by a tunnel barrier layer.

In the present embodiment, the magnetic layer included in the first magnetization pinned layer 6 and located nearest the magnetic recording layer 10 is substantially antiparallel in spin moment direction to the magnetic layer included in the second magnetization pinned layer and located nearest the magnetic recording layer 10. In order to eliminate the leakage field from the first magnetization pinned layer 6, however, the first magnetization pinned layer 6 may be a three-layer laminated film including a magnetic layer $6_1$/a non-magnetic layer $6_2$/a magnetic layer $6_3$ as in the magnetoresistive effect element 1C according to the first modification shown in FIG. 6. It is desirable to use this structure, because the magnetization pinning in the first magnetization pinned layer becomes firmer and the magnetization pinned layer becomes more stable when spin injection writing is conducted. Furthermore, if such a magnetoresistive effect element is used in a memory, interaction between adjacent memory cells is also reduced. By the way, in the present modification, the second magnetization pinned layer 15 is replaced by a five-layer laminated structure including a magnetic layer $15_1$/a non-magnetic layer $15_2$/a magnetic layer $15_3$/a non-magnetic layer $15_4$/a magnetic layer $15_5$. It is desirable in the second magnetization pinned layer 15 as well in the same way to use this structure, because the magnetization pinning becomes firmer and the magnetization pinned layer becomes more stable when spin injection writing is conducted. Furthermore, if such a magnetoresistive effect element is used in a memory, interaction between adjacent memory cells is also reduced.

Thus, the leakage field can be suppressed to the minimum by adjusting the magnitude of magnetization moments of the first magnetization pinned layer 6 including the magnetic layer $6_1$/the non-magnetic layer $6_2$/the magnetic layer $6_3$ and the second magnetization pinned layer 15 including the magnetic layer $15_1$/the non-magnetic layer $15_2$/the magnetic layer $15_3$/the non-magnetic layer $15_4$/the magnetic layer $15_5$ by means of the film thicknesses and materials.

Figure 6:
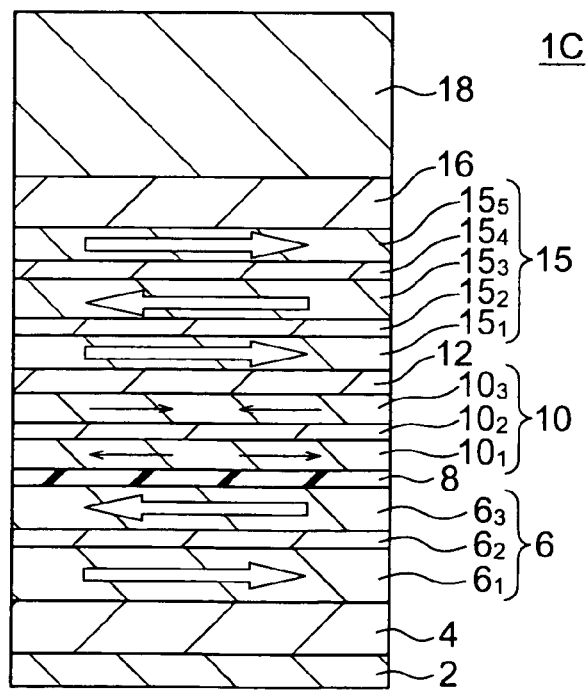
FIG. 6 is a sectional view showing a magnetoresistive effort element according to a first modification of the second embodiment.
Figure 7:
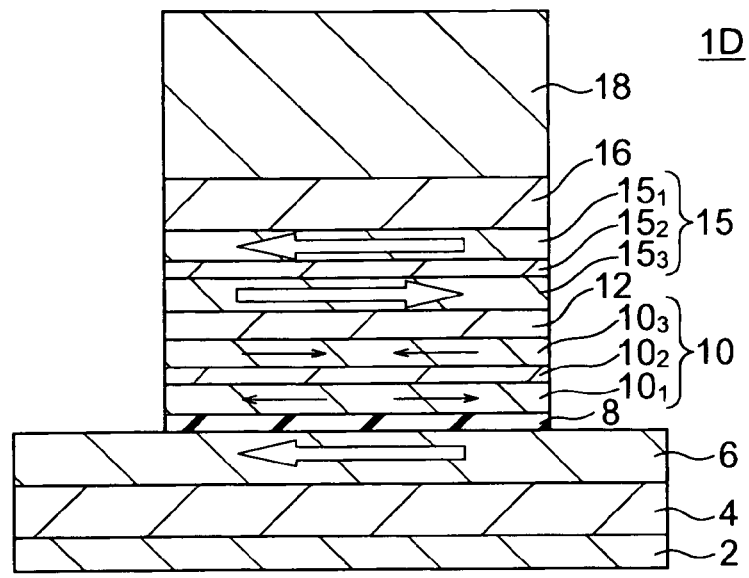
FIG. 7 is a sectional view showing a magnetoresistive effort element according to a second modification of the second embodiment.
Figure 8:
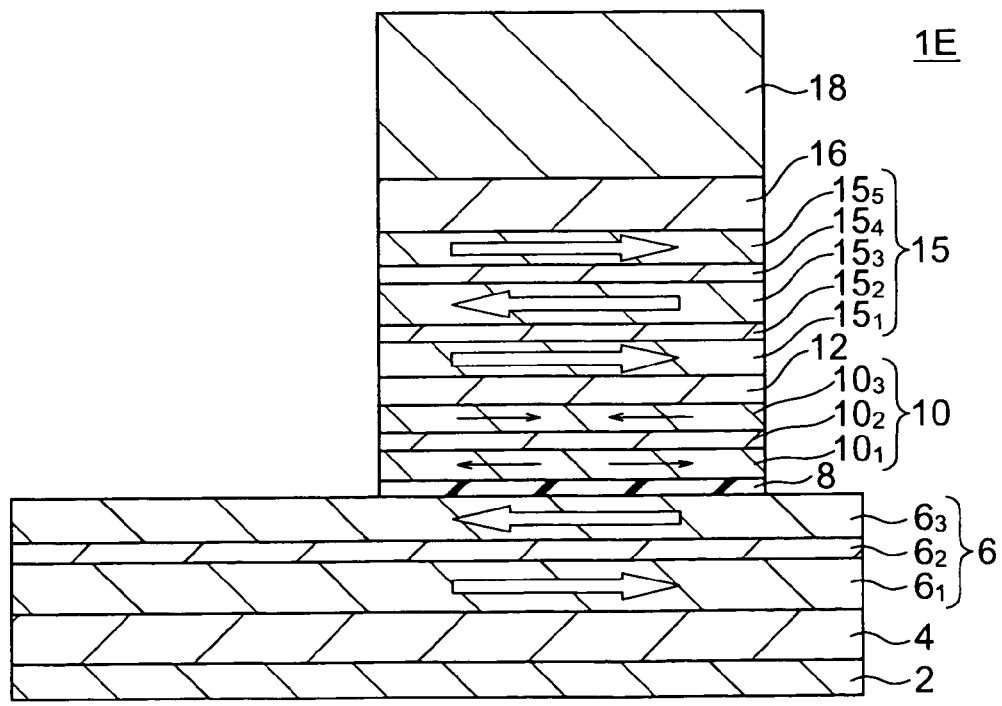
FIG. 8 is a sectional view showing a magnetoresistive effort element according to a third modification of the second embodiment.

Magnetoresistive effect elements according to a second modification and a third modification respectively shown in FIG. 7 and FIG. 8 may also be used. A magnetoresistive effect element 1D according to the second modification shown in FIG. 7 has a configuration obtained by making the area of the surface of the first magnetization pinned layer 6 larger than the area of the surface of the tunnel barrier layer 8 in the magnetoresistive effect element 1B according to the present embodiment shown in FIG. 5. A magnetoresistive effect element 1E according to the third modification shown in FIG. 8 has a configuration obtained by making the area of the surface of the first magnetization pinned layer 6 larger than the area of the surface of the tunnel barrier layer 8 in the magnetoresistive effect element 1C according to the first modification shown in FIG. 6. If the area of the surface of the first magnetization pinned layer 6 is thus made large and the place where the leakage field occurs is kept away from the magnetic recording layer 10, then it suffices to adjust only the magnitude of the magnetization moment of the second magnetization pinned layer 15 by using the film thickness, material or the like. It is more desirable because manufacturing is facilitated. This structure brings about a favorable effect in the first embodiment shown in FIG. 1 and the modification of the first embodiment shown in FIG. 2 as well.

THIRD EMBODIMENT

Figure 9:
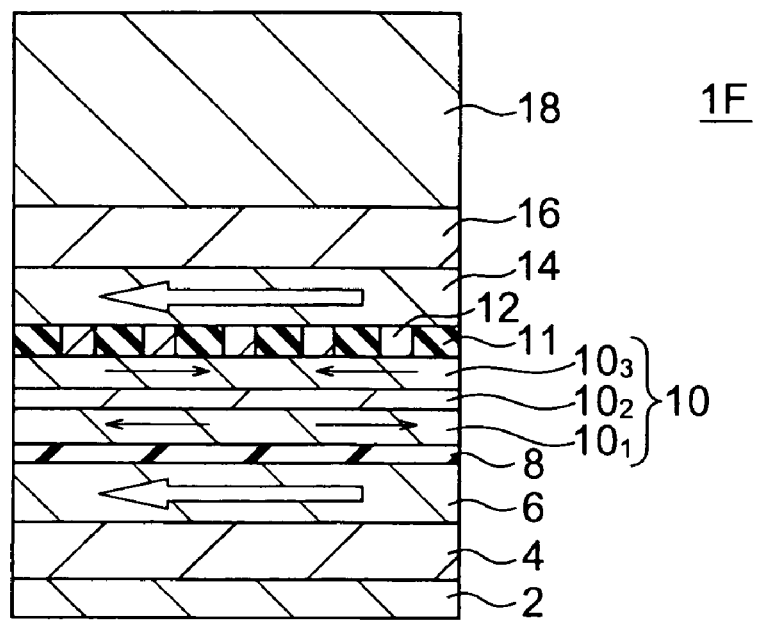
FIG. 9 is a sectional view showing a magnetoresistive effort element according to a third embodiment of the present invention.

A magnetoresistive effect element according to a third embodiment is shown in FIG. 9. The magnetoresistive effect element 1F according to this embodiment has a configuration obtained by completely dividing the non-magnetic metal layer 12 by means of the dielectric 11 in the magnetoresistive effect element 1 according to the first embodiment shown in FIG. 1. In other words, the dielectric 11 passes through the non-magnetic metal layer 12. In the present embodiment, the interface between the non-magnetic metal layer 12 and the magnetic recording layer 10 and the interface between the dielectric 11 and the magnetic recording layer 10 are substantially coplanar. The interface between the non-magnetic metal layer 12 and the second magnetization pinned layer 14 and the interface between the dielectric 11 and the second magnetization pinned layer 14 are substantially coplanar.

Figure 10:
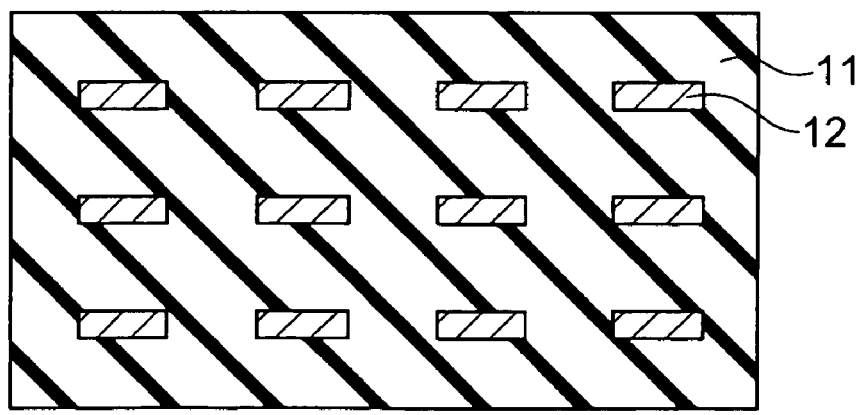
FIG. 10 is a sectional view of a non-magnetic metal layer in a film surface direction in a third embodiment.
Figure 11:
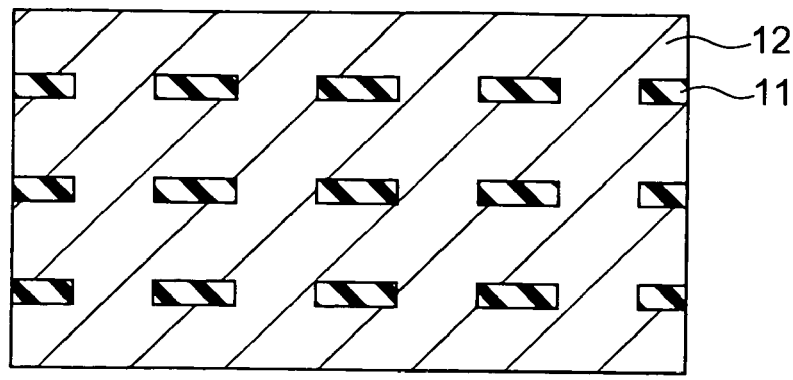
FIG. 11 is a diagram showing a pattern of a dielectric arranged regularly in a non-magnetic metal layer.

A sectional view of the non-magnetic metal layer 12 according to the present embodiment in the film surface direction is shown in FIG. 10. As appreciated from FIG. 10, the non-magnetic metal layer 12 forms a pattern in which the non-magnetic metal layer 12 is divided by the dielectric 11 and arranged regularly in the dielectric 11. The non-magnetic metal layer 12 may form a pattern in which the non-magnetic metal layer 12 is arranged in the dielectric 11 at random. The non-magnetic metal layer 12 may form a pattern in which the dielectric 11 is arranged regularly in the non-magnetic metal layer 12 as shown in FIG. 11. Or the non-magnetic metal layer 12 may form a pattern in which the dielectric 11 is arranged in the non-magnetic metal layer 12 at random.

In the magnetoresistive effect element 1F according to the present embodiment, the direction of the magnetization in the second magnetization pinned layer 14 is substantially parallel to the direction of the first magnetization pinned layer 6 in the same way as the magnetoresistive effect element 1 according to the first embodiment.

In the magnetic recording layer 10 according to the present embodiment including the laminated film of the magnetic layer $10_1$/the non-magnetic layer $10_2$/the magnetic layer $10_3$ having the synthetic antiferromagnetic coupling, the interlayer coupling energy $J_{EX}$ is greater than 0.5 erg/cm$^2$, in the same way as the first embodiment. Therefore, the magnetoresistive effect element 1F according to the present embodiment has thermal agitation resistance. In addition, when it is used in memory cells, interaction between adjacent memory cells is slight and false operation occurs scarcely.

If Cu, Ag, Au or an alloy of them is used as the non-magnetic metal layer 12 in the present embodiment, it becomes possible to write data "1" and "0" by conducting spin injection. The write current can be reduced as compared with the case where spin injection writing is conducted to the ordinary tunnel junction element. As the non-magnetic layer $10_2$ in the magnetic recording layer 10 including the magnetic layer $10_1$/the non-magnetic layer $10_2$/the magnetic layer $10_3$, Ru, Rh, Ir or an alloy of them which is small in reflection effect of the magnetic layers $10_1$ and $10_3$ and which is small in interlayer interaction is used. However, it is more desirable to use Ru.

In the present embodiment, the non-magnetic metal layer 12 is divided by the dielectric 11. Therefore, a current flows through divided portions of the non-magnetic metal layer 12 in a concentrative manner. In the present embodiment, therefore, spin inversion is excited using current concentrating portions as nuclei and consequently inversion can be converted with a further low current density as compared with the case where the non-magnetic metal layer 12 is not divided by the dielectric as in the first embodiment.

By the way, in the third embodiment, the non-magnetic metal layer 12 may be replaced by a tunnel barrier layer.

In the present embodiment, the first magnetization pinned layer 6 is substantially parallel in spin moment direction to the second magnetization pinned layer 14. In order to eliminate the leakage field from the magnetization pinned layers 6 and 14, however, it is more desirable to use a three-layer laminated film including a magnetic layer $6_1$/a non-magnetic layer $6_2$/a magnetic layer $6_3$ as the first magnetization pinned layer 6 and use a three-layer laminated film including a magnetic layer $14_1$/a non-magnetic layer $14_2$/a magnetic layer $14_3$ as the second magnetization pinned layer 14, as in the magnetoresistive effect element 1G according to the first modification shown in FIG. 12. It is desirable to use this structure, because the magnetization pinning in the magnetization pinned layers 6 and 14 becomes firmer and the magnetization pinned layer becomes more stable when spin injection writing is conducted. Furthermore, if such a magnetoresistive effect element is used in a memory, interaction between adjacent memory cells is also reduced. By the way, in the present modification, an interface between the non-magnetic metal layer 12 and the magnetic recording layer 10 and an interface between the dielectric 11 and the magnetic recording layer 10 are substantially coplanar, and an interface between the non-magnetic metal layer 12 and the second magnetization pinned layer 14 and an interface between the dielectric 11 and the second magnetization pinned layer 14 are substantially coplanar, in the same way as the third embodiment.

Figure 12:
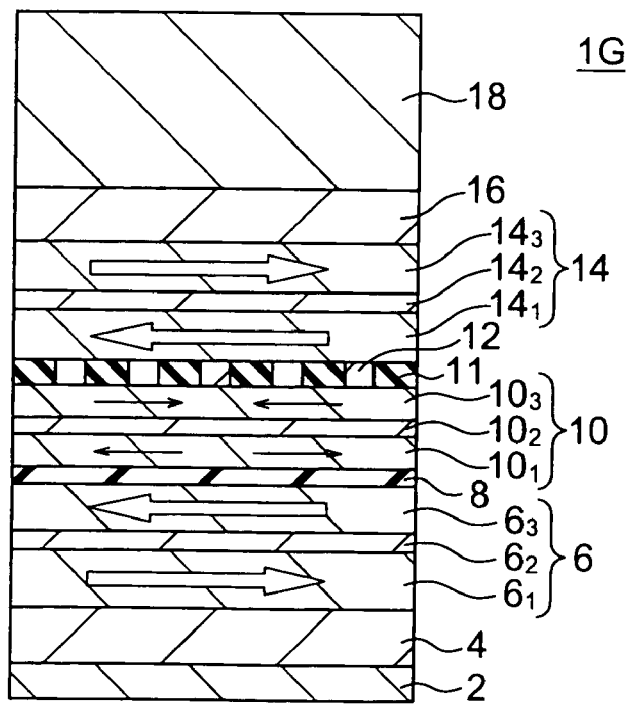
FIG. 12 is a sectional view showing a magnetoresistive effort element according to a first modification of the third embodiment.
Figure 13:
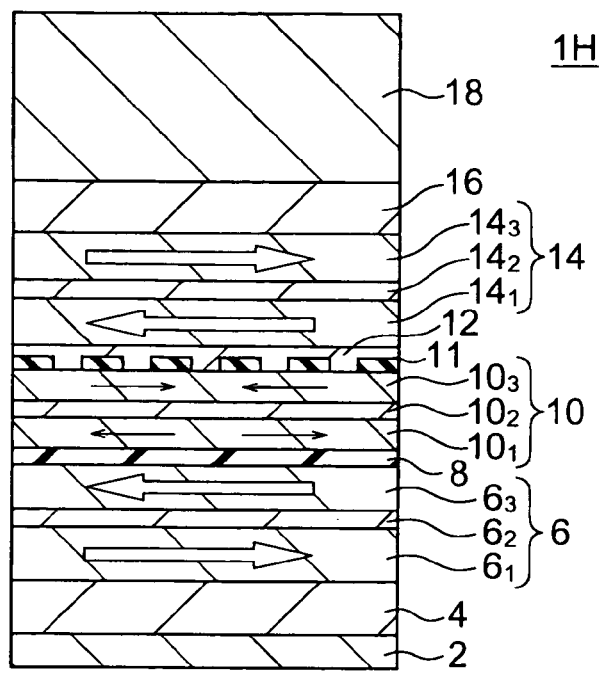
FIG. 13 is a sectional view showing a magnetoresistive effort element according to a second modification of the third embodiment.

A magnetoresistive effect element 1H according to a second modification shown in FIG. 13 may also be used. The magnetoresistive effect element 1H according to the second modification has a configuration obtained by dividing only a portion of the non-magnetic metal layer 12 located on the magnetic recording layer 10 side by means of a dielectric 11 in the first modification shown in FIG. 12. In other words, the interface between the non-magnetic metal layer 12 and the magnetic recording layer 10 and the interface between the dielectric 11 and the magnetic recording layer 10 are substantially coplanar. However, an opposite surface of the dielectric 11 from the interface between the dielectric 11 and the magnetic recording layer 10 is present within the non-magnetic metal layer 12 and located nearer the interface between the non-magnetic metal layer 12 and the magnetic recording layer 10 than the interface between the non-magnetic metal layer 12 and the second magnetization pinned layer 14. Therefore, the dielectric 11 does not pass through the non-magnetic metal layer 12.

Figure 14:
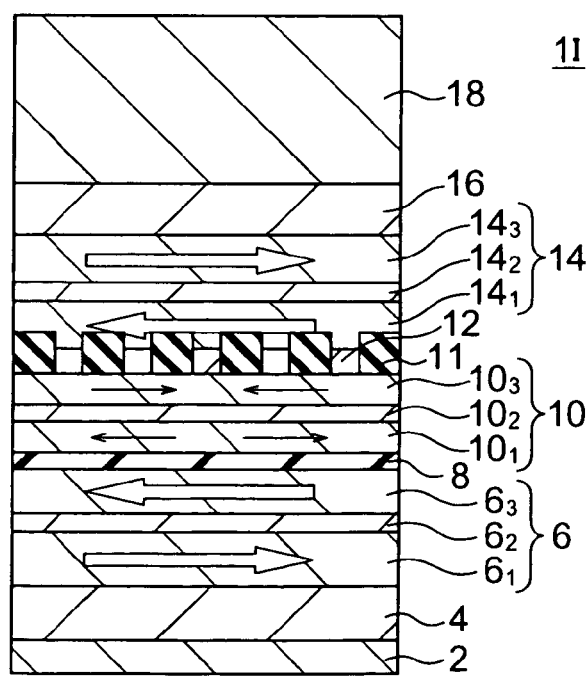
FIG. 14 is a sectional view showing a magnetoresistive effort element according to a third modification of the third embodiment.

A magnetoresistive effect element 1I according to a third modification shown in FIG. 14 may also be used. The magnetoresistive effect element 1I according to the third modification has a configuration in which the dielectric 11 completely divides the non-magnetic metal layer 12 and divides a part of the second magnetization pinned layer 14 (a part of the magnetic layer $14_1$) in the first modification shown in FIG. 12. In other words, the interface between the non-magnetic metal layer 12 and the magnetic recording layer 10 and the interface between the dielectric 11 and the magnetic recording layer 10 are substantially coplanar. However, an opposite surface of the dielectric 11 from the interface between the dielectric 11 and the magnetic recording layer 10 is present within the magnetic layer $14_1$ in the second magnetization pinned layer 14 and located farther from the interface between the non-magnetic metal layer 12 and the magnetic recording layer 10 than the interface between the non-magnetic metal layer 12 and the second magnetization pinned layer 14.

Figure 15:
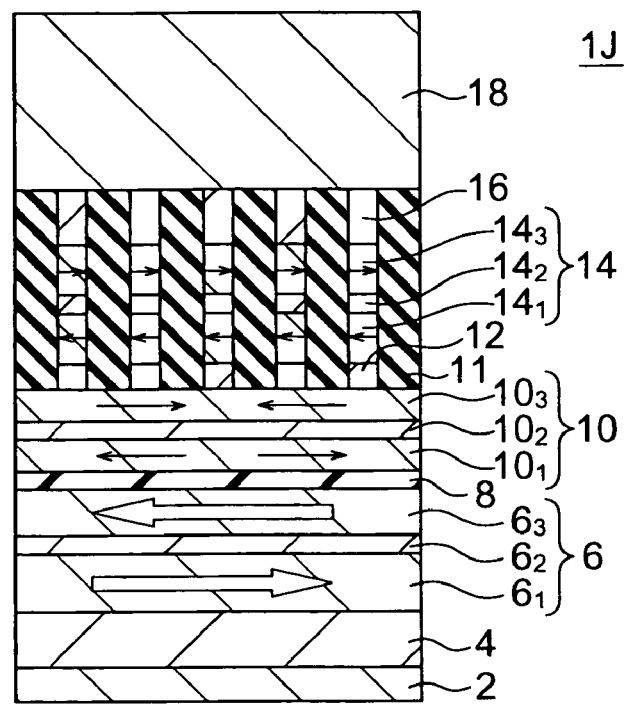
FIG. 15 is a sectional view showing a magnetoresistive effort element according to a fourth modification of the third embodiment.

A magnetoresistive effect element 1J according to a fourth modification shown in FIG. 15 may also be used. The magnetoresistive effect element 1J according to the fourth modification has a configuration in which the dielectric 11 completely divides the non-magnetic metal layer 12 and completely divides the anti-ferromagnetic layer 16 in the first modification shown in FIG. 12. In other words, the interface between the non-magnetic metal layer 12 and the magnetic recording layer 10 and the interface between the dielectric 11 and the magnetic recording layer 10 are substantially coplanar. However, an opposite surface of the dielectric 11 from the interface between the dielectric 11 and the magnetic recording layer 10 and an opposite surface of the anti-ferromagnetic layer 16 from the interface between the anti-ferromagnetic layer 16 and the second magnetization pinned layer 14 are substantially coplanar.

Figure 16:
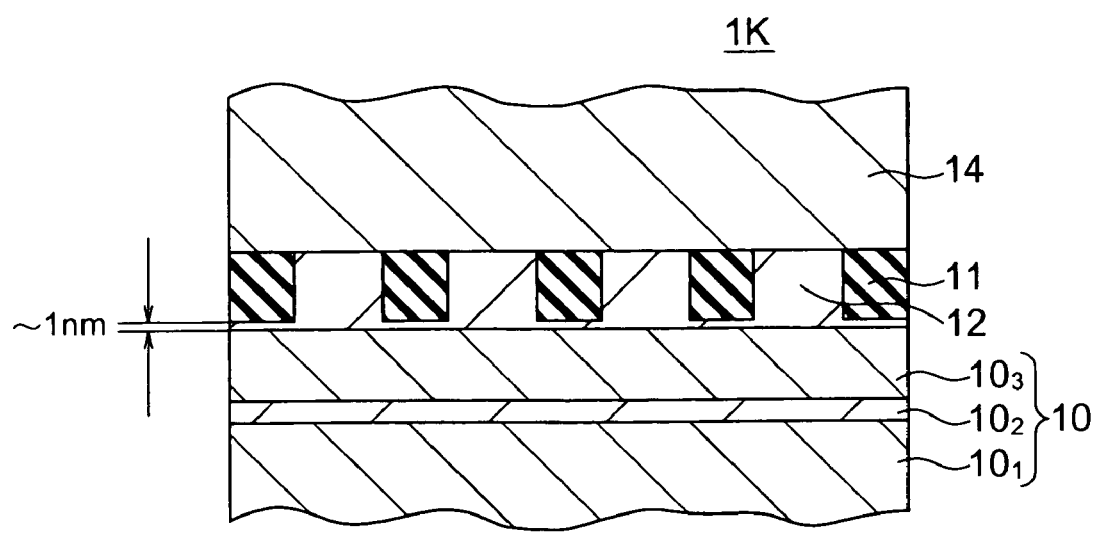
FIG. 16 is a sectional view showing a magnetoresistive effort element according to a fifth modification of the third embodiment.

A magnetoresistive effect element 1K according to a fifth modification shown in FIG. 16 may also be used. The magnetoresistive effect element 1K according to the fifth modification has a configuration in which the dielectric 11 does not completely divide the non-magnetic metal layer 12, but divides only a portion of the non-magnetic metal layer 12 located on the second magnetization pinned layer 14 side, in the third embodiment shown in FIG. 9. In other words, the magnetoresistive effect element 1K according to the fifth modification has a configuration in which the non-magnetic metal layer 12 having a thickness of, for example, approximately 1 nm is interposed between the dielectric 11 and the magnetic recording layer 10. By the way, the configuration having the non-magnetic metal layer 12 interposed between the dielectric 11 and the magnetic recording layer 10 as in the fifth modification may be applied to the magnetoresistive effect elements according to the first to fourth modifications shown in FIGS. 12 to 15.

Figure 17:
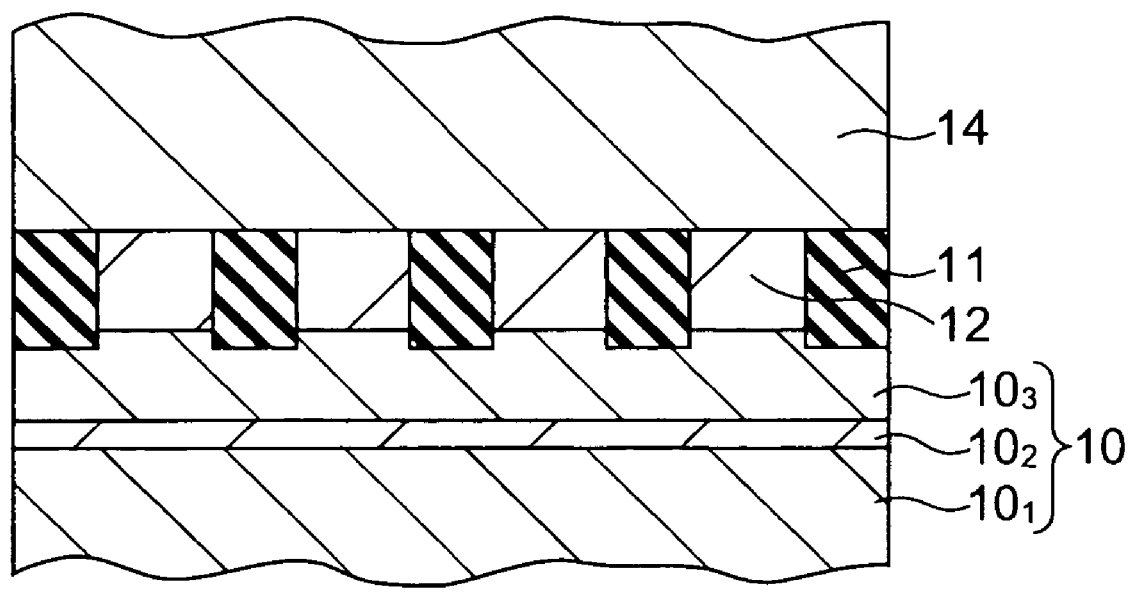
FIG. 17 is a sectional view showing a magnetoresistive effort element according to a sixth modification of the third embodiment.

In the third embodiment shown in FIG. 9, the interface between the non-magnetic metal layer 12 and the magnetic recording layer 10 and the interface between the dielectric 11 and the magnetic recording layer 10 are substantially coplanar. Alternatively, they may not be coplanar, but either of the interfaces may be located farther from the interface between the non-magnetic metal layer 12 and the second magnetization pinned layer 14 as shown in FIG. 17 (sixth modification). In FIG. 17, the interface between the dielectric 11 and the magnetic recording layer 10 is located farther from the interface between the non-magnetic metal layer 12 and the second magnetization pinned layer 14 than the interface between the non-magnetic metal layer 12 and the magnetic recording layer 10. The configuration in which either of the interfaces is located farther from the interface between the non-magnetic metal layer 12 and the second magnetization pinned layer 14 as in the present modification may be applied to the magnetoresistive effect elements according to the first to fourth modifications shown in FIGS. 12 to 15.

In the third embodiment and its modifications, the area of the surface of the first magnetization pinned layer 6 may be made large as in the second embodiment and its modifications shown in FIGS. 7 and 8.

FOURTH EMBODIMENT

Figure 18:
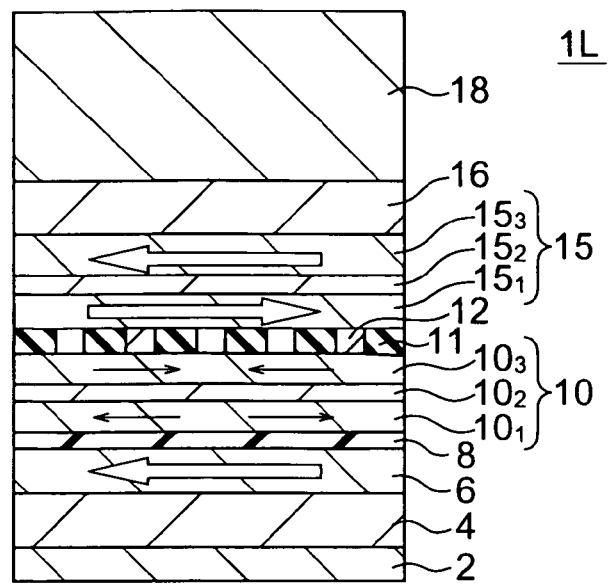
FIG. 18 is a sectional view showing a magnetoresistive effort element according to a fourth embodiment of the present invention.

A magnetoresistive effect element 1J according to a fourth embodiment is shown in FIG. 18. The magnetoresistive effect element 1L according to this embodiment has a configuration obtained by completely dividing the non-magnetic metal layer 12 by means of the dielectric 11 in the magnetoresistive effect element 1B according to the second embodiment shown in FIG. 5. In other words, the dielectric 11 passes through the non-magnetic metal layer 12. In the present embodiment, the interface between the non-magnetic metal layer 12 and the magnetic recording layer 10 and the interface between the dielectric 11 and the magnetic recording layer 10 are substantially coplanar. The interface between the non-magnetic metal layer 12 and the second magnetization pinned layer 15 and the interface between the dielectric 11 and the second magnetization pinned layer 15 are substantially coplanar.

The non-magnetic metal layer 12 according to the present embodiment may form a pattern in which the non-magnetic metal layer 12 is divided by the dielectric 11 and arranged regularly in the dielectric 11 as shown in FIG. 10, or may form a pattern in which the non-magnetic metal layer 12 is arranged in the dielectric 11 at random. Or a pattern in which the dielectric 11 is arranged regularly in the non-magnetic metal layer 12 may be formed as shown in FIG. 11, or a pattern in which the dielectric 11 is arranged in the non-magnetic metal layer 12 at random may be formed.

In the magnetoresistive effect element 1L according to the present embodiment, the direction of the magnetic layer 15, in the second magnetization pinned layer 15 is substantially antiparallel to the direction of the first magnetization pinned layer 6 in the same way as the magnetoresistive effect element 1B according to the second embodiment.

In the magnetic recording layer 10 according to the present embodiment including the laminated film of the magnetic layer $10_1$/the non-magnetic layer $10_2$/the magnetic layer $10_3$ having the synthetic antiferromagnetic coupling, the interlayer coupling energy $J_{EX}$ is greater than 0.5 erg/cm$^2$, in the same way as the first embodiment. Therefore, the magnetoresistive effect element 1L according to the present embodiment has thermal agitation resistance. In addition, when it is used in memory cells, interaction between adjacent memory cells is slight and false operation occurs scarcely.

In the present embodiment, Ru, Rh or an alloy of them is used as the non-magnetic metal layer 12 in the same way as the second embodiment. In this case, it becomes possible to write data "1" and "0" by conducting spin injection. The write current can be reduced as compared with the case where spin injection writing is conducted to the ordinary tunnel junction element. As the non-magnetic layer $10_2$ in the magnetic recording layer 10 including the magnetic layer $10_1$/the non-magnetic layer $10_2$/the magnetic layer $10_3$, Ru, Rh or an alloy of them which is small in reflection effect of the magnetic layers $10_1$ and $10_3$ and which is small in interlayer interaction is used. However, it is more desirable to use Rh.

In the present embodiment, the non-magnetic metal layer 12 is divided by the dielectric 11. Therefore, a current flows through divided portions of the non-magnetic metal layer 12 in a concentrative manner. In the present embodiment, therefore, spin inversion is excited using current concentrating portions as nuclei and consequently inversion can be converted with a further low current density as compared with the case where the non-magnetic metal layer 12 is not divided by the dielectric as in the second embodiment.

By the way, in the fourth embodiment, the non-magnetic metal layer 12 may be replaced by a tunnel barrier layer.

In the present embodiment, Ru, Rh or an alloy of them is used as the non-magnetic metal layer 12. As compared with the first embodiment using Cu, Ag, Au or an alloy of them, therefore, the direction of the spin moment of the reflected conduction electrons becomes opposite. Therefore, it is necessary to cause spin moment directions of the most adjacent magnetic layers in the first and second magnetization pinned layers having the magnetic recording layer 10 between to be different by substantially 180 degrees. If this arrangement is used, then torque is applied to the magnetic recording layer doubly in the same way as the first embodiment and consequently the write current can be reduced. When conducting writing, therefore, it becomes possible to prevent the tunnel barrier layer from being broken down in insulation and a highly reliable magnetoresistive effect element can be obtained.

Figure 19:
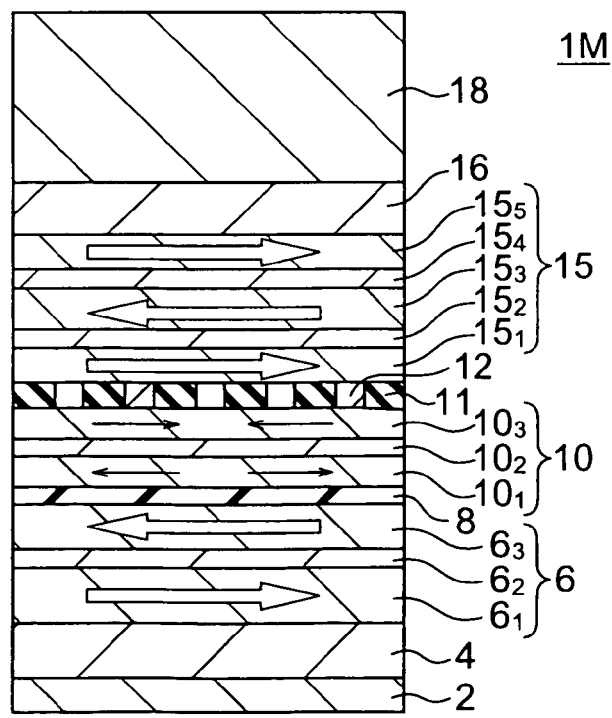
FIG. 19 is a sectional view showing a magnetoresistive effort element according to a first modification of the fourth embodiment.

In the present embodiment, the magnetic layer included in the first magnetization pinned layer 6 and located nearest the magnetic recording layer 10 is substantially antiparallel in spin moment direction to the magnetic layer included in the second magnetization pinned layer and located nearest the magnetic recording layer 10. In order to eliminate the leakage field from the first magnetization pinned layer 6, however, the first magnetization pinned layer 6 may be a three-layer laminated film including a magnetic layer $6_1$/a non-magnetic layer $6_2$/a magnetic layer $6_3$ as in the magnetoresistive effect element 1M according to the first modification shown in FIG. 19. It is desirable to use this structure, because the magnetization pinning in the first magnetization pinned layer becomes firmer and the magnetization pinned layer becomes more stable when spin injection writing is conducted. Furthermore, if such a magnetoresistive effect element is used in a memory, interaction between adjacent memory cells is also reduced. By the way, in the present modification, the second magnetization pinned layer 15 is replaced by a five-layer laminated structure including a magnetic layer $15_1$/a non-magnetic layer $15_2$/a magnetic layer $15_3$/a non-magnetic layer $15_4$/a magnetic layer $15_5$. It is desirable in the second magnetization pinned layer 15 as well in the same way to use this structure, because the magnetization pinning becomes firmer and the magnetization pinned layer becomes more stable when spin injection writing is conducted. Furthermore, if such a magnetoresistive effect element is used in a memory, interaction between adjacent memory cells is also reduced.

Thus, the leakage field can be suppressed to the minimum by adjusting the magnitude of magnetization moments of the first magnetization pinned layer 6 including the magnetic layer $6_1$/the non-magnetic layer $6_2$/the magnetic layer $6_3$ and the second magnetization pinned layer 15 including the magnetic layer $15_1$/the non-magnetic layer $15_2$/the magnetic layer $15_3$/the non-magnetic layer $15_4$/the magnetic layer $15_5$ by means of the film thicknesses and materials. By the way, in the present modification, an interface between the non-magnetic metal layer 12 and the magnetic recording layer 10 and an interface between the dielectric 11 and the magnetic recording layer 10 are substantially coplanar, and an interface between the non-magnetic metal layer 12 and the second magnetization pinned layer 15 and an interface between the dielectric 11 and the second magnetization pinned layer 15 are substantially coplanar, in the same way as the fourth embodiment.

Figure 20:
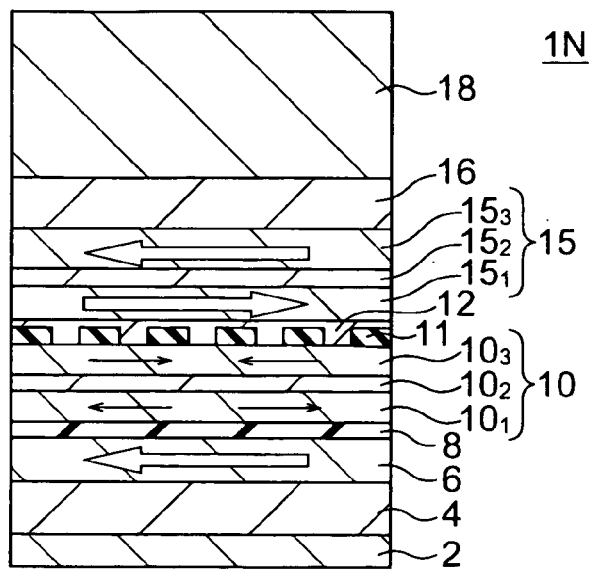
FIG. 20 is a sectional view showing a magnetoresistive effort element according to a second modification of the fourth embodiment.

A magnetoresistive effect element 1N according to a second modification shown in FIG. 20 may also be used. The magnetoresistive effect element 1N according to the second modification has a configuration obtained by dividing only a portion of the non-magnetic metal layer 12 located on the magnetic recording layer 10 side by means of a dielectric 11 in the fourth embodiment shown in FIG. 18. In other words, the interface between the non-magnetic metal layer 12 and the magnetic recording layer 10 and the interface between the dielectric 11 and the magnetic recording layer 10 are substantially coplanar. However, an opposite surface of the dielectric 11 from the interface between the dielectric 11 and the magnetic recording layer 10 is present within the non-magnetic metal layer 12 and located nearer the interface between the non-magnetic metal layer 12 and the magnetic recording layer 10 than the interface between the non-magnetic metal layer 12 and the second magnetization pinned layer 15. Therefore, the dielectric 11 does not pass through the non-magnetic metal layer 12. The configuration in which only the portion of the non-magnetic metal layer 12 located on the magnetic recording layer 10 side is divided by the dielectric 11 can be applied to the first modification shown in FIG. 19 as well.

Figure 21:
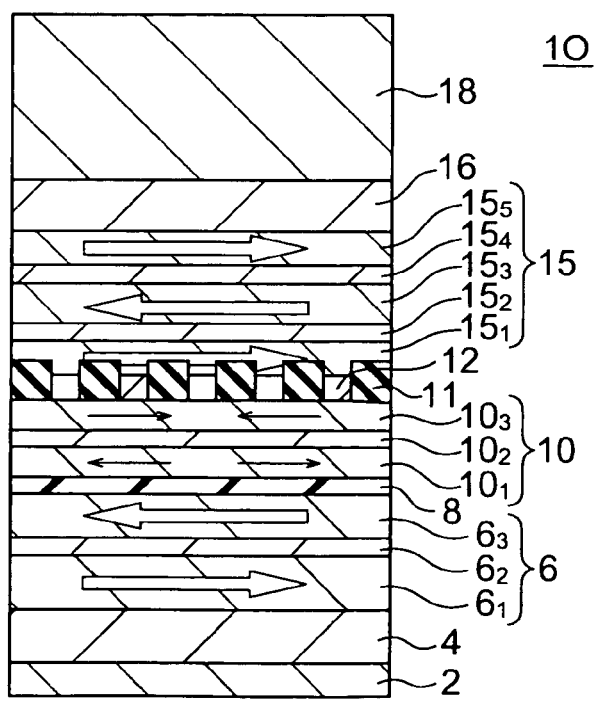
FIG. 21 is a sectional view showing a magnetoresistive effort element according to a third modification of the fourth embodiment.

A magnetoresistive effect element 1O according to a third modification shown in FIG. 21 may also be used. The magnetoresistive effect element 1O according to the third modification has a configuration in which the dielectric 11 completely divides the non-magnetic metal layer 12 and divides a part of the second magnetization pinned layer 15 (a part of the magnetic layer $15_1$) in the first modification shown in FIG. 19. In other words, the interface between the non-magnetic metal layer 12 and the magnetic recording layer 10 and the interface between the dielectric 11 and the magnetic recording layer 10 are substantially coplanar. However, an opposite surface of the dielectric 11 from the interface between the dielectric 11 and the magnetic recording layer 10 is present within the magnetic layer $15_1$ in the second magnetization pinned layer 15 and located farther from the interface between the non-magnetic metal layer 12 and the magnetic recording layer 10 than the interface between the non-magnetic metal layer 12 and the second magnetization pinned layer 15. The configuration in which the dielectric 11 completely divides the non-magnetic metal layer 12 and divides a part of the second magnetization pinned layer 15 can be applied to the example shown in FIG. 18 as well.

Figure 22:
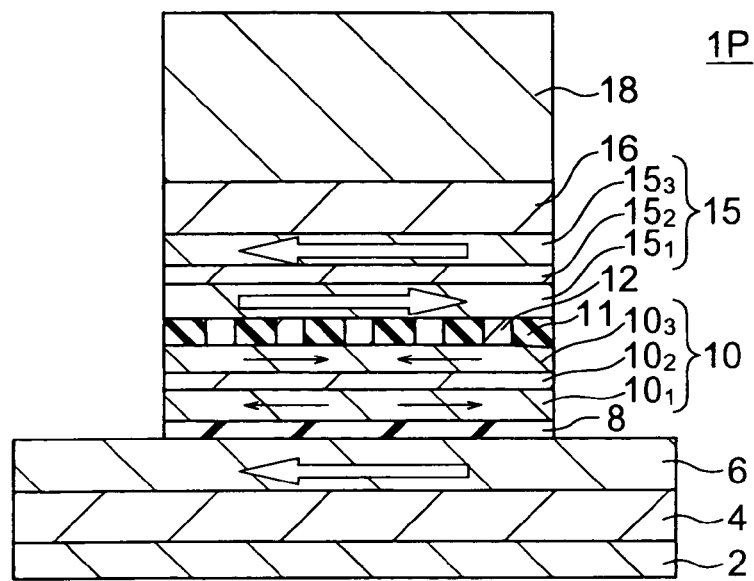
FIG. 22 is a sectional view showing a magnetoresistive effort element according to a fourth modification of the fourth embodiment.
Figure 23:
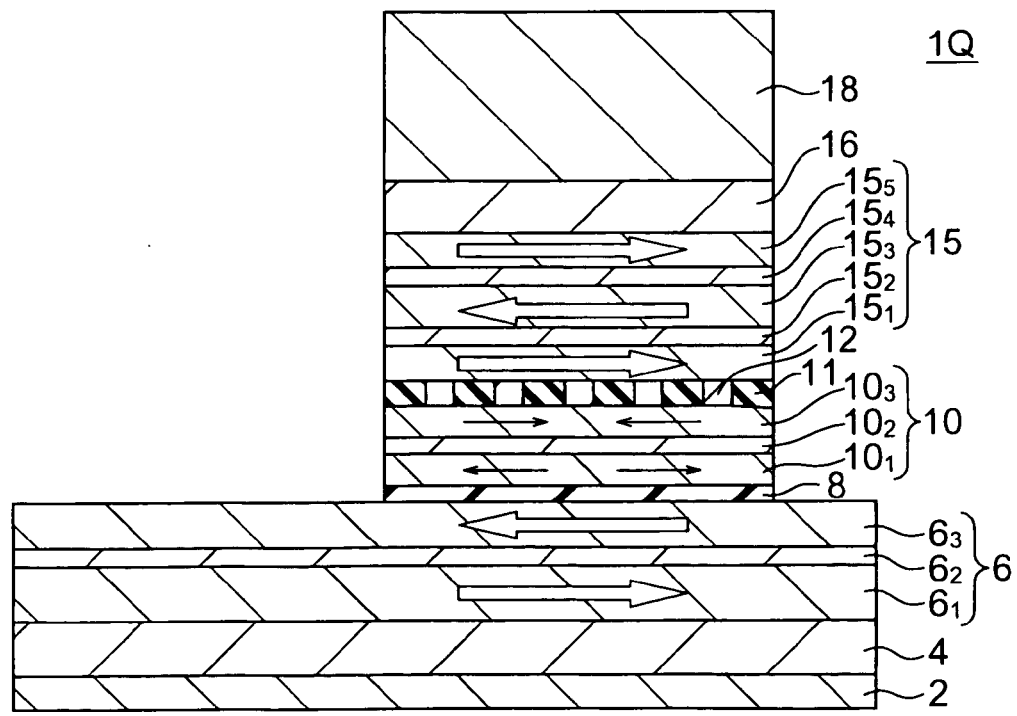
FIG. 23 is a sectional view showing a magnetoresistive effort element according to a fifth modification of the fourth embodiment.

Magnetoresistive effect elements 1P and 1Q respectively according to a fourth modification and a fifth modification respectively shown in FIGS. 22 and 23 may also be used. A magnetoresistive effect element 1P according to the fourth modification has a configuration obtained by making the area of the surface of the first magnetization pinned layer 6 larger than the area of the surface of the tunnel barrier layer 8 in the magnetoresistive effect element 1L according to the fourth embodiment shown in FIG. 18. A magnetoresistive effect element 1Q according to the fifth modification has a configuration obtained by making the area of the surface of the first magnetization pinned layer 6 larger than the area of the surface of the tunnel barrier layer 8 in the magnetoresistive effect element 1M according to the first modification shown in FIG. 19. If the area of the surface of the first magnetization pinned layer 6 is thus made large and the place where the leakage field occurs is kept away from the magnetic recording layer 10, then it suffices to adjust only the magnitude of the magnetization moment of the second magnetization pinned layer 15 by using the film thickness, material or the like. It is more desirable because manufacturing is facilitated.

Figure 24:
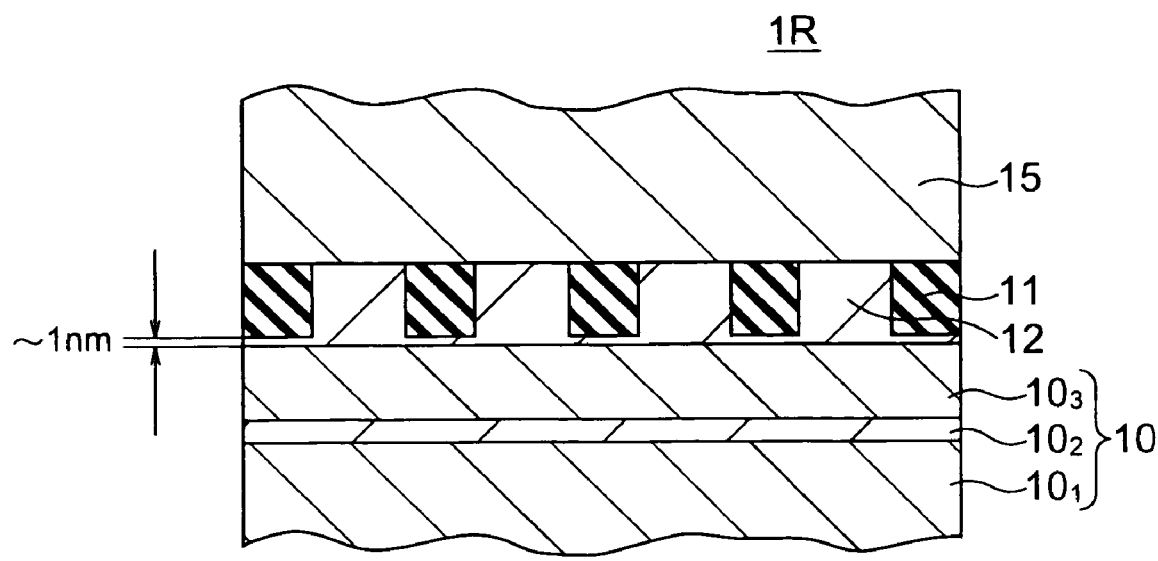
FIG. 24 is a sectional view showing a magnetoresistive effort element according to a sixth modification of the fourth embodiment.

A magnetoresistive effect element 1R according to a sixth modification shown in FIG. 24 may also be used. The magnetoresistive effect element 1R according to the sixth modification has a configuration in which the dielectric 11 does not completely divide the non-magnetic metal layer 12, but divides only a portion of the non-magnetic metal layer 12 located on the second magnetization pinned layer 15 side, in the fourth embodiment shown in FIG. 18. In other words, the magnetoresistive effect element 1R according to the sixth modification has a configuration in which the non-magnetic metal layer 12 having a thickness of, for example, approximately 1 nm is interposed between the dielectric 11 and the magnetic recording layer 10. By the way, the configuration having the non-magnetic metal layer 12 interposed between the dielectric 11 and the magnetic recording layer 10 as in the sixth modification may be applied to the magnetoresistive effect elements according to the first to fifth modifications shown in FIGS. 19 to 23.

Figure 25:
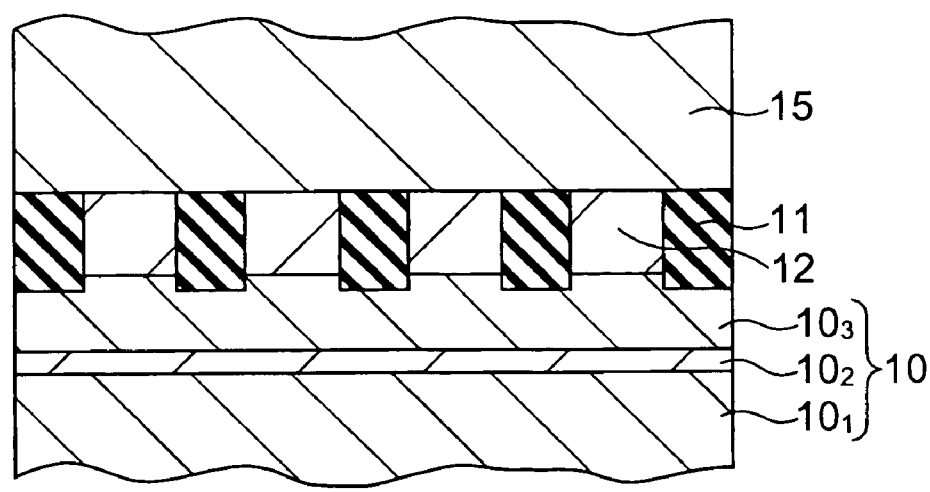
FIG. 25 is a sectional view showing a magnetoresistive effect element according to a seventh modification of a fourth embodiment.

In the fourth embodiment shown in FIG. 18, the interface between the non-magnetic metal layer 12 and the magnetic recording layer 10 and the interface between the dielectric 11 and the magnetic recording layer 10 are substantially coplanar. Alternatively, they may not be coplanar, but either of the interfaces may be located farther from the interface between the non-magnetic metal layer 12 and the second magnetization pinned layer 14 as shown in FIG. 25 (seventh modification). In FIG. 25, the interface between the dielectric 11 and the magnetic recording layer 10 is located farther from the interface between the non-magnetic metal layer 12 and the second magnetization pinned layer 15 than the interface between the non-magnetic metal layer 12 and the magnetic recording layer 10. The configuration in which either of the interfaces is located farther from the interface between the non-magnetic metal layer 12 and the second magnetization pinned layer 15 as in the present modification may be applied to the magnetoresistive effect elements according to the first to fifth modifications shown in FIGS. 19 to 23.

In the configuration in which the non-magnetic metal layer 12 is divided partially or completely by the dielectric 11 as in the third embodiment, the fourth embodiment and their modifications, two torques, i.e., the spin torque applied via the tunnel barrier layer 8 and the spin reflection torque reflected via the non-magnetic metal layer 12 are exerted. If the non-magnetic metal layer 12 is not divided by the dielectric and the resistance difference between the tunnel barrier layer 8 and the non-magnetic metal layer 12 is too large, the effect of the spin reflection is weakened and the current density is not reduced so much. By making the resistance in the tunnel barrier layer approximately equal to the resistance in the current concentration type non-magnetic layer in the configuration in which the non-magnetic metal layer 12 is partially or completely divided by the dielectric 11, the effect of the spin reflection becomes more remarkable and the current density for spin inversion is reduced.

It is desirable to conduct design so as to make the magnetic moment magnitudes of the magnetic layer 10, and the magnetic layer $10_3$ substantially equal to each other in the magnetic recording layer including the magnetic layer $10_1$/the non-magnetic layer $10_2$/the magnetic layer $10_3$, when conducting the spin inversion using magnetization inversion caused by pure spin injection. If the same material is used, therefore, it is desirable to conduct the design so as to make the film thickness nearly constant. If the film thickness is made nearly constant, the spin torque is exerted uniformly.

On the other hand, if the spin torque is assisted using a magnetic field, it is necessary to conduct design so as to make the film thicknesses differ in the range of 2 nm or less.

Furthermore, it is necessary to design so as to make the volume of the whole magnetic material in the magnetic recording layer 10 including the magnetic layer $10_1$/the non-magnetic layer $10_2$/the magnetic layer $10_3$ smaller than the volume of the whole magnetic material in each of the first and second magnetization pinned layers. If design is conducted so as to make the volume of the whole magnetic material in the magnetic recording layer 10 including the magnetic layer $10_1$/the non-magnetic layer $10_2$/the magnetic layer $10_3$ larger than the volume of the whole magnetic material in each of the first and second magnetization pinned layers, then magnetization in the first and second magnetization pinned layers becomes unstable due to the spin torque and false operation occurs.

In the first to fourth embodiments and their modifications, the magnetic layer in the magnetoresistive effect element is a thin film of at least one kind or a multilayer film formed using a material selected from a group including a Co—Fe alloy, a Co—Fe—Ni alloy, a (Co, Fe, Ni)—(Si, B) alloy, a (Co, Fe, Ni)—(B) amorphous alloy, and an amorphous material such as a Co—(Zr, Hf, Nb, Ta, Ti) film, and a Heusler material such as a Co—Cr—Fe—Al Heusler material. The magnetic layer may be provided with a Ni—Fe alloy such as a Permalloy alloy.

It is desirable that the magnetic layer has unidirectional anisotropy as the magnetization pinned layer and has uniaxial anisotropy as the magnetic recording layer. Its thickness is desired to be in the range of 0.1 nm to 100 nm. In addition, the magnetic layer (ferromagnetic layer) included in the magnetization pinned layer and the magnetic recording layer needs to have a thickness capable of preventing the magnetic layer from having super-paramagnetism. It is more desirable that the thickness is 0.4 nm or more.

Furthermore, it is desirable to add an antiferromagnetic film to the ferromagnetic layer used as the magnetization pinned layer to pin the magnetization. As such an antiferromagnetic film, magnetic materials such as a Fe (iron)—Mn (manganese) alloy, a Pt (platinum)—Mn (manganese) alloy, a Pt (platinum)—Cr (chromium)—Mn (manganese) alloy, a Ni (nickel)—Mn (manganese) alloy, an Ir (iridium)—Mn (manganese) alloy, NiO (nickel oxide), and CoO (cobalt oxide) can be mentioned.

It is possible to adjust magnetic characteristics and adjust various physical properties such as the crystal property, mechanical characteristics, and chemical characteristics by adding non-magnetic elements such as Ag (silver), Cu (copper), Au (gold), Al (aluminum), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), and Nb (niobium) to these magnetic materials.

Specifically, as a method for pinning the magnetic layer in one direction, a laminated film having a three-layer structure including Co(Co—Fe)/Ru (ruthenium)/Co(Co—Fe), a laminated film having a three-layer structure including Co(Co—Fe)/Ir (iridium)/Co(Co—Fe), a laminated film having a three-layer structure including Co(Co—Fe)/Os (osmium)/Co(Co—Fe), a laminated film having a three-layer structure including Co(Co—Fe)/Re (rhenium)/Co(Co—Fe), a laminated film having a three-layer structure including a Co—Fe—B amorphous material layer/Ru (ruthenium)/a Co—Fe—B amorphous material layer, a laminated film having a three-layer structure including an amorphous material layer of Co—Fe—B or the like/Ir (iridium)/an amorphous material layer of Co—Fe—B or the like, a laminated film having a three-layer structure including an amorphous material layer of Co—Fe—B or the like/Os (osmium)/an amorphous material layer of Co—Fe—B or the like, or a laminated film having a three-layer structure including an amorphous material layer of Co—Fe—B or the like/Re (rhenium)/an amorphous material layer of Co—Fe—B or the like is used. When these laminated films are used as the magnetization pinned layer, it is desirable to provide an antiferromagnetic film adjacent to the magnetization pinned layer. As the antiferromagnetic film in this case as well, Fe—Mn, Pt—Mn, Pt—Cr—Mn, Ni—Mn, Ir—Mn, NiO, CoO or the like can be used in the same way as the foregoing description. If this structure is used, the magnetization in the magnetization pinned layer is more insusceptible to the influence of the current magnetic field from the bit line or word line and the magnetization is pinned firmly. Furthermore, a stray field from the magnetization pinned layer can be weakened (or adjusted). And the magnetization shift of the magnetic recording layer can be adjusted by changing the thickness of the two ferromagnetic layers that form the magnetization pinned layer.

As the magnetic recording layer, a two-layer structure represented as a soft magnetic layer/ferromagnetic layer or a three-layer structure represented as a ferromagnetic layer/a soft magnetic layer/a ferromagnetic layer may also be used. A more favorable effect is obtained by controlling the intensity of interaction between ferromagnetic layers using a three-layer structure represented as a ferromagnetic layer/a non-magnetic layer/a ferromagnetic layer or a five-layer structure represented as a ferromagnetic layer/a non-magnetic layer/a ferromagnetic layer/a non-magnetic layer/a ferromagnetic layer. That is, it is not necessary to increase the power consumption of the current magnetic field even if the cell width of the magnetic recording layer which is the memory cell is sub-micron or less. At this time, it doesn't matter if the kind and film thickness of the ferromagnetic layer are changed.

In particular, if Co—Fe, Co—Fe—Ni, or Fe rich Ni—Fe having a large MR is used in the ferromagnetic layer located near the insulation barrier (tunnel barrier layer) and Ni rich Ni—Fe, Ni rich Ni—Fe—Co or the like is used in the ferromagnetic material that is not in contact with the insulation film, then the switching magnetic field can be weakened while keeping the MR at a large value. It is more favorable.

In the magnetic recording layer as well, It is possible to adjust magnetic characteristics and adjust various physical properties such as the crystal property, mechanical characteristics, and chemical characteristics by adding non-magnetic elements such as Ag (silver), Cu (copper), Au (gold), Al (aluminum), Ru (ruthenium), Os (osmium), Re (rhenium), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), and Nb (niobium) to these magnetic materials.

On the other hand, when a TMR element is used as the magnetoresistive effect element, it is possible to use various insulators (dielectrics) such as $Al_2O_3$ (aluminum oxide), $SiO_2$ (silicon oxide), MgO (magnesium oxide), AlN (aluminum nitride), $Bi_2O_3$ (bismuth oxide), $MgF_2$ (magnesium fluoride), $CaF_2$ (calcium fluoride), $SrTiO_2$ (titanium oxide strontium), $AlLaO_3$ (lanthanum oxide aluminum) and Al—N—O (aluminum oxide nitride), as the tunnel barrier layer (or dielectric layer) provided between the magnetization pinned layer and the magnetic recording layer.

It is not necessary that these compounds have a completely accurate composition from the view of stoichiometry. Loss, excess, or insufficiency of oxygen, nitrogen, fluorine or the like may exist. It is desirable that the thickness of the insulation layer (dielectric layer) is thin to the extent that the tunnel current flows. As a matter of fact, it is desirable that the thickness is 10 nm or less.

Such a magnetoresistive effect element can be formed on a predetermined substrate by using ordinary thin film forming means such as various sputter methods, the evaporation method, or the molecular beam epitaxy method. As the substrate in this case, various substrates such as Si (silicon), $SiO_2$ (silicon oxide), $Al_2O_3$ (aluminum oxide), spinel and AlN (aluminum nitride) substrates can be used.

Furthermore, a layer formed of Ta (tantalum), Ti (titanium), Pt (platinum), Pd (palladium), Au (gold), Ti (titanium)/Pt (platinum), Ta (tantalum)/Pt (platinum), Ti (titanium)/Pd (palladium), Ta (tantalum)/Pd (palladium), Cu (copper), Al (aluminum)—Cu (copper), Ru (ruthenium), Ir (iridium), or Os (osmium) may be provided on the substrate as the underlying layer, protection layer or hard mask.

FIFTH EMBODIMENT

Figure 26:
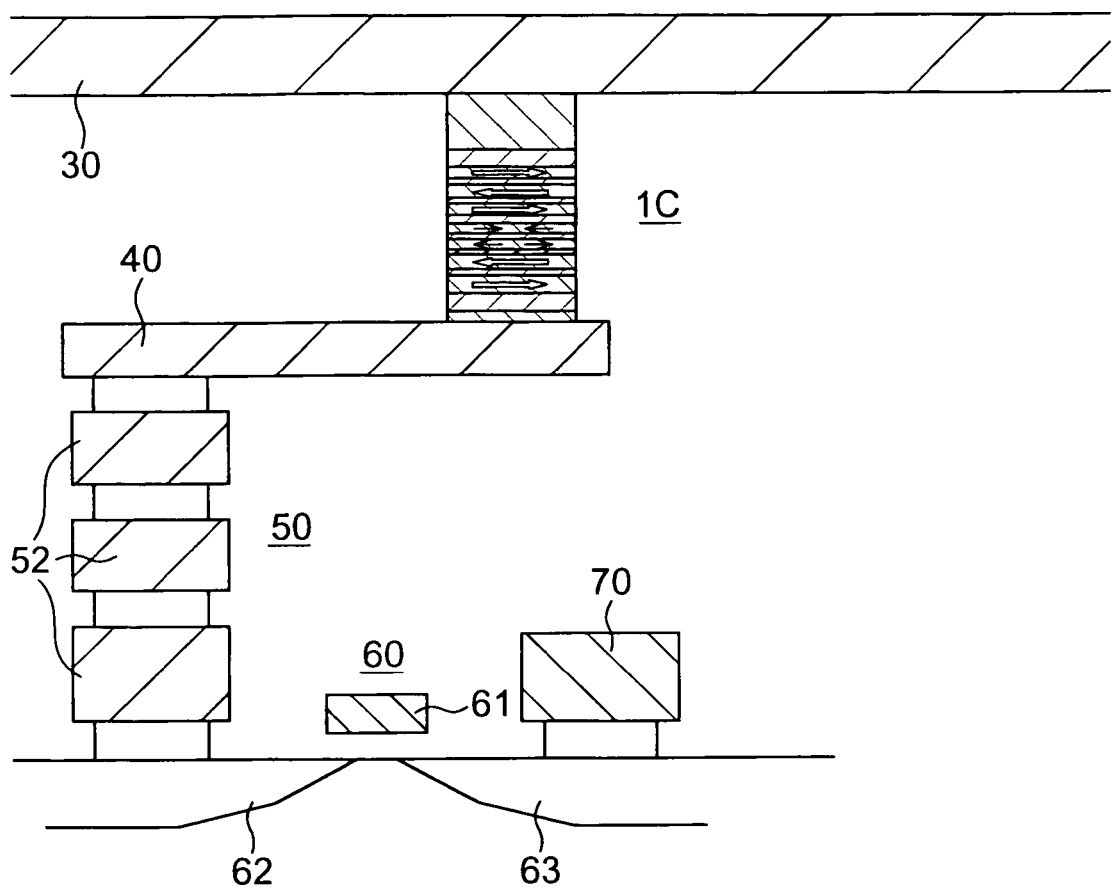
FIG. 26 is a sectional view showing a memory cell included in a magnetic memory according to a fifth embodiment of the present invention.

A magnetic memory according to a fifth embodiment of the present invention will now be described with reference to FIG. 26. FIG. 26 is a sectional view showing a memory cell of a magnetic memory according to the present embodiment. The magnetic memory according to the present embodiment includes a plurality of memory cells arranged in an array. Each memory cell includes a magnetoresistive effect element 1C according to a first modification of the second embodiment shown in FIG. 6, a word line 30, a bit line 40, a connection portion 50, and a selection transistor 60. A metal hard mask 18 in the magnetoresistive effect element 1C is connected to the word line 30, and the underlying layer 2 is connected to the bit line 40. The connection portion 50 includes connection plugs 52. The selection transistor 60 includes a gate 61, a drain 62 and a source 63. One end of the connection portion 50 is connected to the bit line 40, and the other end of the connection portion 50 is connected to the drain 62 of the selection transistor 60. The source 63 of the selection transistor 60 is connected to an electrode 70.

Figure 27:
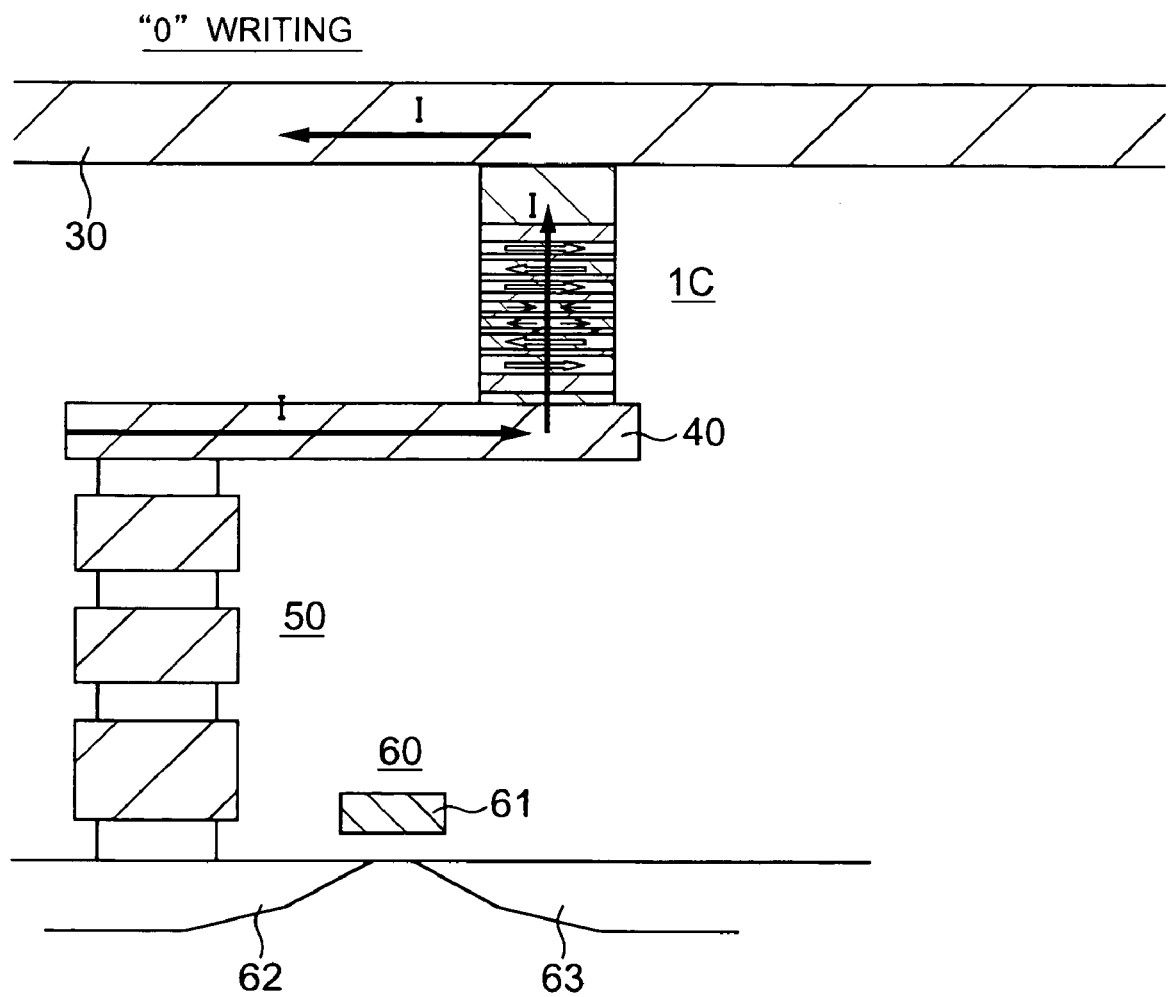
FIG. 27 is a sectional view of a memory cell showing a direction of a current when data "0" is written in a fifth embodiment.
Figure 28A:
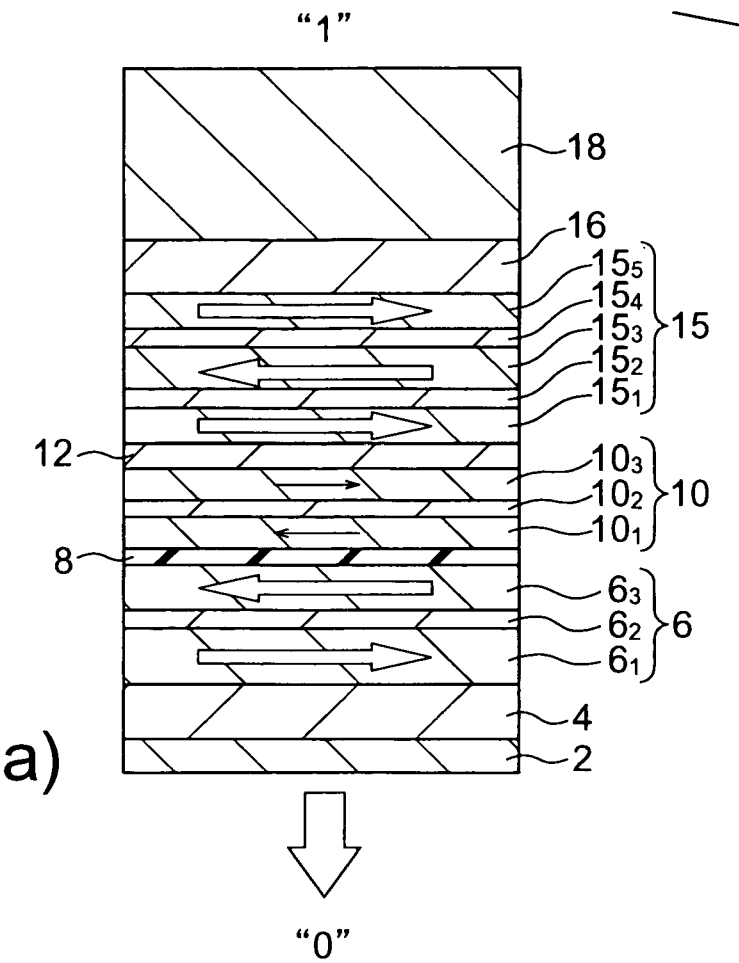
FIGS. 28(a) and 28(b) are diagrams showing a spin direction in a magnetoresistive effect element obtained when data is rewritten to change data "1" to data "0" in a fifth embodiment.
Figure 28B:
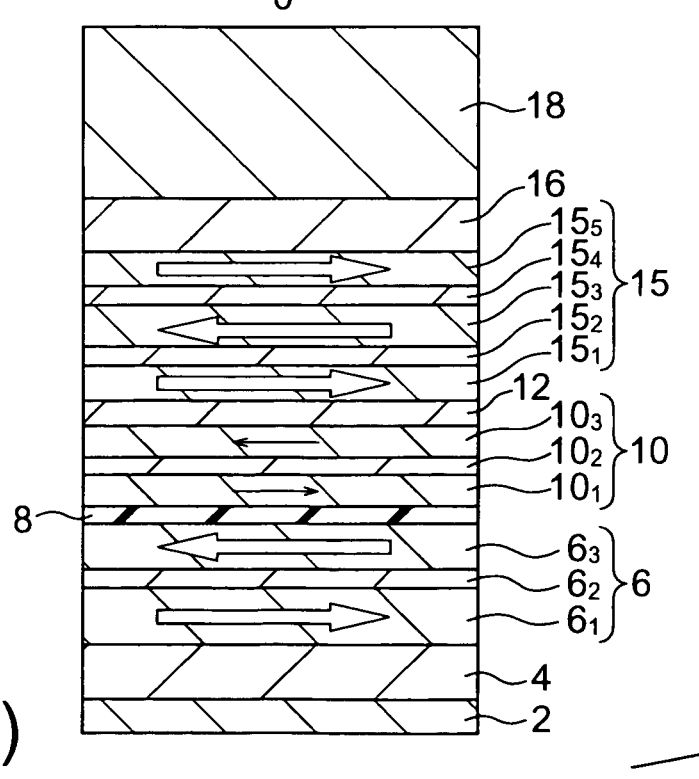

Operation of the magnetic memory according to the present embodiment will now be described with reference to FIGS. 27 to 30(b). First, the case where data "0" is written will be described. FIG. 27 is the sectional view of the memory cell which indicates a direction of a current at the time when "0" is written in the magnetic memory according to the present embodiment. FIGS. 28(a) and 28(b) are sectional views showing spin directions in the magnetoresistive effect element 1C at the time when data "0" is rewritten to data "1." In the present embodiment, data "1" recorded in the magnetoresistive effect element 1C means that the spin direction in the magnetic layer $10_1$ located in the magnetic recording layer 10 near the tunnel barrier layer 8 is parallel to the spin direction in the magnetic layer $6_3$ in the first magnetization pinned layer 6 as shown in FIG. 28(a). Data "0" recorded in the magnetoresistive effect element 1C means that the spin direction in the magnetic layer $10_1$ located in the magnetic recording layer 10 near the tunnel barrier layer 8 is antiparallel to the spin direction in the magnetic layer $6_3$ in the first magnetization pinned layer 6 as shown in FIG. 28(b). Definitions of the data "1" and "0" may be reversed. For the convenience of the description, such definition is conducted.

When writing data "0" into the magnetoresistive effect element 1C having data "1" recorded therein, a predetermined voltage is applied to the gate 61 of the selection transistor 60 to turn on the selection transistor 60 and let flow a current through the electrode 70, the source 63, the drain 62, the connection portion 50, the bit line 40, the magnetoresistive effect element 1C, and the word line 30 in the cited order as shown in FIG. 27. In this case, since the current direction is opposite to the electron flow direction, electrons flow from the second magnetization pinned layer 15 toward the magnetic recording layer 10. Therefore, electrons spin-polarized in the second magnetization pinned layer 15 flow into the magnetic recording layer 10 through the non-magnetic metal layer 12 and exert spin torque. At this time, spin-polarized electrons attempt to tunnel the tunnel barrier layer 8 and flow into the magnetic layer $6_3$ in the first magnetization pinned layer 6. When tunneling the tunnel barrier layer 8, however, electrons having a spin parallel to the spin of the magnetic layer $6_3$ have a high tunnel probability and tunnel easily. However, electrons having a spin antiparallel to the spin of the magnetic layer $6_3$ are reflected. The electrons reflected to the magnetic recording layer 10 exert spin torque on the magnetic recording layer 10. Spins of the magnetic layers $10_1$ and $10_3$ in the magnetic recording layer 10 are inverted by these two spin torques.

Figure 29:
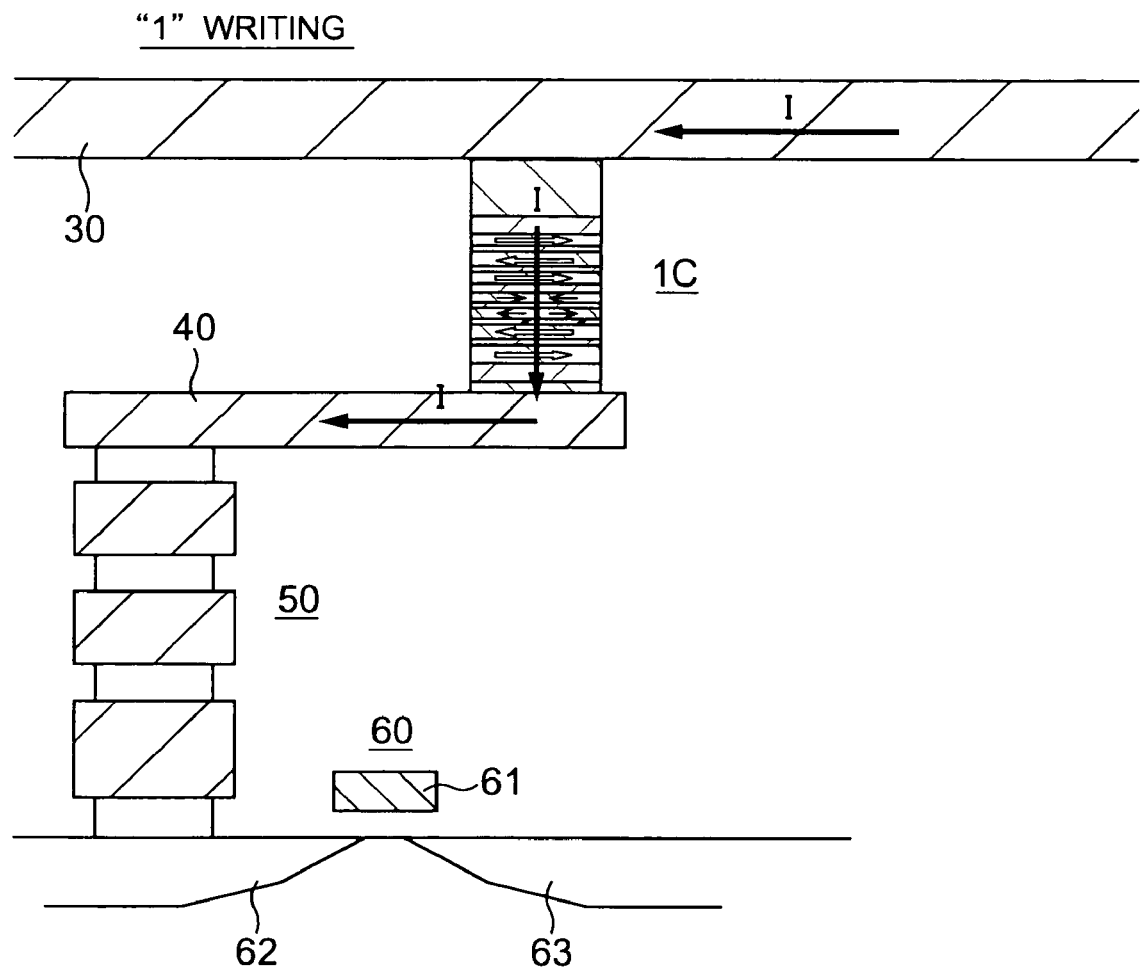
FIG. 29 is a sectional view of a memory cell showing a direction of a current when data "1" is written in a fifth embodiment.
Figures 30A, 30B:
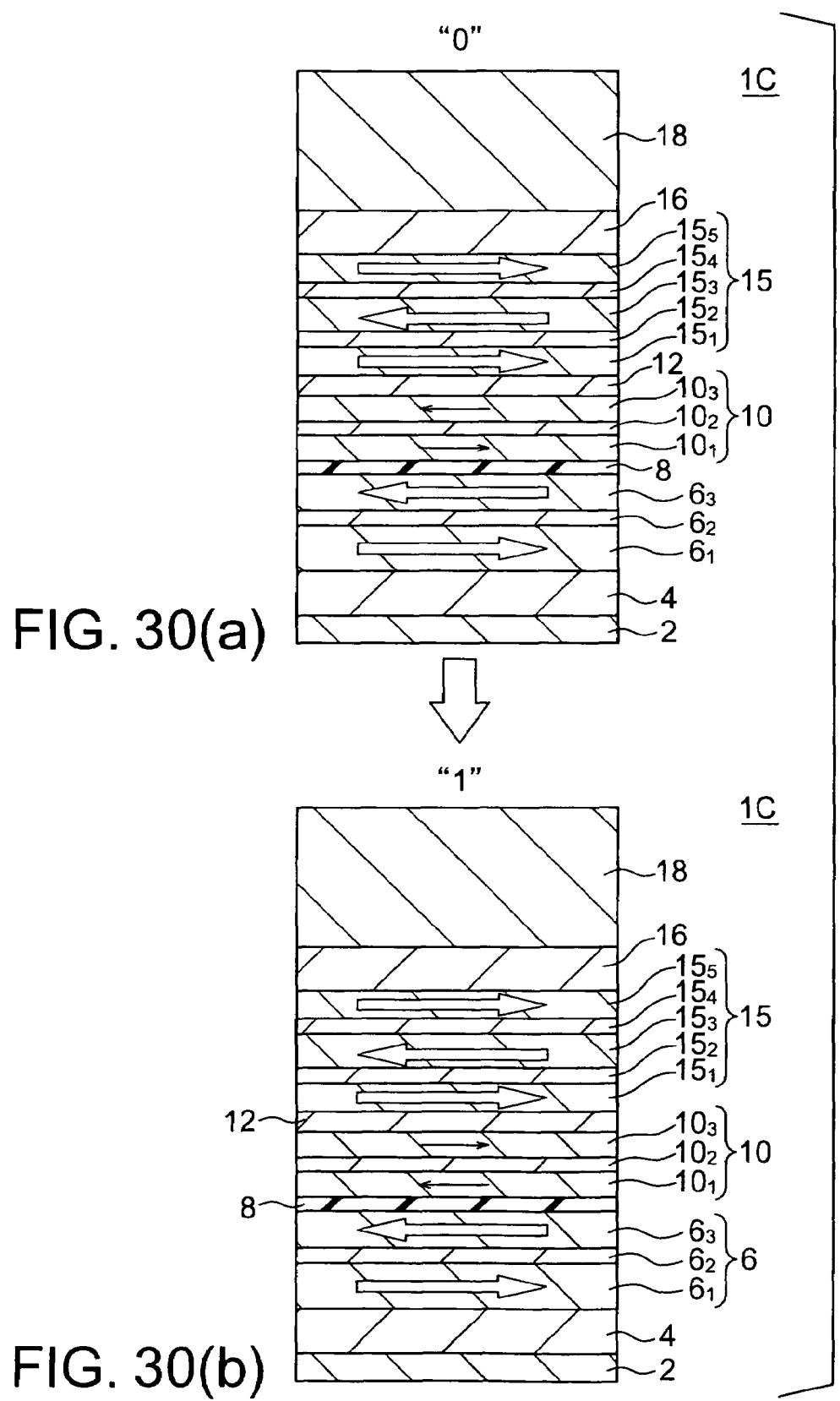
FIGS. 30(a) and 30(b) are diagrams showing a spin direction in a magnetoresistive effect element obtained when data is rewritten to change data "0" to data "1" in a fifth embodiment.

The case where data "1" is written will now be described. FIG. 29 is a sectional view of a memory cell showing a current direction at the time when data "1" is written in the magnetic memory according to the present embodiment.

When writing data "1" into the magnetoresistive effect element 1C having data "0" recorded therein, a predetermined voltage is applied to the gate 61 of the selection transistor 60 to turn on the selection transistor 60 and let flow a current through the word line 30, the magnetoresistive effect element 1C, the bit line 40, the connection portion 50, the drain 62, the source 63 and the electrode 70 in the cited order as shown in FIG. 29. In this case, since the current direction is opposite to the electron flow direction, electrons flow from the first magnetization pinned layer 6 to the magnetic recording layer 10 through the tunnel barrier layer 8. Therefore, electrons spin-polarized in the magnetic layer in the first magnetization pinned layer 6 tunnel the tunnel barrier layer 8, and exert spin torque on the magnetic recording layer 10. At this time, spin-polarized electrons flow from the magnetic recording layer 10 to the second magnetization pinned layer 15 through the non-magnetic metal layer 12. While the spin of the magnetic recording layer 10 is antiparallel to the spin of the magnetic layer $15_1$, therefore, the first magnetization pinned layer is parallel in spin moment to the magnetic recording layer 10. Therefore, reflected spin electrons reflected by the second magnetization pinned layer 15 also exert spin torque on the magnetic recording layer 10, and the spin of the magnetic recording layer 10 is inverted (see FIGS. 30(a) and 30(b)).

According to the present embodiment, it is made possible to write "1" and "0" with low power consumption by conducting spin injection as heretofore described. In addition, the write current can be made small as compared with the case where spin injection writing is conducted on the ordinary tunnel junction element. Therefore, it becomes possible to prevent the tunnel barrier layer from being broken down in insulation when writing data. As a result, a highly reliable magnetic memory can be obtained.

It is a matter of course that in the present embodiment the write current is set to a greater value than the read current.

In the magnetoresistive effect element 1C according to the present embodiment, the underlying layer 2 is disposed on the bit line 40 side and the hard mask 18 is disposed on the word line 30 side. Alternatively, the hard mask 18 may be disposed on the bit line 40 side and the underlying layer 2 may be disposed on the word line 30 side.

SIXTH EMBODIMENT

Figure 31:
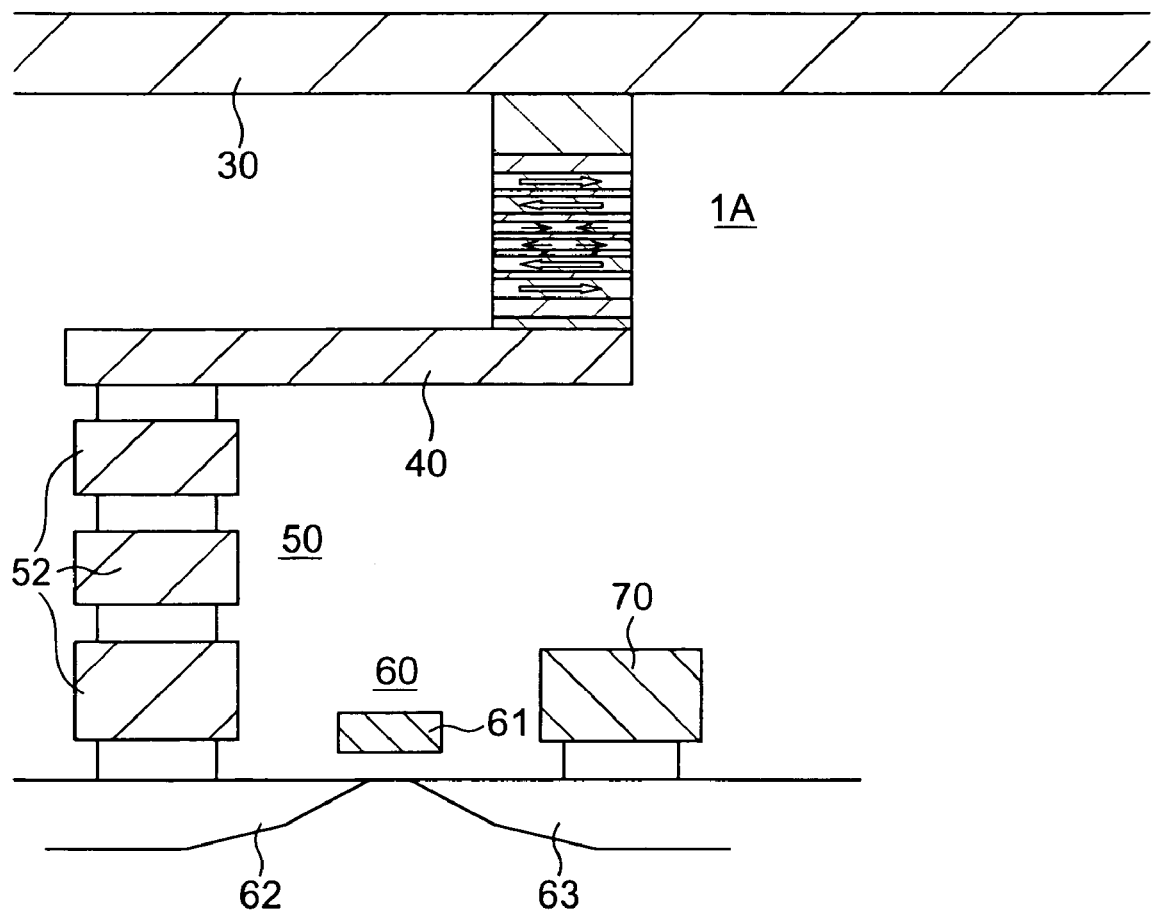
FIG. 31 is a sectional view showing a memory cell included in a magnetic memory according to a sixth embodiment of the present invention.

A magnetic memory according to a sixth embodiment of the present invention will now be described with reference to FIG. 31. FIG. 31 is a sectional view showing a memory cell of a magnetic memory according to the present embodiment. The magnetic memory according to the present embodiment includes a plurality of memory cells arranged in an array. Each memory cell includes a magnetoresistive effect element 1A according to a first modification of the first embodiment shown in FIG. 2, a word line 30, a bit line 40, a connection portion 50, and a selection transistor 60. A metal hard mask 18 in the magnetoresistive effect element 1A is connected to the word line 30, and the underlying layer 2 is connected to the bit line 40. The connection portion 50 includes connection plugs 52. The selection transistor 60 includes a gate 61, a drain 62 and a source 63. One end of the connection portion 50 is connected to the bit line 40, and the other end of the connection portion 50 is connected to the drain 62 of the selection transistor 60. The source 63 of the selection transistor 60 is connected to an electrode 70.

Figure 32:
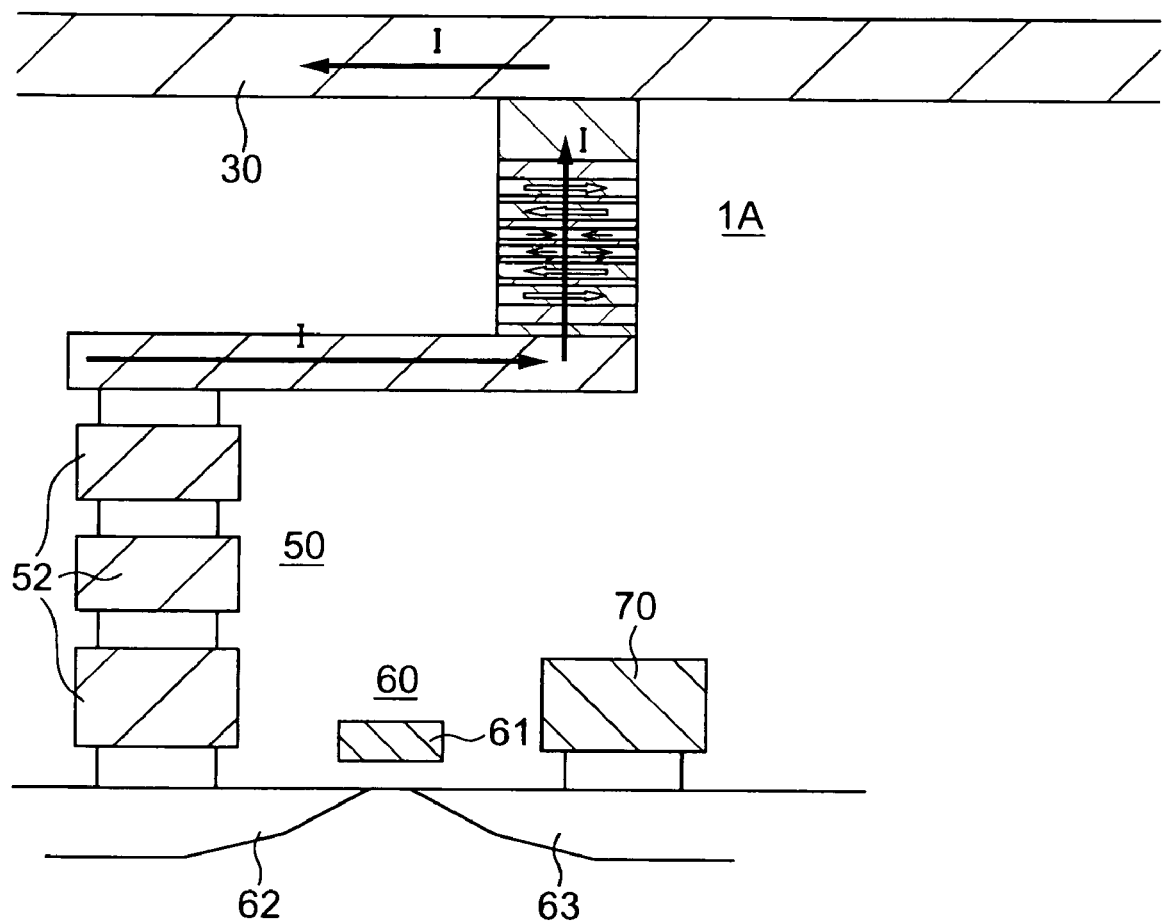
FIG. 32 is a sectional view of a memory cell showing a direction of a current when data "0" is written in a sixth embodiment.
Figures 33A, 33B:
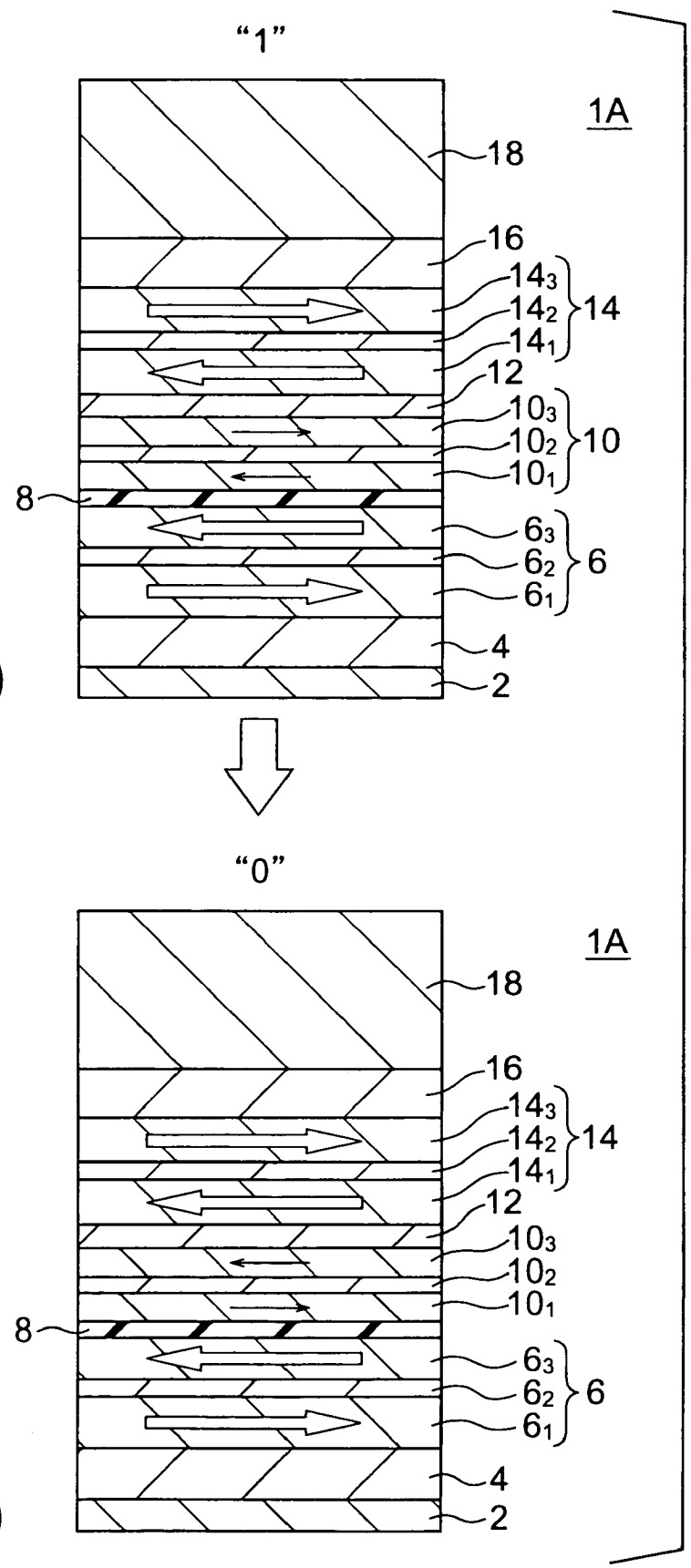
FIGS. 33(a) and 33(b) are diagrams showing a spin direction in a magnetoresistive effect element obtained when data is rewritten to change data "1" to data "0" in a sixth embodiment.
Figure 34:
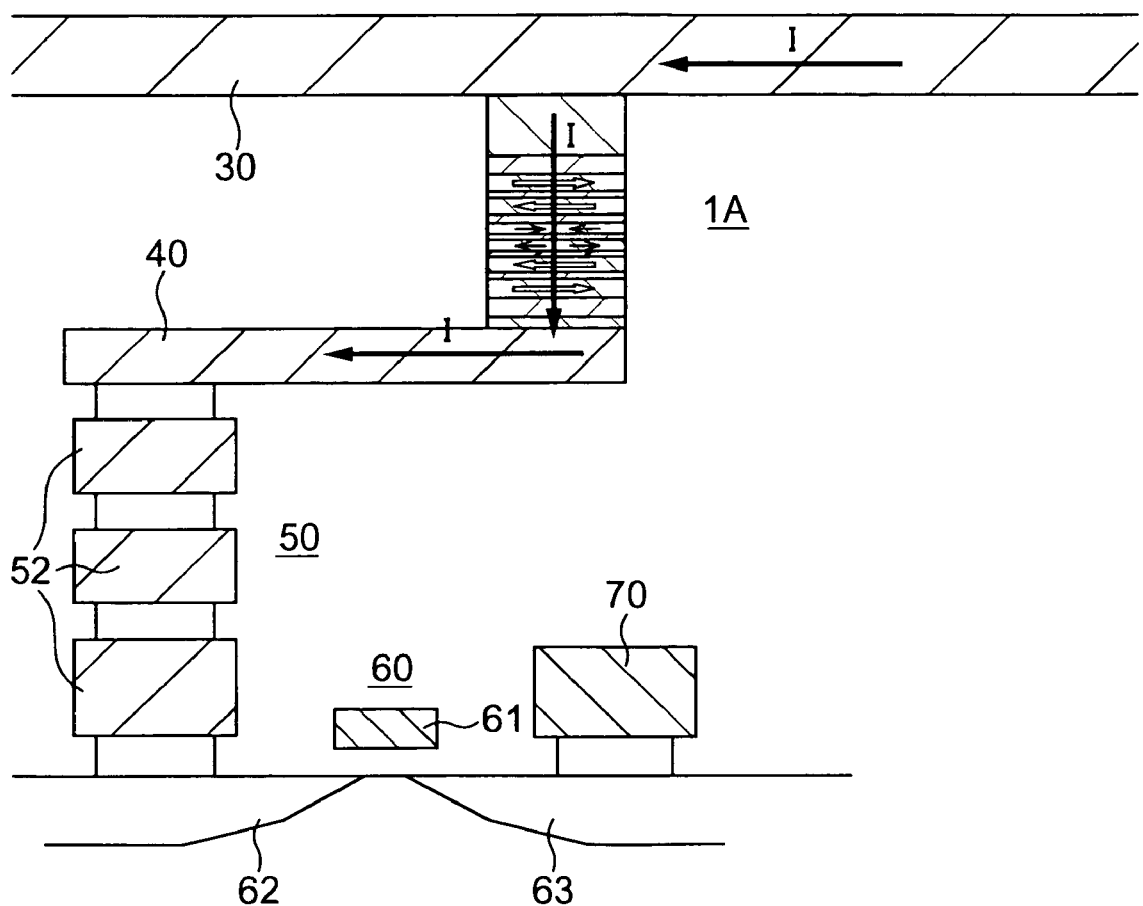
FIG. 34 is a sectional view of a memory cell showing a direction of a current when data "1" is written in a sixth embodiment.
Figures 35A, 35B:
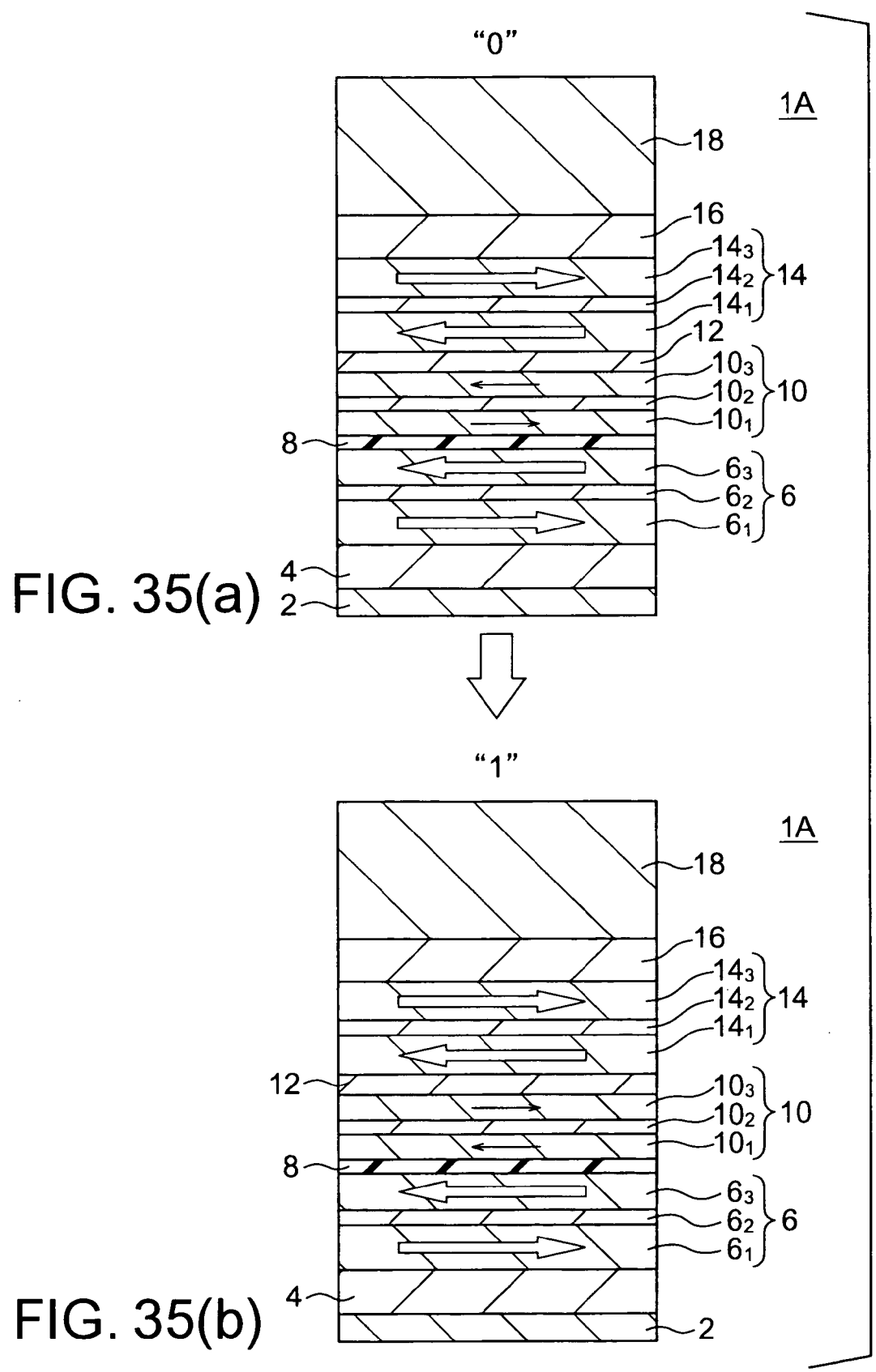
FIGS. 35(a) and 35(b) are diagrams showing a spin direction in a magnetoresistive effect element obtained when data is rewritten to change data "0" to data "1" in a sixth embodiment.

A sectional view of a memory cell showing a current direction at the time when writing data "0" in the magnetic memory according to the present embodiment is shown in FIG. 32. The section of the magnetoresistive effect element 1A before writing data "0" is shown in FIG. 33(a). The section of the magnetoresistive effect element 1A after writing data "0" is shown in FIG. 33(b). The sectional view of the memory cell showing a current direction at the time when writing data "1" in the magnetic memory according to the present embodiment is shown in FIG. 34. The section of the magnetoresistive effect element 1A before writing data "1" is shown in FIG. 35(a). The section of the magnetoresistive effect element 1A after writing data "1" is shown in FIG. 35(b).

The magnetoresistive effect element 1A in the magnetic memory according to the present embodiment is different in the direction of the spin moment of the first and second magnetization pinned layers from the magnetoresistive effect element 1C in the magnetic memory according to the fifth embodiment. In the flow direction of the write current at the time when writing data "0" and when writing data "1," however, the magnetoresistive effect element 1A in the magnetic memory according to the present embodiment is the same as the magnetoresistive effect element 1C in the magnetic memory according to the fifth embodiment.

SEVENTH EMBODIMENT

Figure 36:
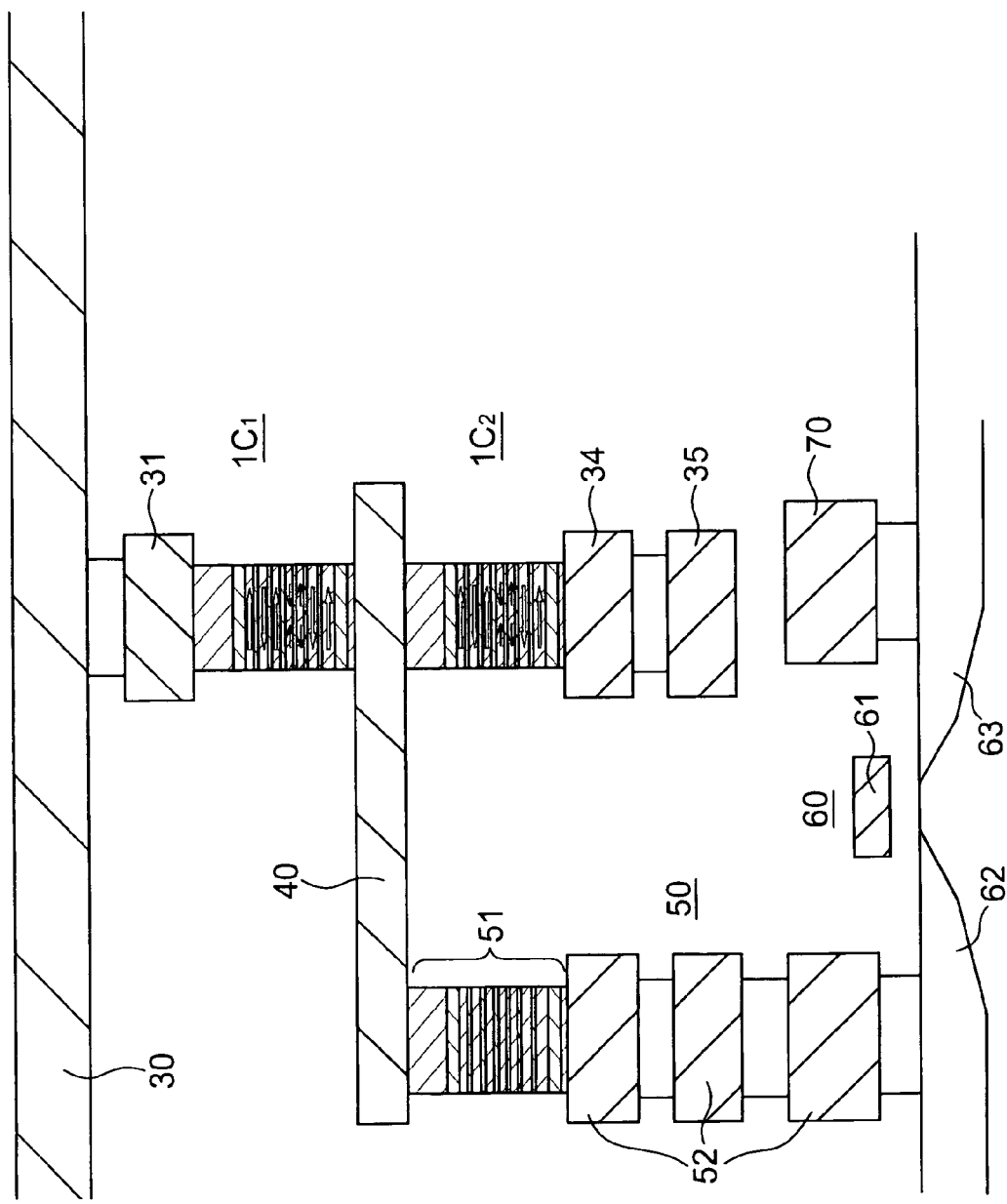
FIG. 36 is a sectional view showing a memory cell included in a magnetic memory according to a seventh embodiment of the present invention.

A magnetic memory according to a seventh embodiment of the present invention will now be described with reference to FIG. 36. FIG. 36 is a sectional view showing a memory cell of a magnetic memory according to the present embodiment. The magnetic memory according to the present embodiment includes a plurality of memory cells arranged in an array. Each memory cell includes magnetoresistive effect elements $1C_1$ and $1C_2$ having the same configuration as that of the magnetoresistive effect element shown in FIG. 6, a bit line 40, first and second word lines 30 and 35, a connection portion 50, and a selection transistor 60.

A metal hard mask 18 in the magnetoresistive effect element $1C_1$ is connected to the word line 30 via a connection plug 31, and the underlying layer 2 is connected to the bit line 40. The metal hard disk 18 in the magnetoresistive effect element $1C_2$ is connected to the bit line 40, and the underlying layer 2 is connected to the second word line 35 via a connection plug 34. In other words, the layer arrangement of the magnetoresistive effect element $1C_1$ in the direction directed from the bit line 40 to the first word line 30 is opposite to the layer arrangement of the magnetoresistive effect element $1C_2$ in the direction directed from the bit line 40 to the second word line 35.

The connection portion 50 includes connection plugs 51 and 52. The connection plug 51 is formed as the same layer as the magnetoresistive effect element $1C_2$. Therefore, the connection plug 51 has the same layer configuration as the magnetoresistive effect element $1C_2$. The selection transistor 60 includes a gate 61, a drain 62 and a source 63. One end of the connection portion 50 is connected to the bit line 40, and the other end of the connection portion 50 is connected to the drain 62 of the selection transistor 60. The source 63 of the selection transistor 60 is connected to an electrode 70.

Figure 37:
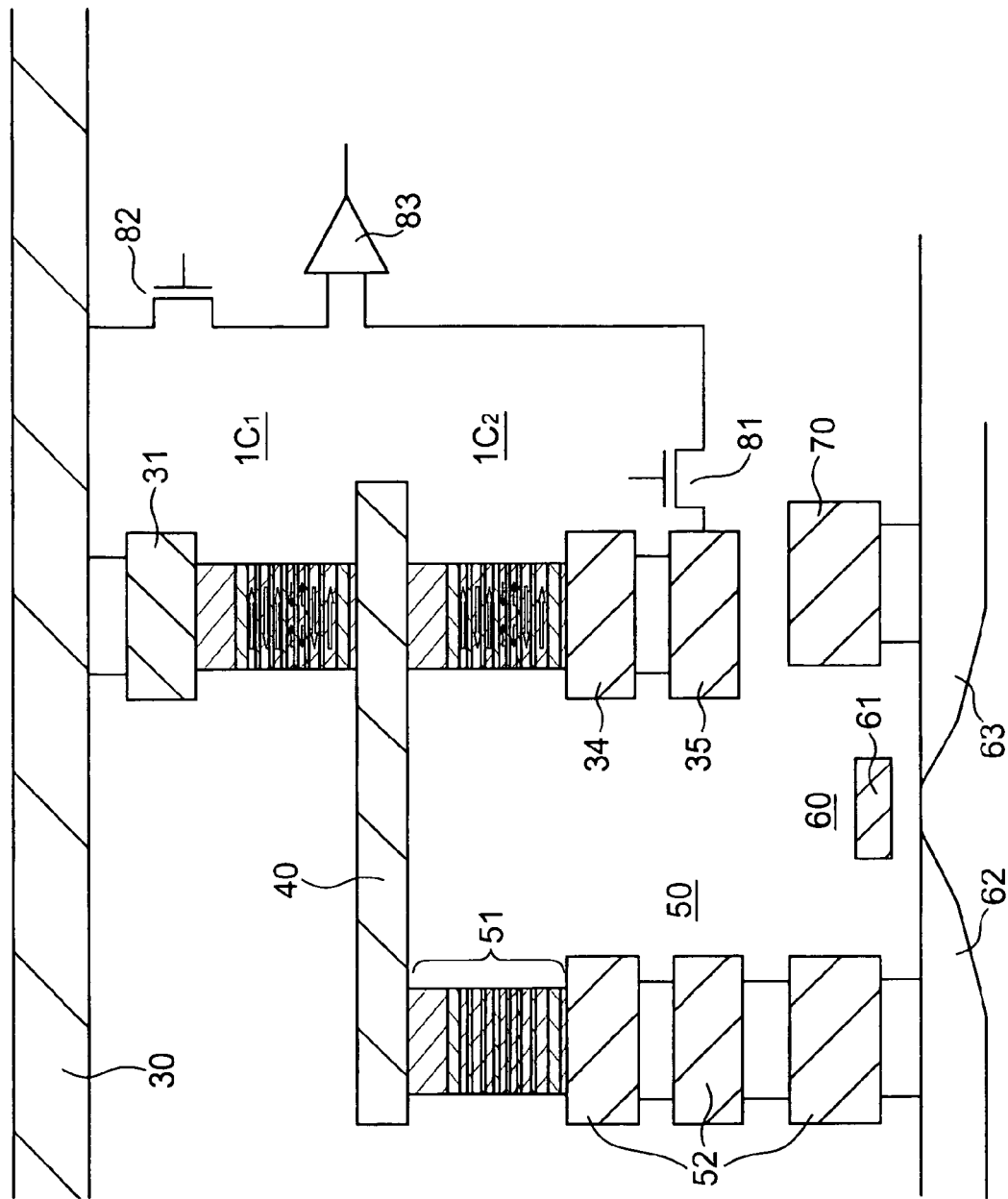
FIG. 37 is a diagram showing readout operation from a memory cell in a magnetic memory according to a seventh embodiment.

Operation of the magnetic memory according to the present embodiment will now be described with reference to FIGS. 37 to 42. First, read operation of the magnetic memory according to the present embodiment will be described with reference to FIG. 37. FIG. 37 is a sectional view showing read operation of the magnetic memory according to the present invention. When reading out data recorded in the magnetic memory, the selection transistor 60 is turned on to let flow a current from the electrode 70 to the selection transistor 60, the connection portion 50 and the bit line 40. Thereupon, the current flowing through the bit line 40 is branched to the two magnetoresistive effect elements $1C_1$ and $1C_2$ to flow to the two word lines 30 and 35 respectively via the connection plugs 31 and 34. At this time, currents flowing through the two word lines 30 and 35 are read out by a differential amplifier 83 via transistors 81 and 82. As a result, fast readout becomes possible.

Figure 38A:
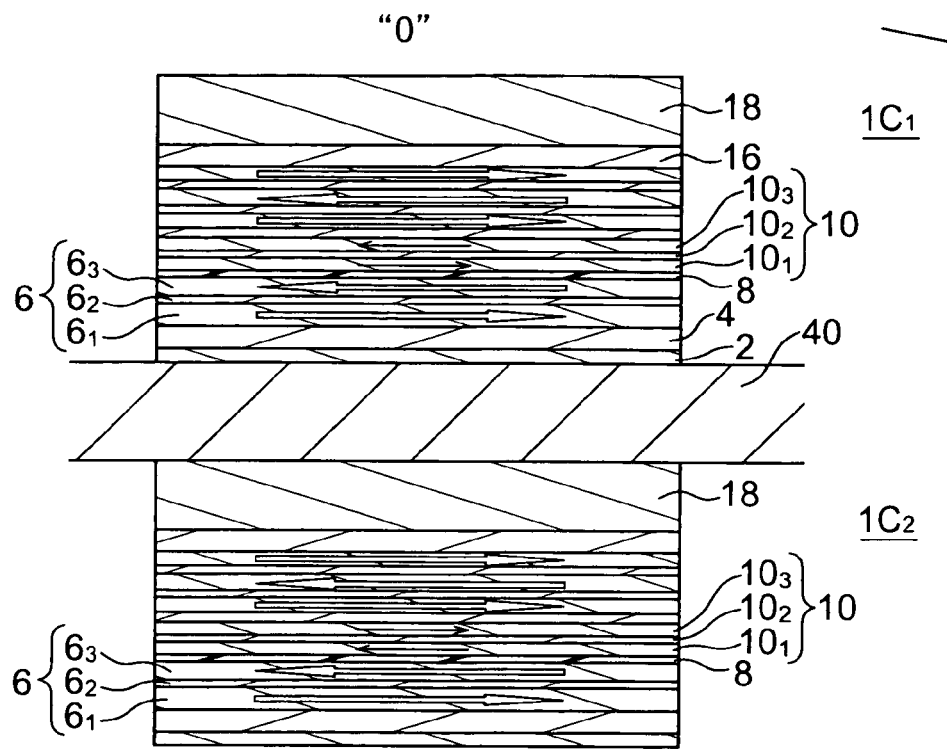
FIGS. 38(a) and 38(b) are diagrams showing spin states corresponding to data "0" and "1" in a magnetoresistive effect element according to a seventh embodiment.
Figure 38B:
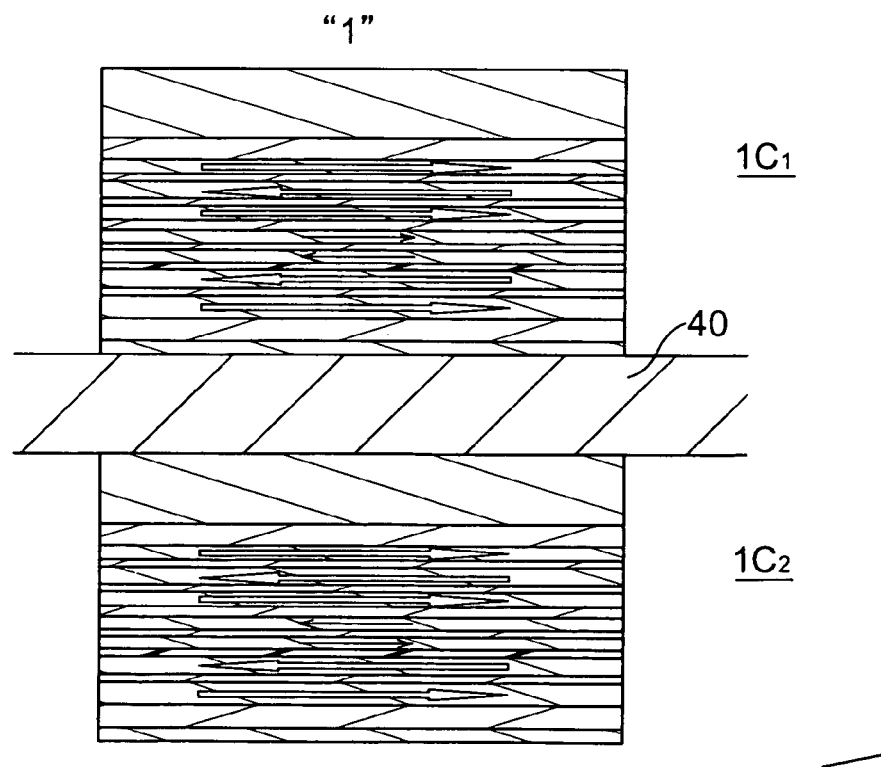

In the present embodiment, data "0" recorded in the memory cell means that the spin direction of the magnetic layer $10_1$ included in the magnetic recording layer 10 and located near the tunnel barrier layer 8 in the magnetoresistive effect element $1C_1$ is antiparallel to the spin direction of the magnetic layer $6_3$ included in the first magnetization pinned layer 6 and located near the magnetic recording layer 10 whereas the spin direction of the magnetic layer $10_1$ included in the magnetic recording layer 10 and located near the tunnel barrier layer 8 in the magnetoresistive effect element $1C_2$ is parallel to the spin direction of the magnetic layer $6_3$ included in the first magnetization pinned layer 6 and located near the magnetic recording layer 10 as shown in FIG. 38(a). Data "1" recorded in the memory cell means that the spin direction of the magnetic layer $10_1$ included in the magnetic recording layer 10 and located near the tunnel barrier layer 8 in the magnetoresistive effect element $1C_1$ is parallel to the spin direction of the magnetic layer $6_3$ included in the first magnetization pinned layer 6 and located near the magnetic recording layer 10 whereas the spin direction of the magnetic layer $10_1$ included in the magnetic recording layer 10 and located near the tunnel barrier layer 8 in the magnetoresistive effect element $1C_2$ is antiparallel to the spin direction of the magnetic layer $6_3$ included in the first magnetization pinned layer 6 and located near the magnetic recording layer 10 as shown in FIG. 38(b).

Figure 39:
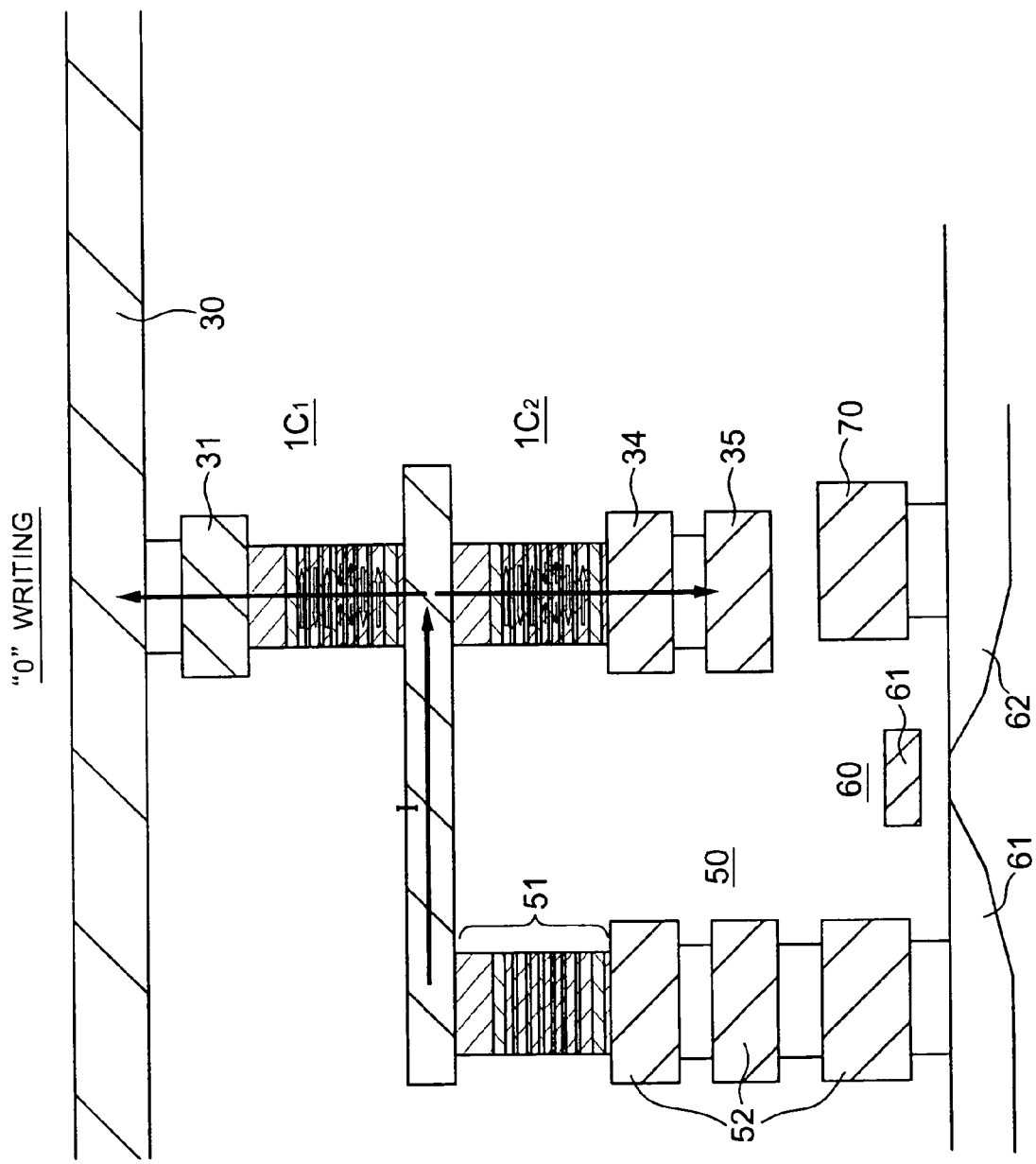
FIG. 39 is a sectional view of a memory cell showing a direction of a current when data "0" is written in a seventh embodiment.
Figures 40A, 40B:
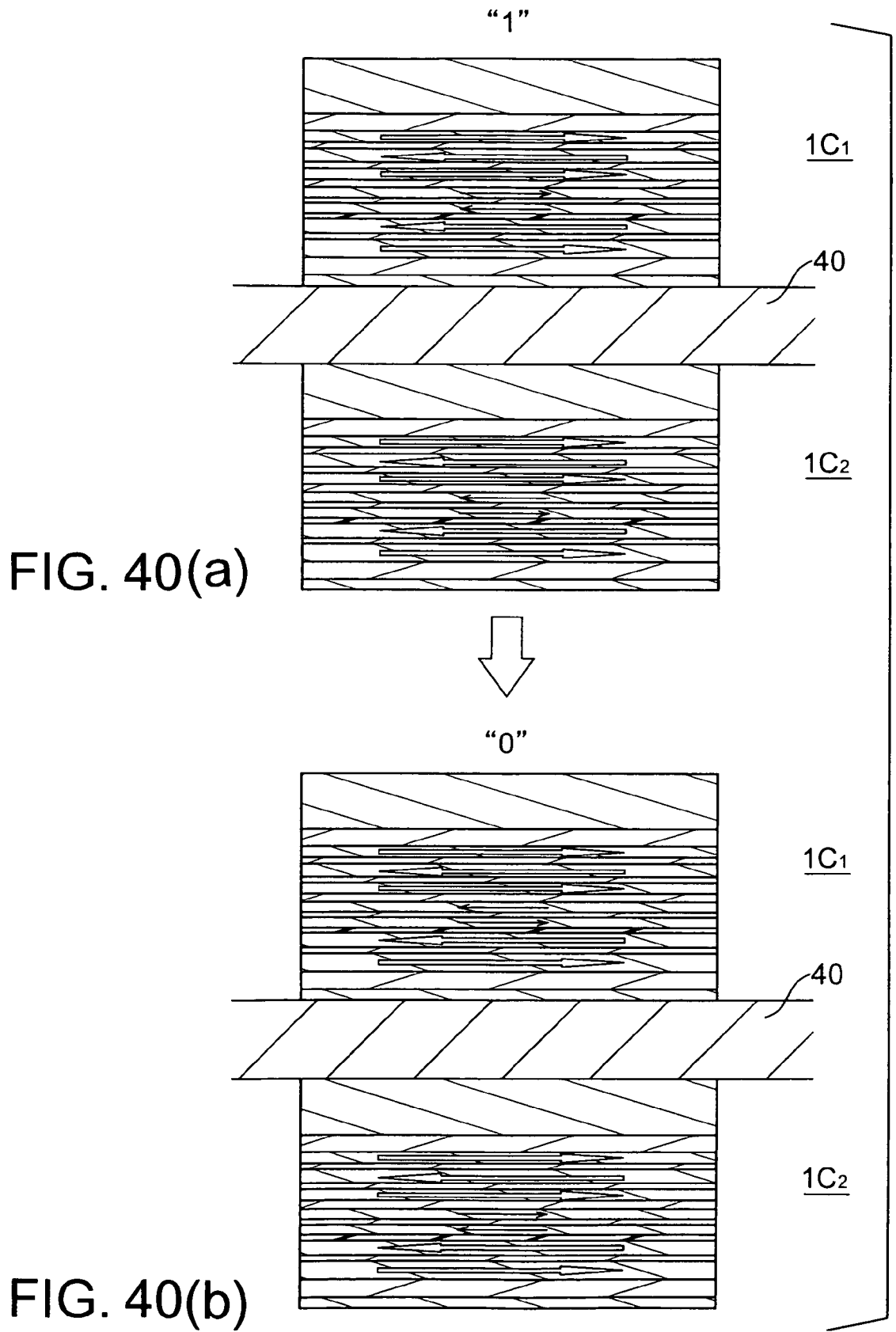
FIGS. 40(a) and 40(b) are diagrams showing a spin direction in a magnetoresistive effect element obtained when data is rewritten to change data "1" to data "0" in a seventh embodiment.

Operation of writing data "0" and "1" into the memory cell in the magnetic memory according to the present embodiment will now be described with reference to FIGS. 39 to 42(b). FIG. 39 is the sectional view of the memory cell which indicates a direction of a current at the time when data "0" is written in the magnetic memory according to the present embodiment. FIGS. 40(a) and 40(b) are diagrams showing spin directions in the magnetoresistive effect elements $1C_1$ and $1C_2$ at the time when data "1" is rewritten to data "0." FIG. 41 is a sectional view of the memory cell showing the current direction at the time when writing data "1." FIGS. 42(a) and 42(b) are diagrams showing spin directions in the magnetoresistive effect elements $1C_1$ and $1C_2$ obtained when data "0" is rewritten to data "1."

When writing data "0" as shown in FIG. 39, the selection transistor 60 is first turned on to let flow a write current from the electrode 70 into the bit line 40 via the selection transistor 60 and the connection portion 50. Thereupon, the current flowing through the bit line 40 is branched to the two magnetoresistive effect elements $1C_1$ and $1C_2$ to flow to the two word lines 30 and 35 respectively via the connection plugs 31 and 34. Since the current flows from the bit line 40 to the word line 30, the spin is injected from the second magnetization pinned layer 15 into the magnetic recording layer 10 in the magnetoresistive effect element $1C_1$. The spin in the magnetic recording layer 10 is inverted in the same way as the first modification of the second embodiment shown in FIG. 6.

Since the current flows from the bit line 40 to the word line 35, the spin is injected from the magnetic layer $6_3$ included in the first magnetization pinned layer 6 and located near the magnetic recording layer 10 into the magnetic recording layer 10. The spin in the magnetic recording layer 10 is inverted in the same way as the first modification of the second embodiment shown in FIG. 6. As a result, data "1" is rewritten to data "0" as shown in FIGS. 40(a) and 40(b).

Figure 41:
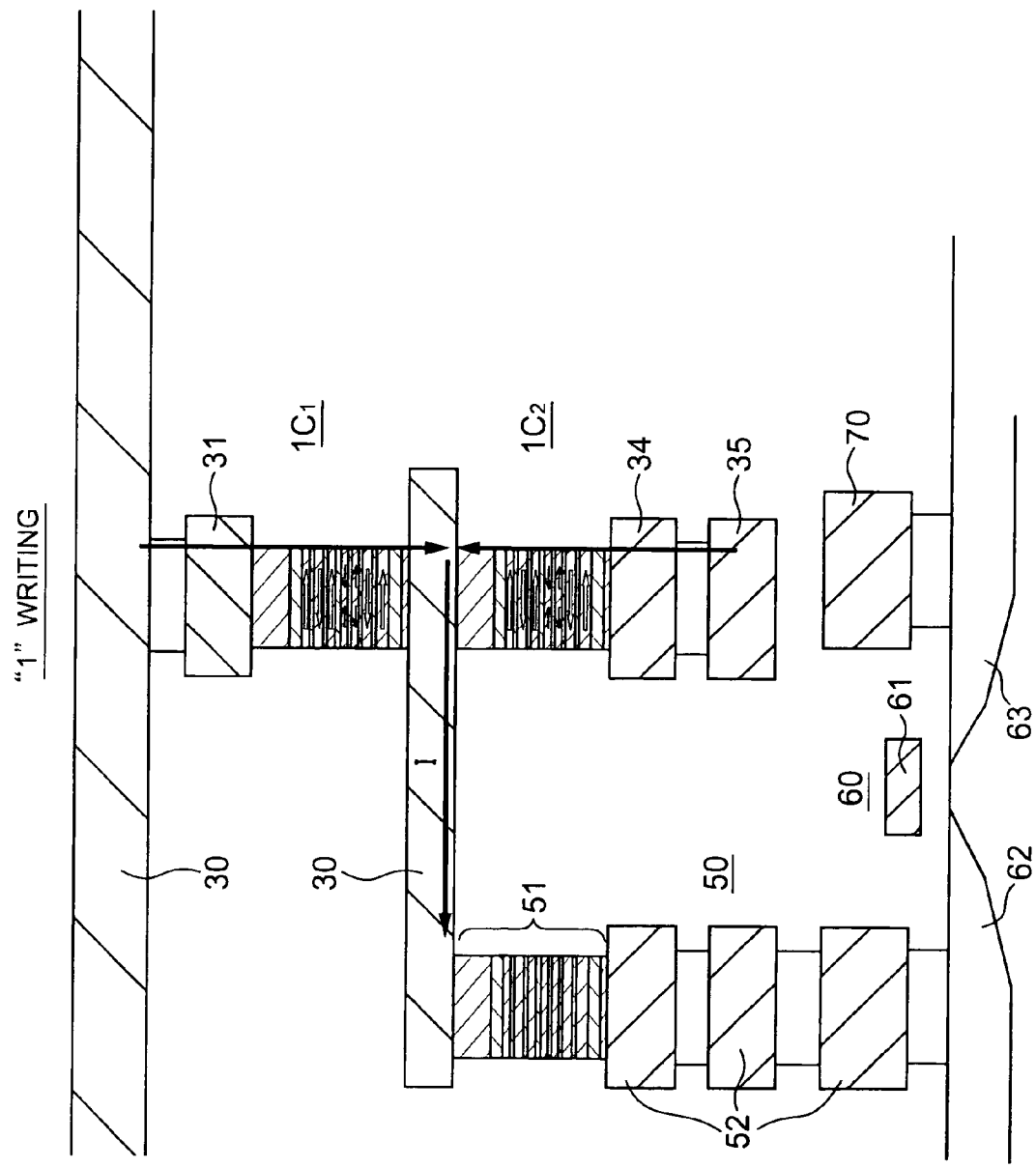
FIG. 41 is a sectional view of a memory cell showing a direction of a current when data "1" is written in a seventh embodiment.
Figure 42A:
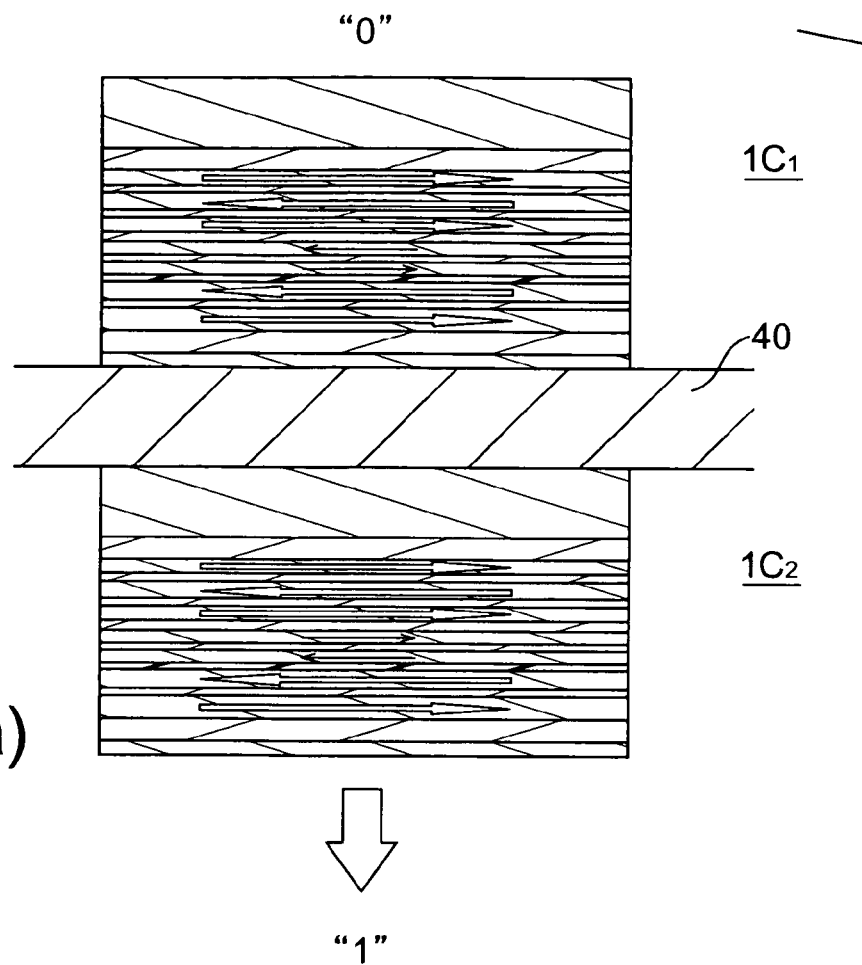
FIGS. 42(*a*) and 42(*b*) are diagrams showing a spin direction in a magnetoresistive effect element obtained when data is rewritten to change data "0" to data "1" in a seventh embodiment.
Figure 42B:
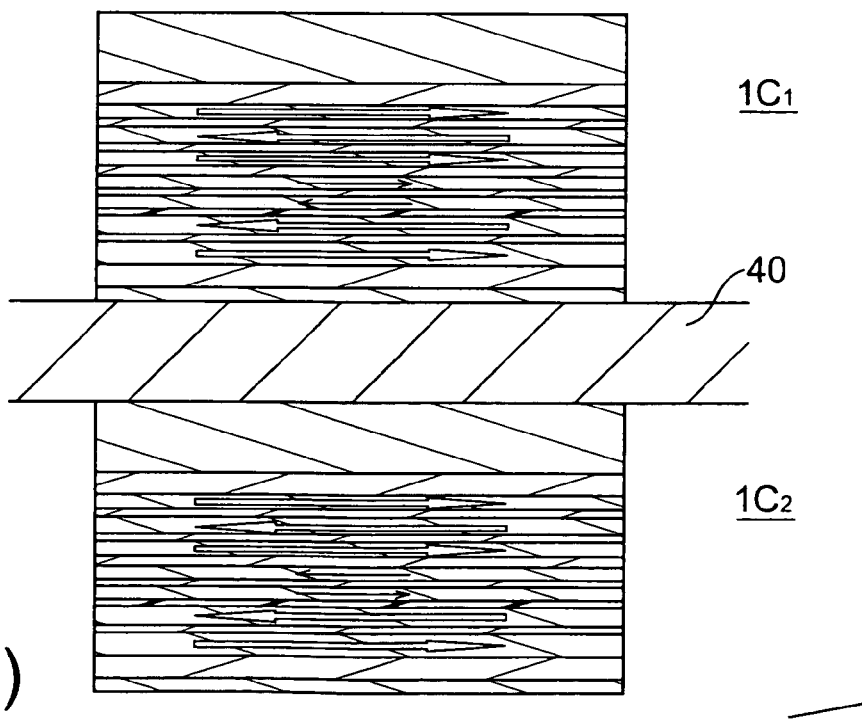

When writing data "1," the selection transistor 60 is first turned on to let flow a current from the two word lines 30 and 35 into the bit line 40 via the two magnetoresistive effect elements $1C_1$ and $1C_2$ (see FIG. 41). Thereupon, the currents flow together through the bit line 40, and flow into the electrode 70 via the connection portion 50 and the selection transistor 60. Since currents flow from the word lines 30 and 35 to the bit line 40 via the two magnetoresistive effect elements $1C_1$ and $1C_2$, the spin in the magnetic recording layer 10 in the two magnetoresistive effect elements $1C_1$ and $1C_2$ is inverted. Thus, data "1" is written (see FIGS. 42(a) and 42(b)).

According to the present embodiment, it becomes possible to write data "1" and "0" with low power consumption by conducting spin injection as heretofore described. In addition, the write current can be reduced as compared with the case where spin injection writing to the ordinary tunnel junction element is conducted. When conducting writing, therefore, it becomes possible to prevent the tunnel barrier layer from being broken down in insulation. A highly reliable magnetic memory can be obtained.

It is a matter of course that in the present embodiment the write current is set to a greater value than the read current.

In the magnetoresistive effect element $1C_1$ according to the present embodiment, the underlying layer 2 is disposed on the bit line 40 side and the hard mask 18 is disposed on the word line 30 side. In the magnetoresistive effect element $1C_2$, the hard mask 18 is disposed on the bit line 40 side and the underlying layer 2 is disposed on the word line 35 side. Alternatively, it is also possible to dispose in the magnetoresistive effect element $1C_1$ the hard mask 18 on the bit line 40 side and the underlying layer 2 on the word line 30 side, and dispose in the magnetoresistive effect element $1C_2$ the underlying layer 2 on the bit line 40 side and the hard mask 18 on the word line 35 side.

EIGHTH EMBODIMENT

Figure 43:
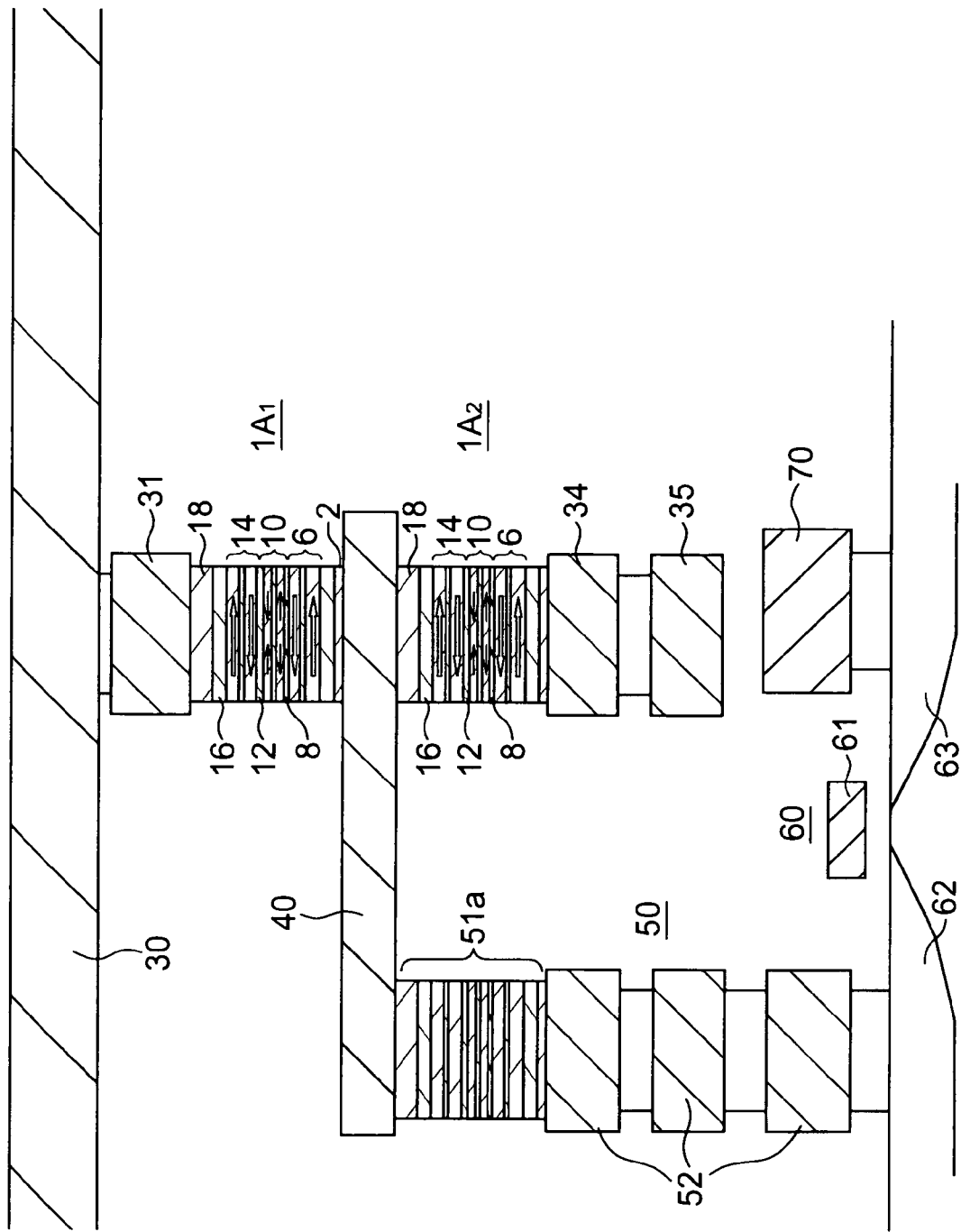
FIG. 43 is a sectional view showing a memory cell included in a magnetic memory according to an eighth embodiment of the present invention.

A magnetic memory according to an eighth embodiment of the present invention will now be described with reference to FIGS. 43 to 49(b). FIG. 43 is a sectional view showing a memory cell of a magnetic memory according to the present embodiment. The magnetic memory according to the present embodiment has a configuration obtained by replacing the magnetoresistive effect elements $1C_1$ and $1C_2$ with magnetoresistive effect elements $1A_1$ and $1A_2$ and replacing the connection plug 51 in the connection portion 50 with a connection plug 51a. Each of the magnetoresistive effect elements $1A_1$ and $1A_2$ has the same layer configuration as that of the magnetoresistive effect element 1A according to the modification of the first embodiment shown in FIG. 2. The connection plug 51a has the same layer configuration as that of the magnetoresistive effect element $1A_2$.

Figure 44:
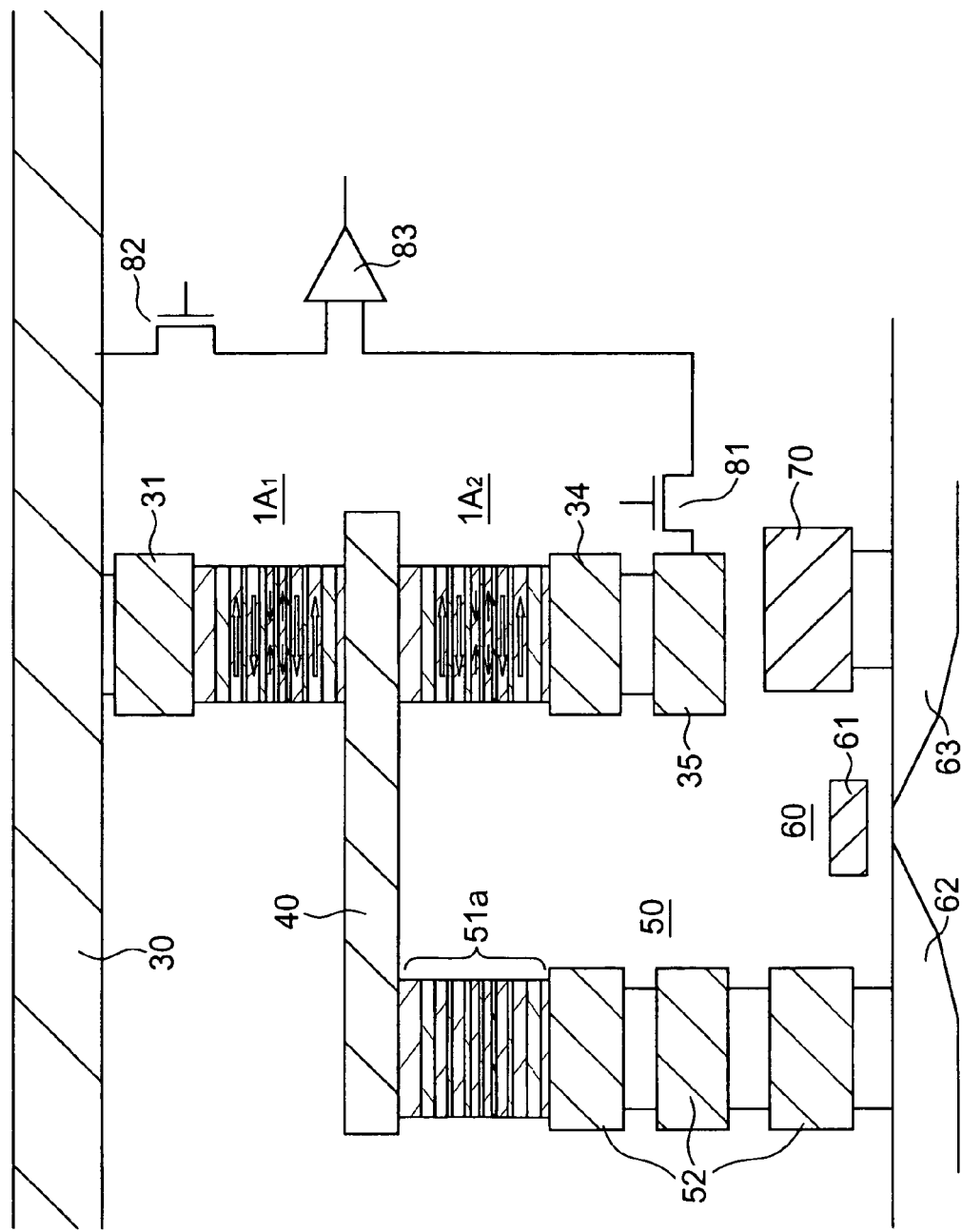
FIG. 44 is a diagram showing readout operation from a memory cell in a magnetic memory according to an eighth embodiment.
Figure 45A:
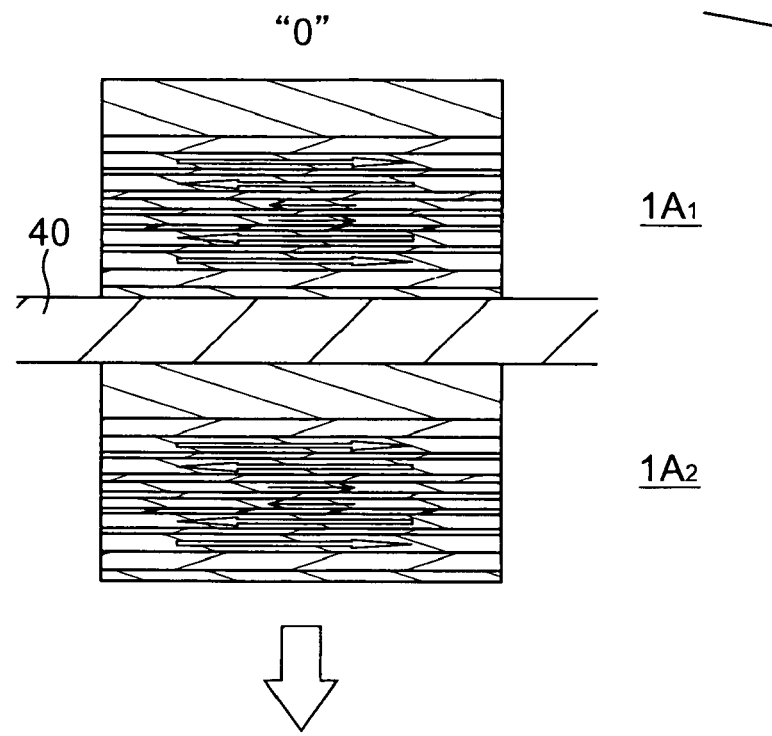
FIGS. 45(*a*) and 45(*b*) are diagrams showing spin states corresponding to data "0" and "1" in a magnetoresistive effect element according to an eighth embodiment.
Figure 45B:
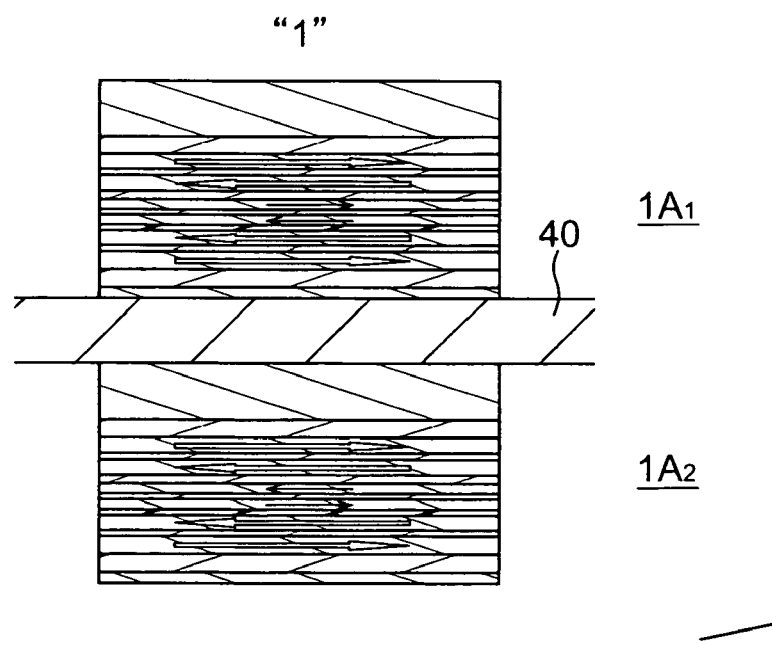
Figure 46:
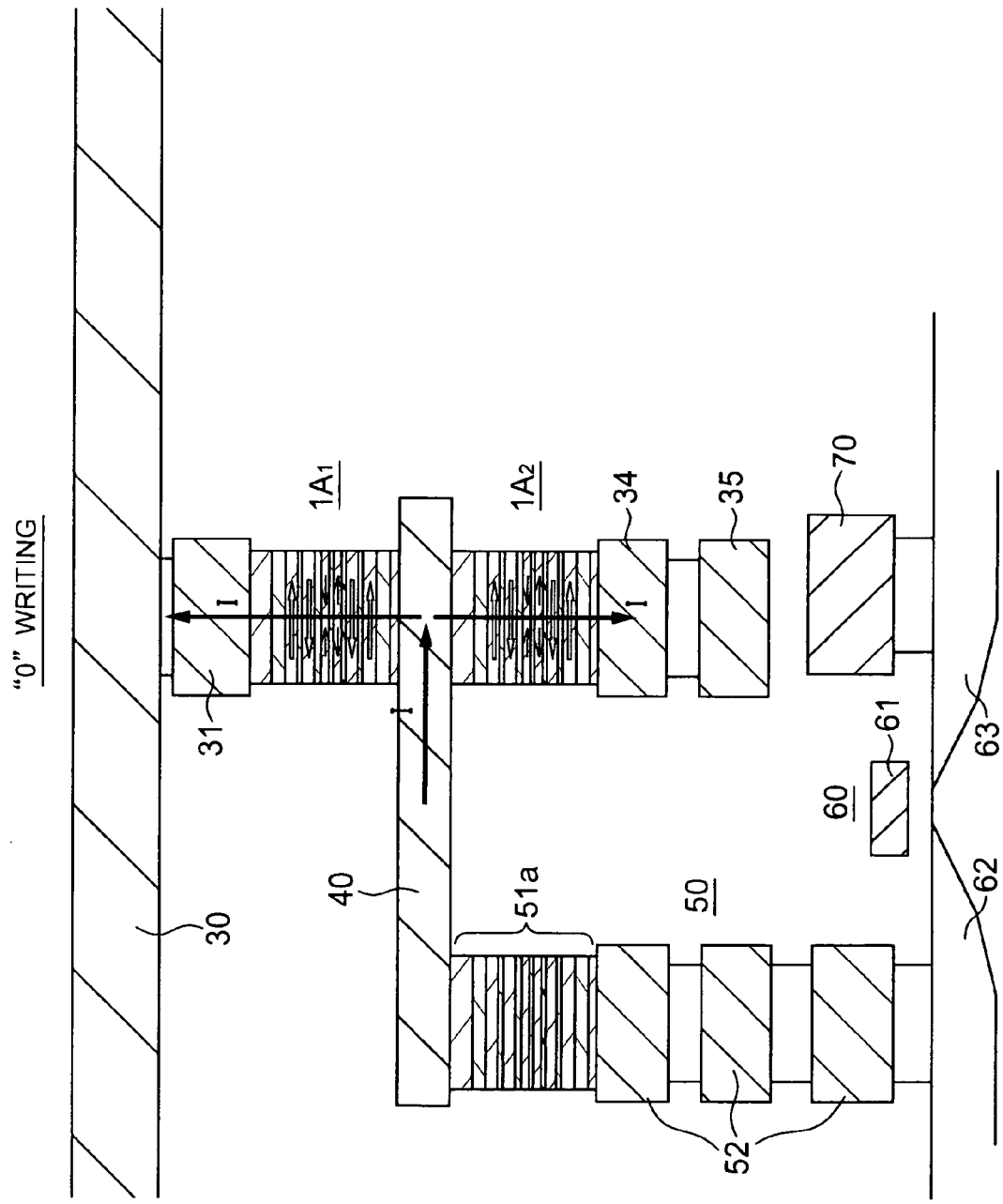
FIG. 46 is a sectional view of a memory cell showing a direction of a current when data "0" is written in an eighth embodiment.
Figure 47A:
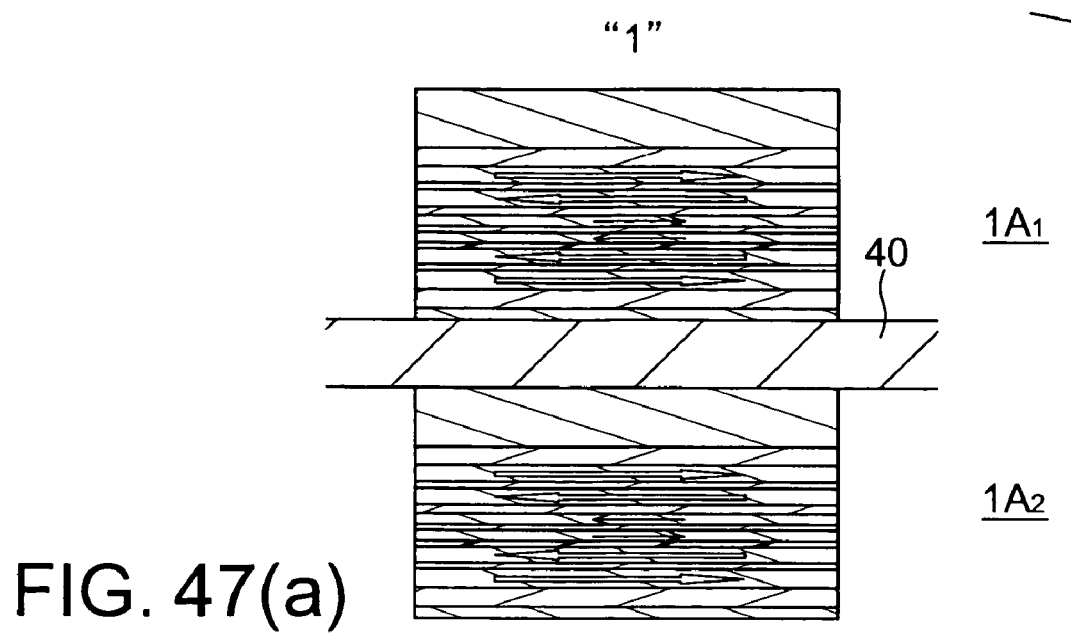
FIGS. 47(*a*) and 47(*b*) are diagrams showing a spin direction in a magnetoresistive effect element obtained when data is rewritten to change data "1" to data "0" in an eighth embodiment.
Figure 47B:
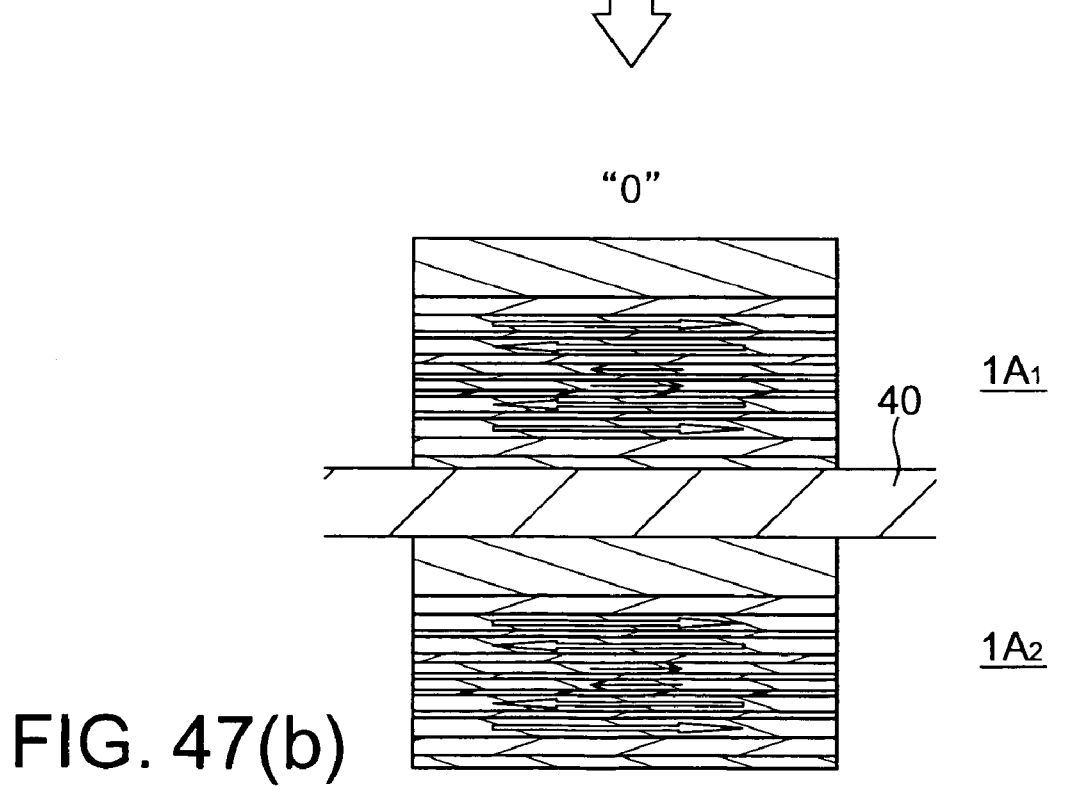

Operation of the magnetic memory according to the present embodiment will now be described. FIG. 44 is a sectional view showing readout operation of the magnetic memory according to the present embodiment. FIGS. 45(a) and 45(b) are sectional views showing spin states of a magnetoresistive effect element corresponding to states of data "0" and "1," respectively. FIG. 46 is the sectional view of a memory cell which indicates a direction of a current at the time when data "0" is written. FIGS. 47(a) and 47(b) are diagrams showing spin directions in the magnetoresistive effect elements $1A_1$ and $1A_2$ at the time when data "1" is rewritten to data "0." FIG. 48 is a sectional view of the memory cell showing the current direction at the time when writing data "1." FIGS. 49(a) and 49(b) are diagrams showing spin directions in the magnetoresistive effect elements $1A_1$ and $1A_2$ obtained when data "0" is rewritten to data "1."

As appreciated from FIG. 44, readout operation in the magnetic memory according to the present embodiment is conducted in the same way as the seventh embodiment shown in FIG. 37. In other words, the selection transistor 60 is turned on to let flow a current from the electrode 70 to the selection transistor 60, the connection portion 50 and the bit line 40. Thereupon, the current flowing through the bit line 40 is branched to the two magnetoresistive effect elements $1A_1$ and $1A_2$ to flow to the two word lines 30 and 35 respectively via the connection plugs 31 and 34. At this time, currents flowing through the two word lines 30 and 35 are read out by a differential amplifier 83 via transistors 81 and 82. As a result, fast readout becomes possible. As appreciated from FIGS. 45(a) and 45(b), the definitions of the data "0" and "1" are the same as those in the seventh embodiment shown in FIGS. 38(a) and 38(b). In other words, the data "0" and "1" are defined according to whether spin directions of the magnetic layer $10_1$ and the magnetic layer $6_3$ respectively included in the magnetic recording layer 10 and the first magnetization pinned layer 6 and located near the tunnel barrier layer 8 are parallel or antiparallel.

As appreciated from FIG. 46 and FIGS. 47(a) and 47(b), data "0" is written into the magnetic memory according to the present embodiment in the same way as the seventh embodiment shown in FIG. 39 and FIGS. 40(a) and 40(b). In other words, data "0" is written by letting flow currents from the bit line 40 to the word lines 30 and 35 via the magnetoresistive effect elements $1A_1$ and $1A_2$.

Figure 48:
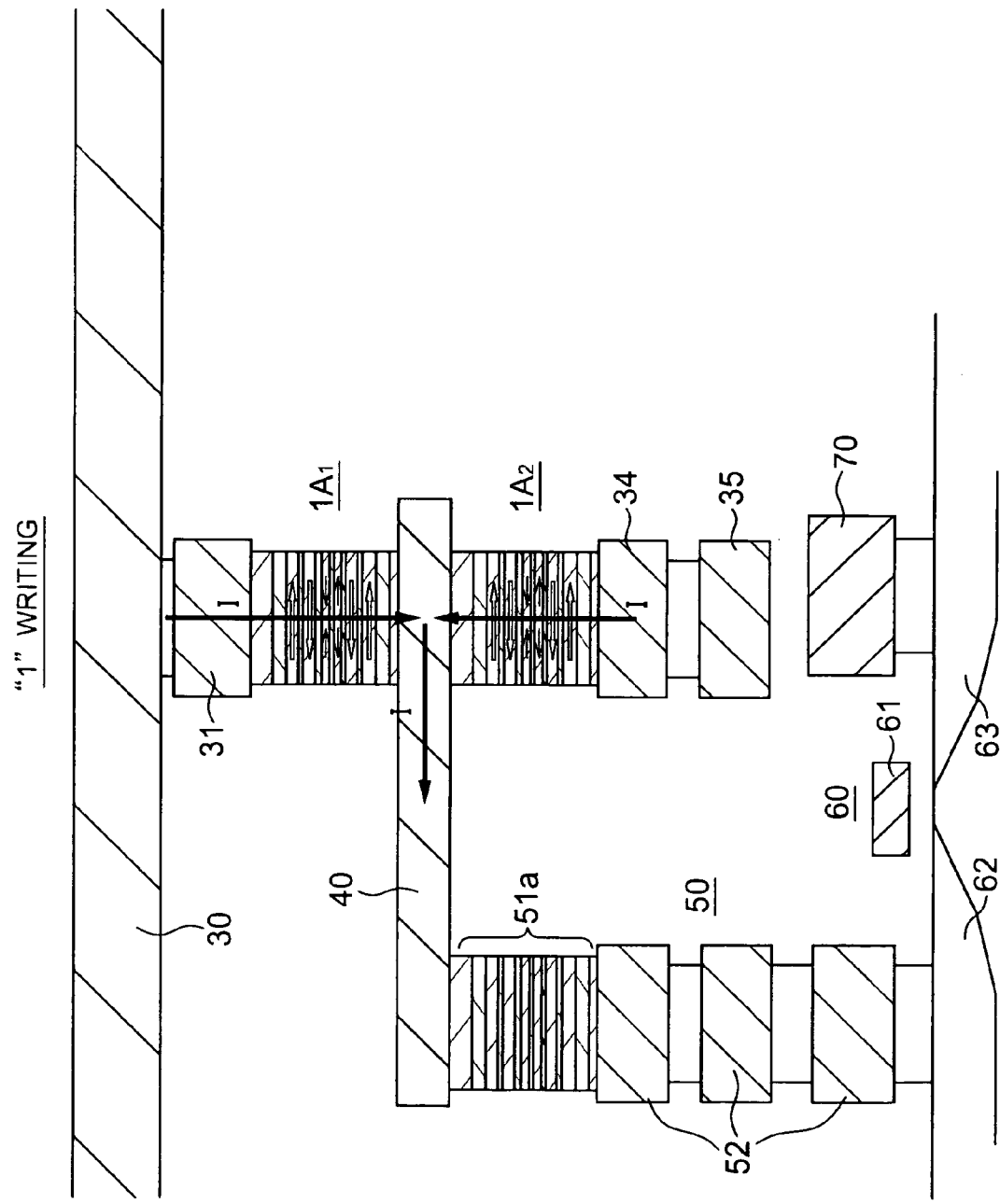
FIG. 48 is a sectional view of a memory cell showing a direction of a current when data "1" is written in an eighth embodiment.
Figures 49A, 49B:
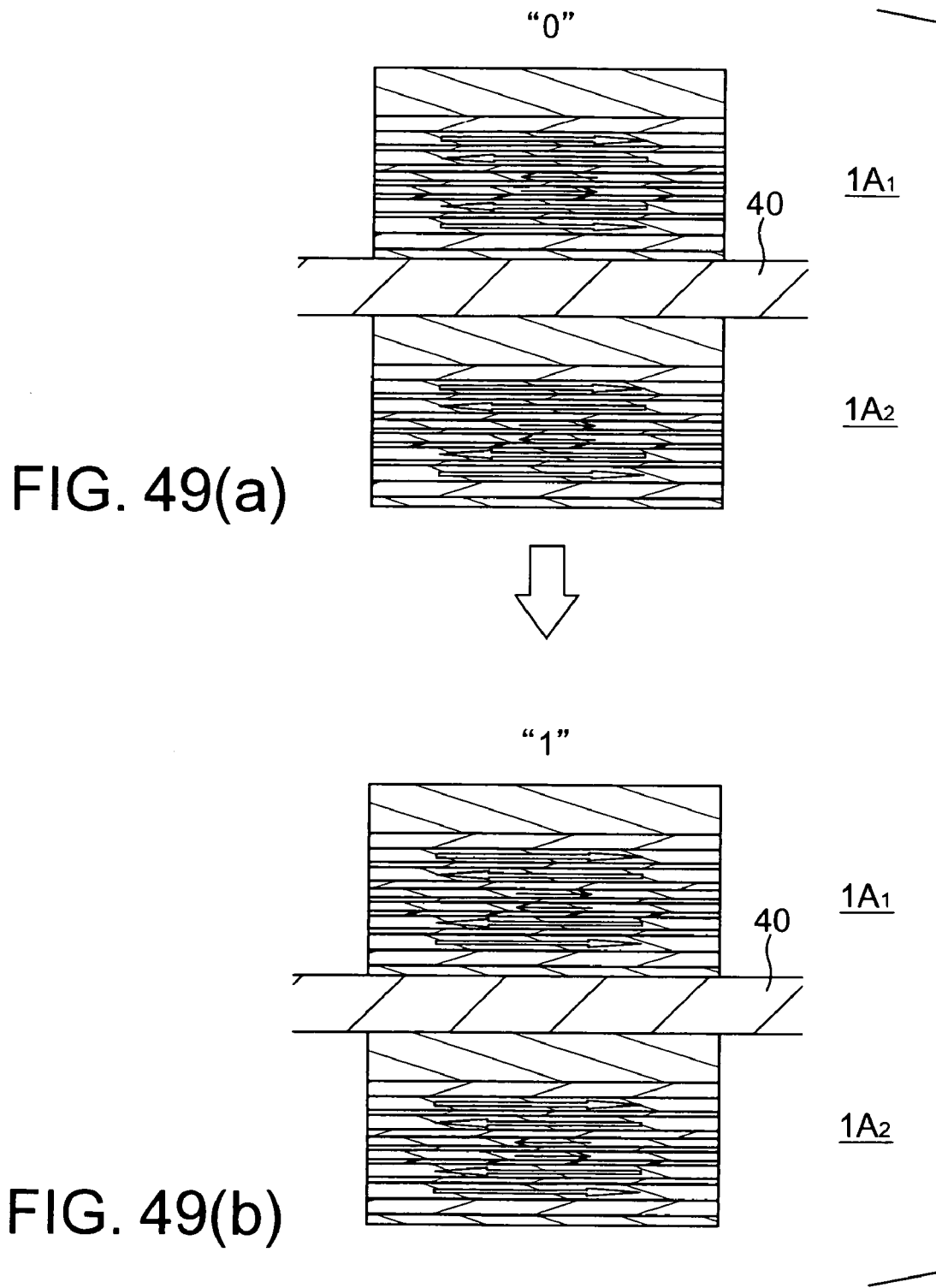
FIGS. 49(*a*) and 49(*b*) are diagrams showing a spin direction in a magnetoresistive effect element obtained when data is rewritten to change data "0" to data "1" in an eighth embodiment.

As appreciated from FIG. 48 and FIGS. 49(a) and 49(b), data "1" is written into the magnetic memory according to the present embodiment in the same way as the seventh embodiment shown in FIG. 41 and FIGS. 42(a) and 42(b). In other words, data "1" is written by letting flow currents from the word lines 30 and 35 to the bit line 40 via the magnetoresistive effect elements $1A_1$ and $1A_2$.

According to the present embodiment as well, it becomes possible to write data "1" and "0" with low power consumption by conducting spin injection, in the same way as the seventh embodiment. In addition, the write current can be reduced as compared with the case where spin injection writing to the ordinary tunnel junction element is conducted. When conducting writing, therefore, it becomes possible to prevent the tunnel barrier layer from being broken down in insulation. And a highly reliable magnetic memory can be obtained.

It is a matter of course that in the present embodiment the write current is set to a greater value than the read current.

In the magnetoresistive effect element $1A_1$ according to the present embodiment, the underlying layer 2 is disposed on the bit line 40 side and the hard mask 18 is disposed on the word line 30 side. In the magnetoresistive effect element $1A_2$, the hard mask 18 is disposed on the bit line 40 side and the underlying layer 2 is disposed on the word line 35 side. Alternatively, it is also possible to dispose in the magnetoresistive effect element $1A_1$ the hard mask 18 on the bit line 40 side and the underlying layer 2 on the word line 30 side, and dispose in the magnetoresistive effect element $1A_2$ the underlying layer 2 on the bit line 40 side and the hard mask 18 on the word line 35 side.

It is a matter of course that in the fifth to eighth embodiments a sense current control element circuit, a driver and a sinker which control a sense current let flow through the magnetoresistive effect element in order to read out information stored by the magnetoresistive effect element are further included.

Hereafter, examples of the present invention will be described in detail with reference to examples.

FIRST EXAMPLE

Figure 2:
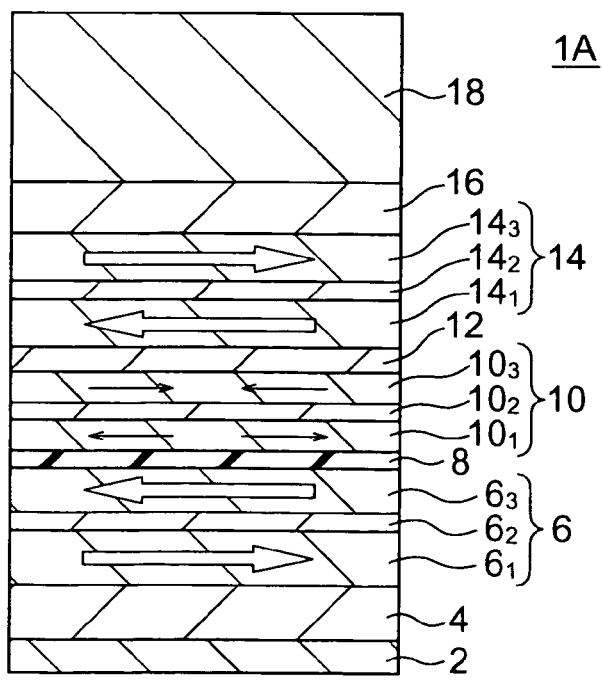
FIG. 2 is a sectional view showing a magnetoresistive effort element according to a modification of the first embodiment.
Figure 50:
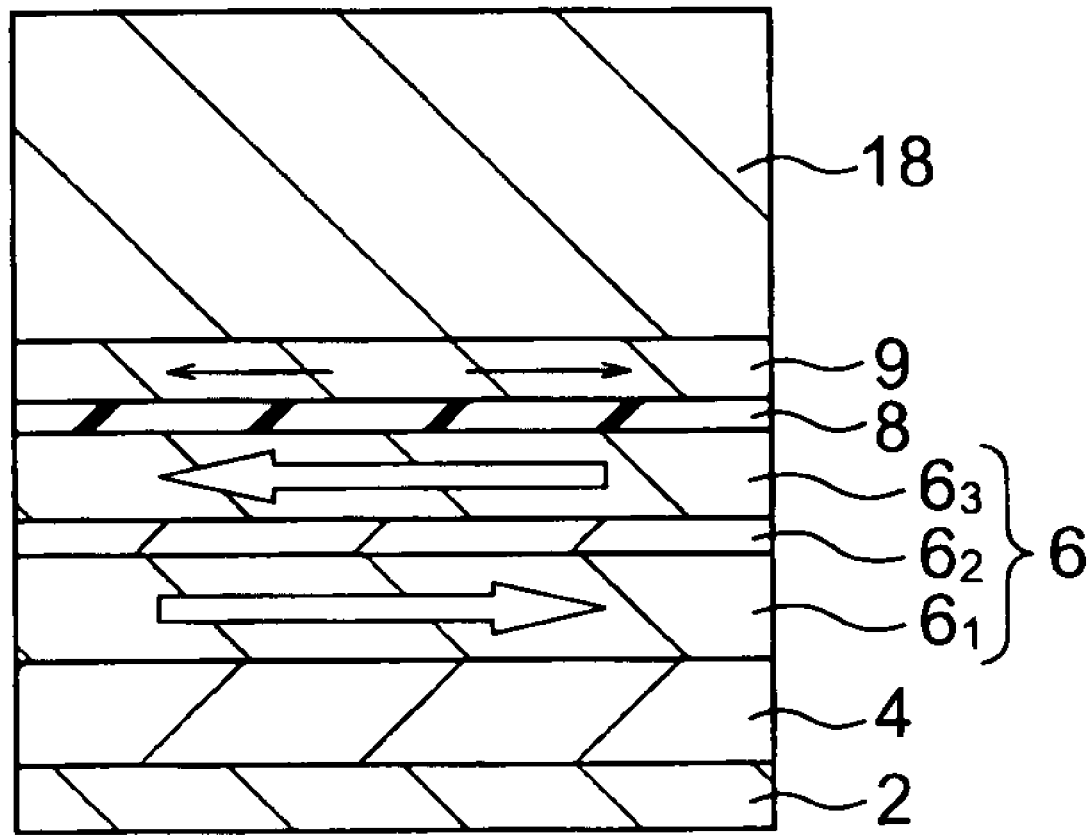
FIG. 50 is a sectional view showing a comparative example for a magnetoresistive effect element according to a first example of the present invention.

First, the magnetoresistive effect element 1A according to a modification of the first embodiment shown in FIG. 2 is fabricated as a first example of the present invention. A magnetoresistive effect element 85 having a structure shown in FIG. 50 is fabricated as a comparative example at the same time. The magnetoresistive effect element 1A is compared with the magnetoresistive effect element 85 in terms of the spin inversion current. The magnetoresistive effect element 85 of the comparative example has a configuration obtained by removing the non-magnetic metal layer 12, the second magnetization pinned layer 14 and the antiferromagnetic layer 16 and using a single layer magnetic recording layer 9 instead of the magnetic recording layer 10 of synthetic antiferromagnetic coupling as the magnetic recording layer.

The magnetoresistive effect element 1A according to the first example and the magnetoresistive effect element 85 according to the comparative example are fabricated as hereafter described.

First, a TMR film, i.e., a laminated film including an underlying layer 2/an antiferromagnetic layer 4/a magnetic layer $6_1$/a non-magnetic layer $6_2$/a magnetic layer $6_3$/a tunnel barrier layer 8/a magnetic layer $10_1$/a non-magnetic layer $10_2$/a magnetic layer $10_3$/a non-magnetic metal layer 12/a magnetic layer $14_1$/a non-magnetic layer $14_2$/a magnetic layer $14_3$/an antiferromagnetic layer 16/a cap layer formed of Ru (not illustrated)/a metal protection film 18 is formed on a lower electrode (not illustrated) as shown in FIG. 2. The TMR element 1A having such a configuration is referred to as TMR element according to the first example.

As shown in FIG. 50, a TMR film, i.e., a laminated film including an underlying layer 2/an antiferromagnetic layer 4/a magnetic layer $6_1$/a non-magnetic layer $6_2$/a magnetic layer $6_3$/a tunnel barrier layer 8/a magnetic layer 9/a cap layer formed of Ru (not illustrated)/a metal protection film 18 in order is formed on a lower electrode (not illustrated). The TMR element 85 having such a configuration is referred to as comparative example.

In the present example, the lower wiring is formed of Ta/Cu/Ta and the underlying layer is formed of Ru. In the TMR film according to the first example, the antiferromagnetic layer 4 formed of Ir—Mn (10 nm), the first magnetization pinned layer 6 formed of $Co_{90}Fe_{10}$ (3 nm)/Ru (0.85 nm)/$Co_{90}Fe_{10}$ (4 nm), the tunnel barrier layer 8 formed of AlOx (1.4 nm), the magnetic recording layer 10 formed of $Co_{90}Fe_{10}$ (3 nm)/Ru (0.85 nm)/$Co_{90}Fe_{10}$ (3 nm), the non-magnetic metal layer 12 formed of Cu (6 nm), the second magnetization pinned layer 14 formed of $Co_{90}Fe_{10}$ (4 nm)/Ru (0.85 nm)/$Co_{90}Fe_{10}$ (3 nm), and the antiferromagnetic layer 16 formed of Ir—Mn (10 nm) are formed in order from the bottom.

In the TMR film of the comparative example, the lower wiring is formed of Ta/Cu/Ta and the underlying layer is formed of Ru. The antiferromagnetic layer 4 formed of Ir—Mn (10 nm), the magnetization pinned layer 6 formed of $Co_{90}Fe_{10}$ (3 nm)/Ru (0.8 nm)/$Co_{90}Fe_{10}$ (4 nm), the tunnel barrier layer 8 formed of AlOx (1.4 nm), and the magnetic recording layer 9 formed of $Co_{90}Fe_{10}$ (3 nm) are formed. In both the present example and the comparative example, Ta is used as the metal protection film 18.

Thereafter, the TMR elements of the first example and the comparative example are annealed in a magnetic field at 270° C. Then the TMR elements are coated with a resist, and etching is conducted. Then the resist is subjected to slimming using an ozone flow at 140° C. The metal protection film 18 formed of Ta is etched using the slimmed resist as a mask and using $SF_6$ gas according to the RIE method. This etching is stopped by the cap layer formed of Ru. Thereafter, the resist is peeled off. Junction separation of the ferromagnetic tunnel junction is conducted by conducting patterning using the metal protection film 18 formed of Ta as a hard mask and using milling or the RIE (Reactive Ion Etching) method as far as the tunnel barrier layer 8.

Both the first example and the comparative example have a junction size of 0.1×0.18 μm². Thereafter, an SiOx protection film is formed, and coated with a resist. The resist is patterned to form a resist pattern. The lower electrode is patterned using this resist pattern as a mask and using the RIE method. Thereafter, the resist pattern is removed, and an interlayer insulation film formed of SiOx is formed. Then, etching back and planarization are conducted. In addition, the surface of the metal protection film formed of Ta in the upper part of the TMR film is exposed. Then, sputter etching is conducted, and wiring is sputtered. The upper wiring is formed by conducting etch back using the RIE method. Thereafter, a magnetic field is applied to the long axis direction of the magnetic layer in order to conduct annealing in the magnetic field.

Figure 51:
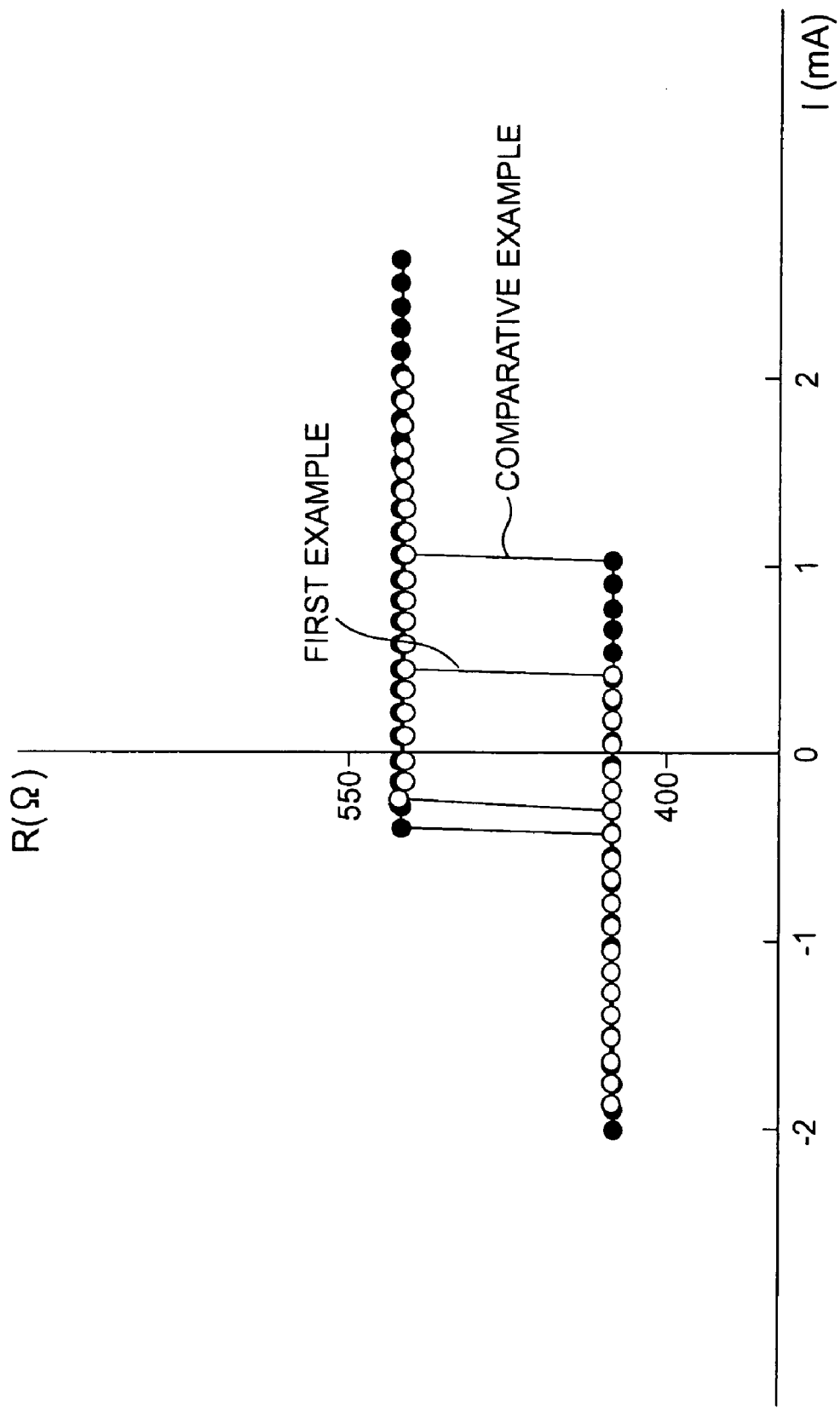
FIG. 51 is a diagram showing write characteristics of a first example and a first comparative example.

A pulse current having a pulse width of 200 nm is applied to the magnetoresistive effect elements according to the first example and the comparative example, and a current (mA) at which the spin is inverted is checked. As shown in FIG. 51, the spin is inverted at 0.45 mA in the first example, and at 1.1 mA in the comparative example. It is appreciated that the structure of the magnetoresistive effect element 1A according to the present example is suitable as a large capacity memory and spin injection writing can be conducted at a low current.

SECOND EXAMPLE

As a second example of the present invention, a magnetoresistive effect element 1C according to a first modification of the second example shown in FIG. 6 is fabricated. As a comparative example, a magnetoresistive effect element which has the same structure as that fabricated in the first example and shown in FIG. 50 and which differs in material from the comparative example of the first embodiment is fabricated at the same time. The magnetoresistive effect elements are compared with each other in terms of the spin inversion current.

The magnetoresistive effect element 1C according to the second example and the magnetoresistive effect element according to the comparative example are fabricated as hereafter described.

First, a TMR film, i.e., a laminated film including an underlying layer 2/an antiferromagnetic layer 4/a magnetic layer $6_1$/a non-magnetic layer $6_2$/a magnetic layer $6_3$/a tunnel barrier layer 8/a magnetic layer $10_1$/a non-magnetic layer $10_2$/a magnetic layer $10_3$/a non-magnetic metal layer 12/a magnetic layer $15_1$/a non-magnetic layer $15_2$/a magnetic layer $15_3$/a non-magnetic layer $15_4$/a magnetic layer $15_5$/an antiferromagnetic layer 16/a cap layer formed of Ru (not illustrated)/a metal protection film 18 is formed on a lower electrode (not illustrated) as shown in FIG. 6. The TMR element having such a configuration is referred to as TMR element according to the second example.

In the present example, the lower wiring is formed of Ta/Cu/Ta and the underlying layer is formed of Ru. In the TMR film, the antiferromagnetic layer 4 formed of PtMn (14 nm), the first magnetization pinned layer 6 formed of CoFe (3 nm)/Ru (0.85 nm)/CoFe (4 nm), the tunnel barrier layer 8 formed of MgO (1.0 nm), the magnetic recording layer 10 formed of $(Co_{70}Fe_{30})_{85}B_{15}$ (4 nm)/Rh (0.75 nm)/$(Co_{70}Fe_{30})_{85}B_{15}$ (4 nm), the non-magnetic metal layer 12 formed of Ru (4.5 nm), the second magnetization pinned layer 15 formed of CoFe (4 nm)/Ru (0.85 nm)/CoFe (4 nm)/Ru (0.85 nm)/ CoFe (4 nm), and the antiferromagnetic layer 16 formed of PtMn (14 nm) are formed in order from the bottom.

In the TMR film according to the comparative example, the lower wiring is formed of Ta/Cu/Ta and the underlying layer is formed of Ru. The antiferromagnetic layer 4 formed of PtMn (14 nm), the magnetization pinned layer 6 formed of CoFe (3 nm)/Ru (0.85 nm)/CoFe (4 nm), the tunnel barrier layer 8 formed of MgO (1.0 nm), and the magnetic recording layer 9 formed of $(CO_{70}Fe_{30})_{85}B_{15}$ (4 nm) are formed. In both the present example and the comparative example, Ta is used as the metal protection film 18.

Both the fabrication method and the junction size are the same as those described with respect to the first example. After the upper wiring is formed, a magnetic field is applied to the long axis direction of the magnetic layer in order to conduct annealing in the magnetic field.

Figure 52:
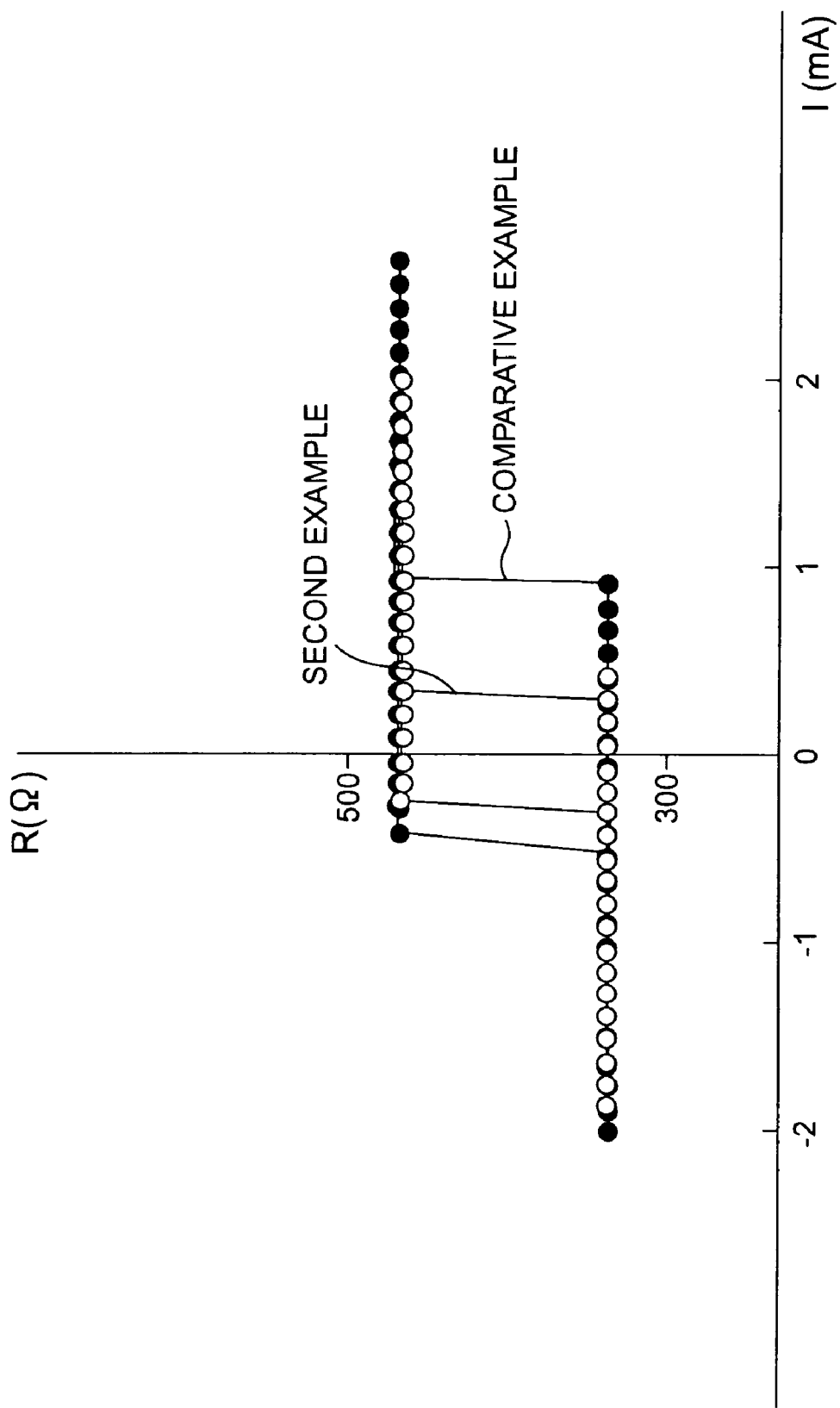
FIG. 52 is a diagram showing write characteristics of a second example and a second comparative example.

A pulse current having a pulse width of 200 nm is applied to the magnetoresistive effect elements according to the present example and the comparative example, and a current (mA) at which the spin is inverted is checked. As shown in FIG. 52, the spin is inverted at 0.35 mA in the second example, and at 0.95 mA in the comparative example. It is appreciated that the structure of the magnetoresistive effect element 1C according to the present example is suitable as a large capacity memory and spin injection writing can be conducted at a low current.

THIRD EXAMPLE

As a third example of the present invention, a magnetic memory including a memory cell shown in FIG. 43 is fabricated. In the magnetic memory in the present example, the second magnetization pinned layer 14 in the TMR elements $1A_1$ and $1A_2$ is changed from the three-layer structure having magnetic layer/non-magnetic layer/magnetic layer to a five-layer structure having magnetic layer/ non-magnetic layer/magnetic layer/non-magnetic layer/ magnetic layer.

A fine processing method of the TMR element is basically the same as that of the first example. After generating the TMR element $1A_2$, forming a bit line 40 shown in FIG. 43, then conducting CMP (Chemical Mechanical Polishing) and conducting planarization, the TMR film of the TMR element $1A_1$ is formed.

As a substrate, a substrate having a transistor is used. In the present example, a Ta/Cu/Ta laminated film is used as bit wiring 40, Ru is used as the underlying layer, Ru is used as the cap layer (not illustrated), and Ta is used as the metal protection film 18. In the TMR film, the antiferromagnetic layer 4 formed of PtMn (14 nm), the first magnetization pinned layer 6 formed of CoFe (3 nm)/Ru (0.85 nm)/CoFe (4 nm), the tunnel barrier layer 8 formed of MgO (1.0 nm), the magnetic recording layer 10 formed of $(CO_{70}Fe_{30})_{85}B_{15}$ (4 nm)/Rh (0.75 nm)/$(CO_{70}Fe_{30})_{85}B_{15}$ (4 nm), the non-magnetic metal layer 12 formed of Cu (5 nm), the second magnetization pinned layer 14 formed of CoFe (4 nm)/Ru (0.85 nm)/CoFe (4 nm)/Ru (0.85 nm)/CoFe (4 nm), and the antiferromagnetic layer 16 formed of PtMn (14 nm) are formed in order from the bottom. The TMR elements $1A_1$ and $1A_2$ have the same structure. The TMR elements $1A_1$ and $1A_2$ have a junction area of 0.1×0.18 µm². After the processing, a magnetic field is applied to the long axis direction of the magnetic layer in the magnetization pinned layer in order to conduct annealing in the magnetic field.

A pulse current having a pulse width of 200 nsec is let flow, and a current (mA) at which the spin is inverted is checked. As a result, the spin is inverted at 0.45 mA in the TMR element $1A_2$, and at 0.49 mA in the TMR element $1A_1$. As a result, the superiority of the structure according to the present example serving as a large capacity memory can be ascertained. A current pulse of less than 0.51 mA is applied to a TMR element, and a read speed after writing is conducted is checked. As a result, it can be ascertained that the differential read time is as fast as 19 nsec. Fast reading/ writing for large capacity can be proved. The basic operation can be ascertained as described with reference to the first and second examples. Similar results are obtained from a magnetic memory (a magnetic memory according to a seventh embodiment shown in FIG. 36) obtained by replacing the non-magnetic metal layer 12 formed of Cu in the TMR element in the magnetic memory according to the present example with a non-magnetic metal layer formed of Ru.

FOURTH EXAMPLE

Figure 53:
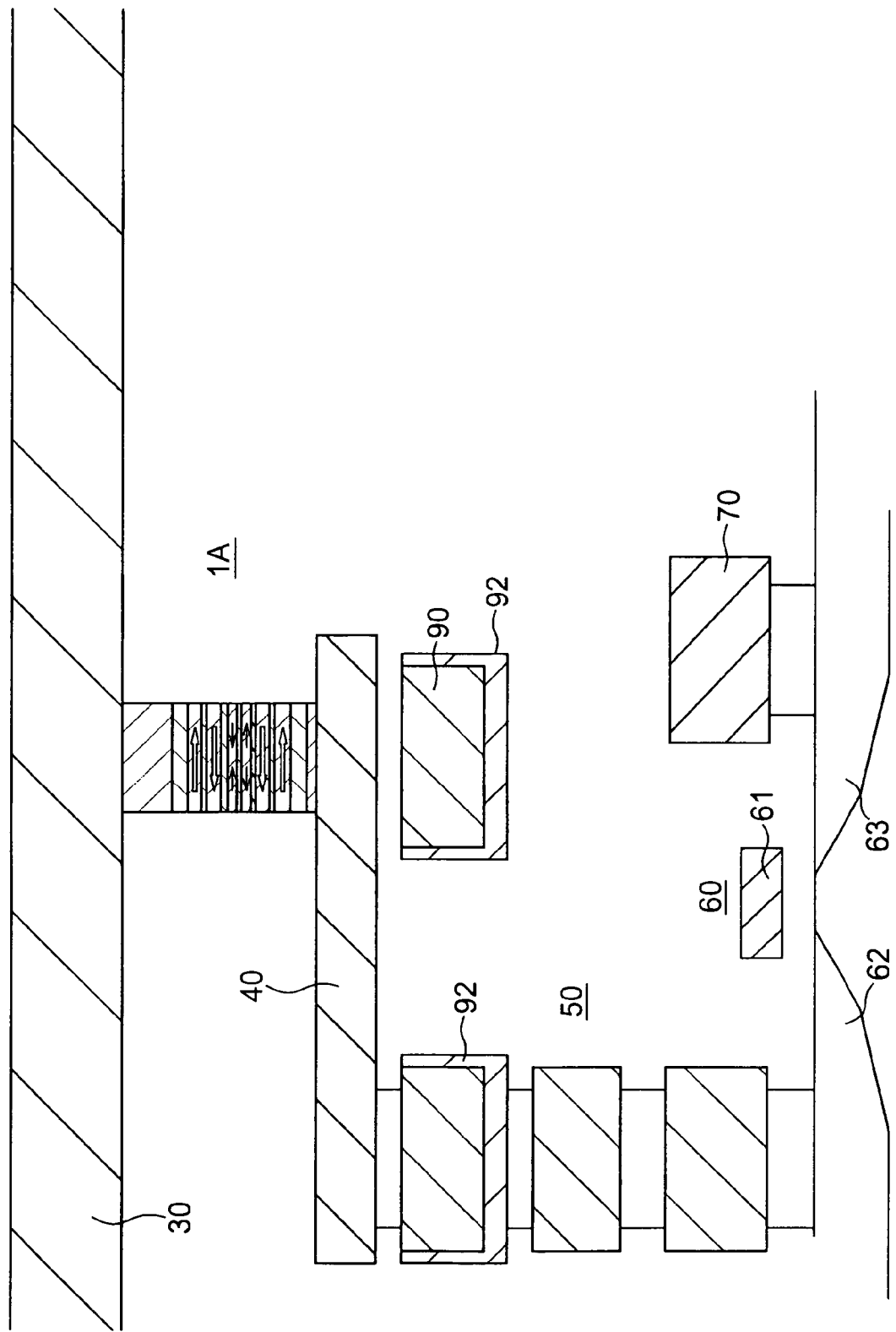
FIG. 53 is a sectional view showing a memory cell included in a magnetic memory according to a fourth example of the present invention.

As a fourth example of the present invention, a magnetic memory including a memory cell shown in FIG. 53 is fabricated. The memory cell in the magnetic memory according to the present example has architecture obtained by providing wiring 90 having a yoke 92 under the bit line 40, which is disposed right under the magnetoresistive effect element 1A, in the magnetic memory according to the sixth embodiment shown in FIG. 31 to make possible assistance using a current magnetic field generated by the wiring 90 having the yoke 92. Since the non-magnetic metal layer 12 in the magnetoresistive effect element 1A uses Cu in the present example, the spin moment directions of the magnetic layers respectively included in the first magnetization pinned layer and the second magnetization pinned layer and located near the magnetic recording layer are substantially parallel to each other in the same way as the case shown in FIG. 31. The application direction of the current magnetic field is the easy direction of magnetization, and the current magnetic field is assisted in a direction in which the spin is desired to be inverted. The fine processing method of the TMR element is basically the same as the method in the first example.

As a substrate, a substrate having a transistor is used. In the present example, Ru is used as the underlying layer, Ru is used as the cap layer, and Ta is used as the metal protection film 18. A TMR film of the TMR element includes layers of the same materials as those of the TMR film in the first example except a material of the non-magnetic layer $10_2$ in the magnetic recording layer 10. The antiferromagnetic layer 4 formed of Ir—Mn (10 nm), the first magnetization pinned layer 6 formed of $Co_{90}Fe_{10}$ (3 nm)/Ru (0.85 nm)/ $Co_{90}Fe_{10}$ (4 nm), the tunnel barrier layer 8 formed of AlOx (1.4 nm), the magnetic recording layer 10 formed of $Co_{90}Fe_{10}$ (4 nm)/Ir (0.75 nm)/$Co_{90}Fe_{10}$ (3 nm), the non-magnetic metal layer 12 formed of Cu (6 nm), the second magnetization pinned layer 14 formed of $Co_{90}Fe_{10}$ (4 nm)/ Ru (0.85 nm)/$Co_{90}Fe_{10}$ (3 nm), and the antiferromagnetic layer 16 formed of Ir—Mn (10 nm) are formed in order from the bottom. The TMR element has a junction area of 0.1×0.18 µm². After the processing, a magnetic field is applied to the long axis direction of the magnetic layer in the magnetization pinned layer in order to conduct annealing in the magnetic field.

Figure 54:
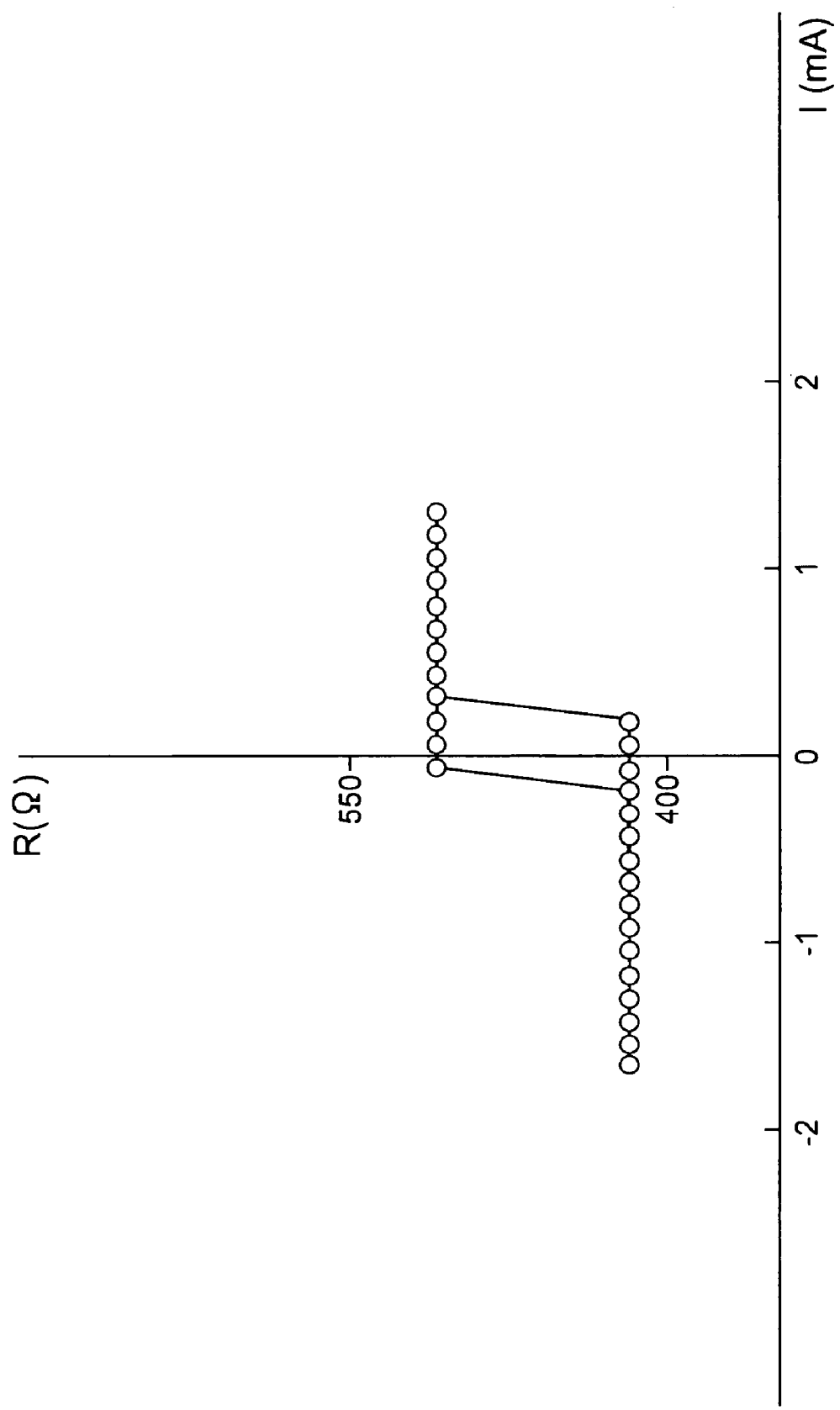
FIG. 54 is a diagram showing write characteristics of a fourth example.

A current pulse of 0.5 mA is let flow through wiring 90 having a yoke 92 to assist a current magnetic field and let flow a spin injection current. And a current (mA) at which the spin is inverted is checked. As a result, the spin is inverted at 0.34 mA as shown in FIG. 54. As a result, the superiority of the structure of the magnetic memory according to the present example as a large capacity memory can be ascertained.

FIFTH EXAMPLE

As a fifth example of the present invention, the magnetoresistive effect elements according to the second modifications of the third and fourth embodiments shown in FIGS. 13 and 20 are fabricated. The fabricated magnetoresistive effect element according to the second modification of the third embodiment is referred to as first sample. And the fabricated magnetoresistive effect element according to the second modification of the fourth embodiment is referred to as second sample. As first and second comparative samples, magnetoresistive effect elements having a non-magnetic metal layer 12 which is not divided by the dielectric 11 in the structures respectively shown in FIG. 13 and FIG. 20, i.e., magnetoresistive effect elements having a non-magnetic metal layer 12 which is not provided with the dielectric 11 are also fabricated at the same time. These samples are compared in terms of the spin inversion current.

The magnetoresistive effect elements respectively according to the first and second samples and the first and second comparative samples are fabricated as described hereafter.

As for the first sample, a TMR film, i.e., a laminated film including an underlying layer 2/an antiferromagnetic layer 4/a magnetic layer $6_1$/a non-magnetic layer $6_2$/a magnetic layer $6_3$/a tunnel barrier layer 8/a magnetic layer $10_1$/a non-magnetic layer $10_2$/a magnetic layer $10_3$/a non-magnetic metal layer 12 divided by a dielectric 11/a magnetic layer $14_1$/a non-magnetic layer $14_2$/a magnetic layer $14_3$/an antiferromagnetic layer 16/a cap layer formed of Ru (not illustrated)/a metal protection film 18 is formed on a lower electrode (not illustrated) as shown in FIG. 13.

As for the second sample, a TMR film, i.e., a laminated film including an underlying layer 2/an antiferromagnetic layer 4/a magnetic layer 6/a tunnel barrier layer 8/a magnetic layer $10_1$/a non-magnetic layer $10_2$/a magnetic layer $10_3$/a non-magnetic metal layer 12 divided by a dielectric 11/a magnetic layer $15_1$/a non-magnetic layer $15_2$/a magnetic layer $15_3$/an antiferromagnetic layer 16/a cap layer formed of Ru (not illustrated)/a metal protection film 18 is formed on a lower electrode (not illustrated) as shown in FIG. 20.

As for the first comparative sample, a TMR film, i.e., a laminated film including an underlying layer 2/an antiferromagnetic layer 4/a magnetic layer $6_1$/a non-magnetic layer $6_2$/a magnetic layer $6_3$/a tunnel barrier layer 8/a magnetic layer $10_1$/a non-magnetic layer $10_2$/a magnetic layer $10_3$/a non-magnetic metal layer 12/a magnetic layer $14_1$/a non-magnetic layer $14_2$/a magnetic layer $14_3$/an antiferromagnetic layer 16/a cap layer formed of Ru (not illustrated)/a metal protection film 18 in order is formed on a lower electrode (not illustrated).

As for the second comparative sample, a TMR film, i.e., a laminated film including an underlying layer 2/an antiferromagnetic layer 4/a magnetic layer 6/a tunnel barrier layer 8/a magnetic layer $10_1$/a non-magnetic layer $10_2$/a magnetic layer $10_3$/a non-magnetic metal layer 12/a magnetic layer $15_1$/a non-magnetic layer $15_2$/a magnetic layer $15_3$/an antiferromagnetic layer 16/a cap layer formed of Ru (not illustrated)/a metal protection film 18 in order is formed.

In the present example, the whole lower wiring is formed of Ta/Cu/Ta and the whole underlying layer is formed of Ru. In the TMR film of the first sample, the antiferromagnetic layer 4 formed of PtMn (14 nm), the first magnetization pinned layer 6 formed of $Co_{70}Fe_{30}$ (3 nm)/Ru (0.85 nm)/ $Co_{70}Fe_{30}$ (4 nm), the tunnel barrier layer 8 formed of AlOx (1.4 nm), the magnetic recording layer 10 formed of $(Co_{90}Fe_{10})_{80}B_{20}$ (3 nm)/Ru (0.95 nm)/$(Co_{90}Fe_{10})_{80}B_{20}$ (3 nm), the dielectric layer 11 formed of AlOx (0.7 nm), the non-magnetic metal layer 12 formed of Cu (5 nm), the second magnetization pinned layer 14 formed of $Co_{90}Fe_{10}$ (4 nm)/Ru (0.85 nm)/$Co_{90}Fe_{10}$ (3 nm), and the antiferromagnetic layer 16 formed of PtMn (14 nm) are formed in order from the bottom.

In the TMR film of the second sample, the antiferromagnetic layer 4 formed of PtMn (14 nm), the first magnetization pinned layer 6 formed of $Co_{90}Fe_{10}$ (3 nm), the tunnel barrier layer 8 formed of AlOx (1.4 nm), the magnetic recording layer 10 formed of $(Co_{90}Fe_{10})_{80}B_{20}$ (3 nm)/Rh (0.8 nm)/$(Co_{90}Fe_{10})_{80}B_{20}$ (3 nm), the dielectric layer 11 formed of AlOx (0.7 nm), the non-magnetic metal layer 12 formed of Ru (5 nm), the second magnetization pinned layer 15 formed of $Co_{90}Fe_{10}$ (4 nm)/Ru (0.85 nm)/$Co_{90}Fe_{10}$ (3 nm), and the antiferromagnetic layer 16 formed of PtMn (14 nm) are formed in order from the bottom.

The dielectric 11 formed of AlOx (0.7 nm) is fabricated by forming a film of Al in an island form and then conducting natural oxidation in si-tu. The tunnel barrier layer 8 formed of AlOx (1.4 nm) is fabricated by forming a film of Al (0.7 nm) and conducting natural oxidation, and then forming a film of Al (0.7 nm) and conducting natural oxidation again.

In the TMR film of the first comparative sample, the antiferromagnetic layer 4 formed of PtMn (14 nm), the first magnetization pinned layer 6 formed of $Co_{90}Fe_{10}$ (3 nm)/Ru (0.85 nm)/$Co_{90}Fe_{10}$ (4 nm), the tunnel barrier layer 8 formed of AlOx (1.4 nm), the magnetic recording layer 10 formed of $(Co_{90}Fe_{10})_{80}B_{20}$ (3 nm)/Ru (0.95 nm)/$(Co_{90}Fe_{10})_{80}B_{20}$ (3 nm), the non-magnetic metal layer 12 formed of Cu (5 nm), the second magnetization pinned layer 14 formed of $Co_{90}Fe_{10}$ (4 nm)/Ru (0.85 nm)/$Co_{90}Fe_{10}$ (3 nm), and the antiferromagnetic layer 16 formed of PtMn (14 nm) are formed in order from the bottom.

In the TMR film of the second comparative sample, the antiferromagnetic layer 4 formed of PtMn (14 nm), the first magnetization pinned layer 6 formed of $Co_{90}Fe_{10}$ (3 nm), the tunnel barrier layer 8 formed of AlOx (1.4 nm), the magnetic recording layer 10 formed of $(Co_{90}Fe_{10})_{80}B_{20}$ (3 nm)/Rh (0.8 nm)/$(Co_{90}Fe_{10})_{80}B_{20}$ (3 nm), the non-magnetic metal layer 12 formed of Ru (5 nm), the second magnetization pinned layer 15 formed of $Co_{90}Fe_{10}$ (4 nm)/Ru (0.85 nm)/ $Co_{90}Fe_{10}$ (3 nm), and the antiferromagnetic layer 16 formed of PtMn (14 nm) are formed in order from the bottom.

In all samples, a cap layer formed of Ru (5 nm) and a metal protection film formed of Ta (300 nm) are formed.

Thereafter, the TMR elements of the first and second examples and the first and second comparative samples are annealed in a magnetic field at 270° C. Then the TMR elements are coated with a resist, and etching is conducted. Then the resist is subjected to slimming using an ozone flow at 140° C. The metal protection film formed of Ta is etched using the slimmed resist as a mask and using $SF_6$ gas according to the RIE method. This etching is stopped by the cap layer formed of Ru. Thereafter, the resist is peeled off. Junction separation of the ferromagnetic tunnel junction is conducted by conducting patterning using the metal protection film formed of Ta as a hard mask and using milling or the RIE (Reactive Ion Etching) method as far as the tunnel barrier layer.

All of the first and second samples and the first and second comparative samples have a junction size of $0.1 \times 0.18 \ \mu m^2$. Thereafter, an SiOx protection film is formed, and coated with a resist. The resist is patterned to form a resist pattern.

The lower electrode is patterned using this resist pattern as a mask and using the RIE method. Thereafter, the resist pattern is removed, and an interlayer insulation film formed of SiOx is formed. Then, etching back and planarization are conducted. In addition, the surface of the metal protection film formed of Ta in the upper part of the TMR film is exposed. Then, sputter etching is conducted, and wiring is sputtered. The upper wiring is formed by conducting etch back using the RIE method. Thereafter, a magnetic field is applied to the long axis direction of the magnetic layer in order to conduct annealing in the magnetic field.

Figure 55:
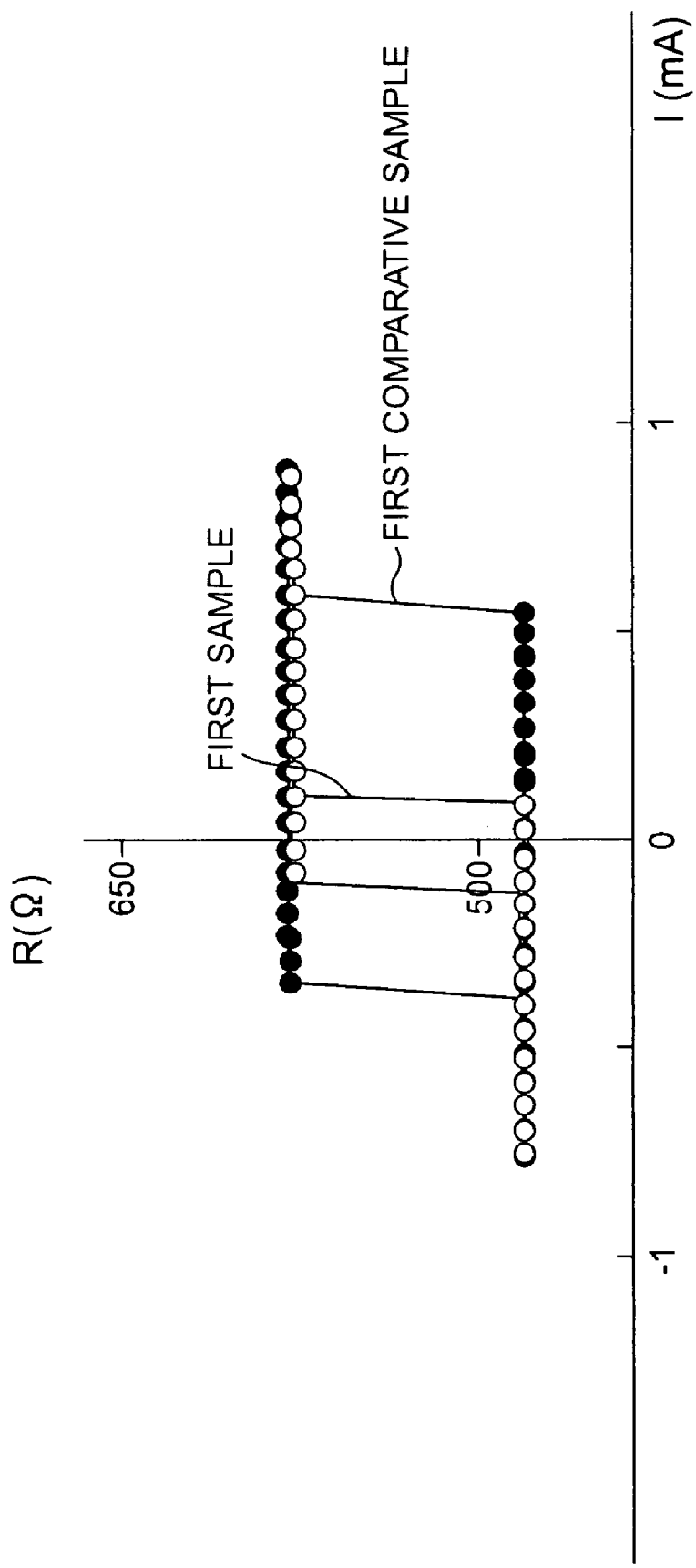
FIG. 55 is a diagram showing write characteristics of a first sample and a first comparative sample of a magnetoresistive effect element according to a fifth example of the present invention.
Figure 56:
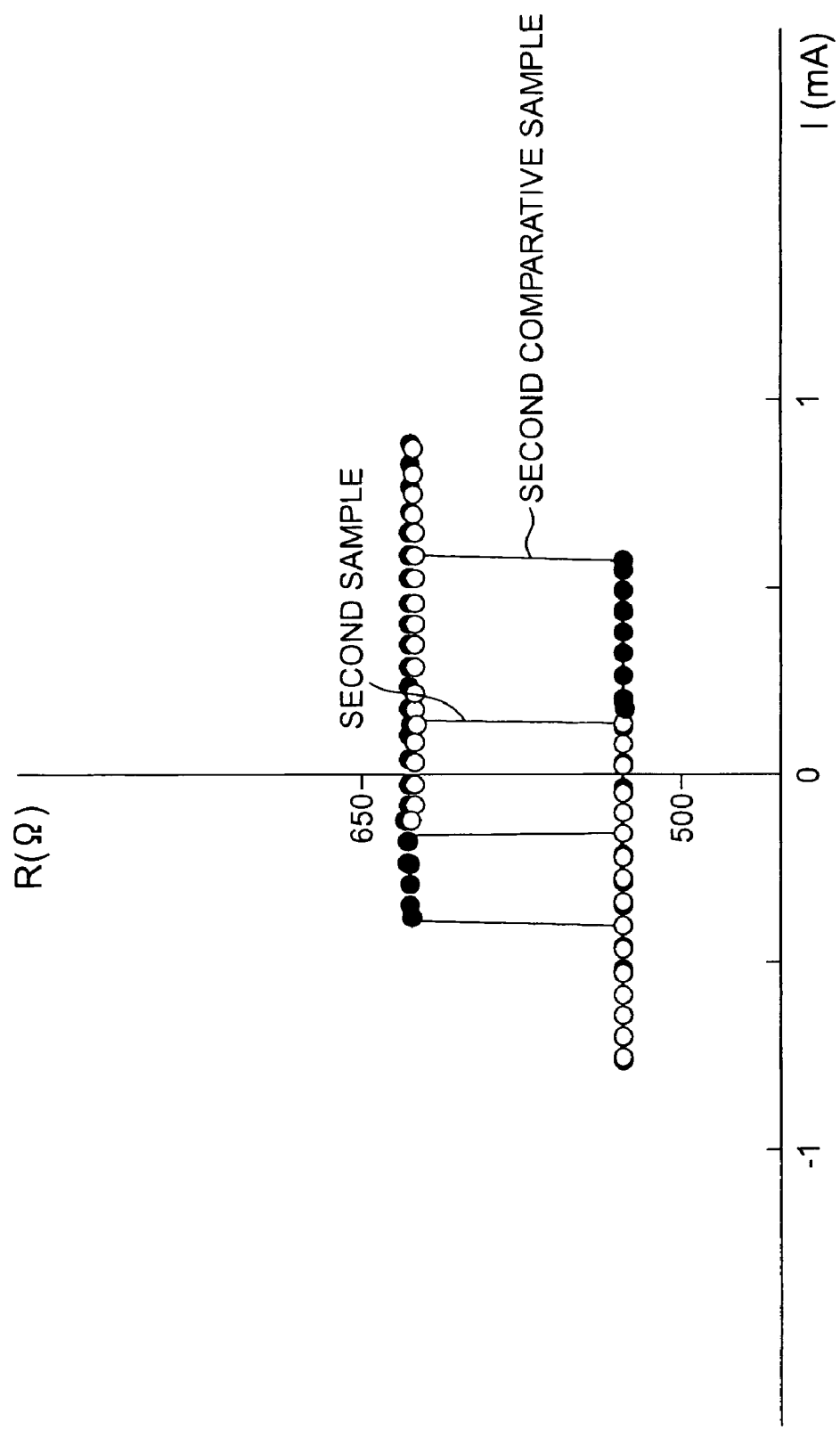
FIG. 56 is a diagram showing write characteristics of a second sample and a second comparative sample of a magnetoresistive effect element according to a fifth example of the present invention.

A pulse current having a pulse width of 200 nm is applied to the first sample, the first comparative sample, the second sample, and the second comparative sample, and a current (mA) at which the spin is inverted is checked. As shown in FIG. 55, the spin is inverted at 0.1 mA in the first sample, and at 0.5 mA in the first comparative sample. As shown in FIG. 56, the spin is inverted at 0.12 mA in the second sample, and at 0.53 mA in the second comparative sample. Therefore, it is appreciated that the structure of the magnetoresistive effect element according to the present example is suitable as a large capacity memory and spin injection writing can be conducted at a low current.

SIXTH EXAMPLE

As a sixth example of the present invention, the magnetoresistive effect elements according to the first modification of the third embodiment and the fourth embodiment shown in FIG. 12 and FIG. 18 are fabricated. The fabricated magnetoresistive effect element according to the first modification of the third embodiment is referred to as third sample. And the fabricated magnetoresistive effect element according to the fourth embodiment is referred to as fourth sample. As third and fourth comparative samples, magnetoresistive effect elements having a non-magnetic metal layer 12 which is not divided by the dielectric 11 in the structures respectively shown in FIG. 12 and FIG. 18, i.e., magnetoresistive effect elements having a non-magnetic metal layer 12 which is not provided with the dielectric 11 are also fabricated at the same time. These samples are compared in terms of the spin inversion current. The magnetoresistive effect elements respectively according to the third and fourth samples and the third and fourth comparative samples are fabricated as described hereafter.

As for the third sample, a TMR film, i.e., a laminated film including an underlying layer 2/an antiferromagnetic layer 4/a magnetic layer $6_1$/a non-magnetic layer $6_2$/a magnetic layer $6_3$/a tunnel barrier layer 8/a magnetic layer $10_1$/a non-magnetic layer $10_2$/a magnetic layer $10_3$/a non-magnetic metal layer 12 divided by a dielectric 11/a magnetic layer $14_1$/a non-magnetic layer $14_2$/a magnetic layer $14_3$/an antiferromagnetic layer 16/a cap layer formed of Ru (not illustrated)/a metal protection film 18 is formed on a lower electrode (not illustrated) as shown in FIG. 12.

As for the fourth sample, a TMR film, i.e., a laminated film including an underlying layer 2/an antiferromagnetic layer 4/a magnetic layer 6/a tunnel barrier layer 8/a magnetic layer $10_1$/a non-magnetic layer $10_2$/a magnetic layer $10_3$/a non-magnetic metal layer 12 divided by a dielectric 11/a magnetic layer $15_1$/a non-magnetic layer $15_2$/a magnetic layer $15_3$/an antiferromagnetic layer 16/a cap layer formed of Ru (not illustrated)/a metal protection film 18 is formed on a lower electrode (not illustrated) as shown in FIG. 18.

As the third comparative sample, a TMR film, i.e., a laminated film including an underlying layer 2/an antiferromagnetic layer 4/a magnetic layer $6_1$/a non-magnetic layer $6_2$/a magnetic layer $6_3$/a tunnel barrier layer 8/a magnetic layer $10_1$/a non-magnetic layer $10_2$/a magnetic layer $10_3$/a non-magnetic metal layer 12/a magnetic layer $14_1$/a non-magnetic layer $14_2$/a magnetic layer $14_3$/an antiferromagnetic layer 16/a cap layer formed of Ru (not illustrated)/a metal protection film 18 in order is formed on a lower electrode (not illustrated).

As the fourth comparative sample, a TMR film, i.e., a laminated film including an underlying layer 2/an antiferromagnetic layer 4/a magnetic layer 6/a tunnel barrier layer 8/a magnetic layer $10_1$/a non-magnetic layer $10_2$/a magnetic layer $10_3$/a non-magnetic metal layer 12/a magnetic layer $15_1$/a non-magnetic layer $15_2$/a magnetic layer $15_3$/an antiferromagnetic layer 16/a cap layer formed of Ru (not illustrated)/a metal protection film 18 in order is formed.

In the present example and the comparative example, the whole lower wiring is formed of Ta/Cu/Ta and the whole underlying layer is formed of Ru. In the TMR film of the third sample, the antiferromagnetic layer 4 formed of PtMn (14 nm), the first magnetization pinned layer 6 formed of $CO_{70}Fe_{30}$ (3 nm)/Ru (0.85 nm)/$Co_{70}Fe_{30}$ (4 nm), the tunnel barrier layer 8 formed of MgO (1.0 nm), the magnetic recording layer 10 formed of $(CO_{70}Fe_{30})_{80}B_{20}$ (3 nm)/Ru (0.95 nm)/$(CO_{70}Fe_{30})_{80}B_{20}$ (3 nm), the dielectric layer 11 formed of AlOx (0.7 nm), the non-magnetic metal layer 12 formed of Au (5 nm), the second magnetization pinned layer 14 formed of $CO_{70}Fe_{30}$ (4 nm)/Ru (0.85 nm)/$CO_{70}Fe_{30}$ (3 nm), and the antiferromagnetic layer 16 formed of PtMn (14 nm) are formed in order from the bottom.

In the TMR film of the fourth sample, the antiferromagnetic layer 4 formed of PtMn (14 nm), the first magnetization pinned layer 6 formed of $CO_{70}Fe_{30}$ (3 nm), the tunnel barrier layer 8 formed of MgO (1.0 nm), the magnetic recording layer 10 formed of $(CO_{70}Fe_{30})_{80}B_{20}$ (3 nm)/Rh (0.8 nm)/$(CO_{70}Fe_{30})_{80}B_{20}$ (3 nm), the dielectric layer 11 formed of AlOx (0.7 nm), the non-magnetic metal layer 12 formed of Ru (5 nm), the second magnetization pinned layer 15 formed of $CO_{70}Fe_{30}$ (4 nm)/Ru (0.85 nm)/$CO_{70}Fe_{30}$ (3 nm), and the antiferromagnetic layer 16 formed of PtMn (14 nm) are formed in order from the bottom.

The dielectric formed of AlOx (0.7 nm) is fabricated by using a patterned self-aligned process.

Hereafter, the patterned self-aligned process will be described briefly.

In the TMR film of the third sample, the antiferromagnetic layer 4 formed of PtMn (14 nm), the first magnetization pinned layer 6 formed of $CO_{70}Fe_{30}$ (3 nm)/Ru (0.85 nm)/$CO_{70}Fe_{30}$ (4 nm), the tunnel barrier layer 8 formed of MgO (1.0 nm), the magnetic recording layer 10 formed of $(CO_{70}Fe_{30})_{80}B_{20}$ (3 nm)/Ru (0.95 nm)/$(CO_{70}Fe_{30})_{80}B_{20}$ (3 nm), and the non-magnetic metal layer 12 formed of Au (5 nm) are formed in order from the bottom.

In the TMR film of the fourth sample, the antiferromagnetic layer 4 formed of PtMn (14 nm), the first magnetization pinned layer 6 formed of $CO_{70}Fe_{30}$ (3 nm), the tunnel barrier layer 8 formed of MgO (1.0 nm), the magnetic recording layer 10 formed of $(CO_{70}Fe_{30})_{80}B_{20}$ (3 nm)/Rh (0.8 nm)/$(CO_{70}Fe_{30})_{80}B_{20}$ (3 nm), and the non-magnetic metal layer 12 formed of Ru (5 nm) are formed in order from the bottom.

Thereafter, diblock copolymer dissolved in an organic solvent is formed using the spin coat method. Subsequently, annealing is conducted in vacuum at a temperature in the range of approximately 140 to 200° C. for hours as long as approximately 30 hours. Thereupon, phase separation is caused in diblock copolymer by self-organization during annealing. Sea-island structures each including a diblock polymer portion having a size in the range of 15 to 30 nm are aligned at intervals of several tens nm.

Thereafter, the sample is exposed to oxygen plasma, and only the diblock polymer portions are removed selectively. Holes are opened in portions with the diblock polymer portions removed. Subsequently, the sample is coated with SOG (spin on glass) diluted in lactic acid by using the spin coat method. SOG is embedded in the holes. The non-magnetic metal layer Ru or Au is patterned using an etching mask formed of SOG and ion milling.

In the pattern forming method using this self-organization phenomenon, a pattern having a large area can be formed inexpensively in a short time as compared with ordinary pattern forming methods such as the EB (Electron Beam) drawing, photolithography, X-ray lithography, near-field optical lithography, interference exposure method, and FIB (Focused Ion Beam). The sea-island structures have a diameter in the range of approximately 15 nm to 80 nm. A size conforming to the above-described condition can be implemented.

Subsequently, immediately after the etching mask is removed, a protection film formed of AlOx or SiOx is formed.

Subsequently, a film of $Al_2O_3$ is formed. The whole surface of the $Al_2O_3$ film is coated with an OFR resist, and etch back is conducted to expose the surface of the non-magnetic metal layer.

Subsequently, in the TMR film of the third sample, the second magnetization pinned layer 14 formed of $CO_{70}Fe_{30}$ (4 nm)/Ru (0.85 nm)/$CO_{70}Fe_{30}$ (3 nm) and the antiferromagnetic layer 16 formed of PtMn (14 nm) are formed. In the TMR film of the fourth sample, the second magnetization pinned layer 15 formed of $CO_{70}Fe_{30}$ (4 nm)/Ru (0.85 nm)/$CO_{70}Fe_{30}$ (3 nm) and the antiferromagnetic layer 16 formed of PtMn (14 nm) are formed. In all samples, the cap layer formed of Ru (5 nm) and the metal protection film formed of Ta (300 nm) are formed. A subsequent processing method is the same as that in the first example. As a result, the magnetoresistive effect elements according to the present example are manufactured.

All of the third and fourth examples and the third and fourth comparative samples have a junction size of 0.1×0.18 $\mu m^2$. After the fabrication, a magnetic field is applied to the long axis direction of the magnetic layer at 350° C. in order to conduct annealing in the magnetic field.

A pulse current having a pulse width of 200 nm is applied to the third sample, the third comparative sample, the fourth sample, and the fourth comparative sample, and a current (mA) at which the spin is inverted is checked. As a result, the spin is inverted at 0.06 mA in the third sample, at 0.22 mA in the third comparative sample, at 0.055 mA in the fourth sample, and at 0.26 mA in the fourth comparative sample. Therefore, it is appreciated that the structure of the present example is suitable as a large capacity memory and spin injection writing can be conducted at a low current. As a result of repetitive measurements, spin injection writing up to the number of times of writing of $10^6$ can be ascertained, and the reliability of the present structure can be ascertained.

SEVENTH EXAMPLE

As a seventh example of the present invention, magnetoresistive effect elements respectively according to the fifth modification of the third embodiment shown in FIG. 16 and the sixth modification of the fourth embodiment are fabricated. The magnetoresistive fabricated according to the fifth modification of the third embodiment is referred to as fifth sample. The magnetoresistive fabricated according to the sixth modification of the fourth embodiment is referred to as sixth sample. Furthermore, as fifth and sixth comparative samples, magnetoresistive effect elements each having a non-magnetic metal layer which is not divided by the dielectric 11, i.e., in which the dielectric 11 is not provided in the structures shown in FIG. 16 and FIG. 24 are fabricated at the same time, and they are compared with each other in terms of spin inversion current. The structure of the non-magnetic metal layer 12 divided by the dielectric 11 is observed using a sectional TEM (Transmission Electron Microscope). As a result, it is found that the non-magnetic metal layer 12 is left as a continuous film by approximately 1 nm on the free layer 10 of the synthetic antiferromagnetic coupling as shown in FIG. 16 and FIG. 24.

Magnetoresistive effect elements in the fifth and sixth samples and the fifth and sixth comparative samples are fabricated in the same way as the sixth example.

As for the fifth sample, a TMR film, i.e., a laminated film including an underlying layer 2/an antiferromagnetic layer 4/a magnetic layer $6_1$/a non-magnetic layer $6_2$/a magnetic layer $6_3$/a tunnel barrier layer 8/a magnetic layer $10_1$/a non-magnetic layer $10_2$/a magnetic layer $10_3$/a non-magnetic metal layer 12 having a thickness of approximately 1 nm/a non-magnetic metal layer 12 divided by a dielectric 11/a magnetic layer $14_1$/a non-magnetic layer $14_2$/a magnetic layer $14_3$/an antiferromagnetic layer 16/a cap layer formed of Ru (not illustrated)/a metal protection film 18 is formed on a lower electrode (not illustrated) as shown in FIG. 16.

As for the sixth sample, a TMR film, i.e., a laminated film including an underlying layer 2/an antiferromagnetic layer 4/a magnetic layer 6/a tunnel barrier layer 8/a magnetic layer $10_1$/a non-magnetic layer $10_2$/a magnetic layer $10_3$/a non-magnetic metal layer 12 having a thickness of approximately 1 nm/a non-magnetic metal layer 12 divided by a dielectric 11/a magnetic layer $15_1$/a non-magnetic layer $15_2$/a magnetic layer $15_3$/an antiferromagnetic layer 16/a cap layer formed of Ru (not illustrated)/a metal protection film 18 is formed on a lower electrode (not illustrated) as shown in FIG. 24.

The fifth and sixth comparative samples have structures similar to those of the third and fourth comparative samples in the sixth example.

In the present example, the whole lower wiring is formed of Ta/Cu/Ta and the whole underlying layer is formed of Ru. In the TMR film of the fifth sample, the antiferromagnetic layer 4 formed of PtMn (14 nm), the first magnetization pinned layer 6 formed of $CO_{70}Fe_{30}$ (3 nm)/Ru (0.85 nm)/$CO_{70}Fe_{30}$ (4 nm), the tunnel barrier layer 8 formed of MgO (1.0 nm), the magnetic recording layer 10 formed of $(CO_{70}Fe_{30})_{80}B_{20}$ (3 nm)/Ru (0.95 nm)/$(CO_{70}Fe_{30})_{80}B_{20}$ (3 nm), the non-magnetic metal layer 12 formed of Au (1 nm), the non-magnetic metal layer 12 formed of the dielectric 11 having AlOx (0.7 nm) and formed of Au (4 nm), the second magnetization pinned layer 14 formed of $CO_{70}Fe_{30}$ (4 nm)/Ru (0.85 nm)/$CO_{70}Fe_{30}$ (3 nm), and the antiferromagnetic layer 16 formed of PtMn (14 nm) are formed in order from the bottom.

In the TMR film of the sixth sample, the antiferromagnetic layer 4 formed of PtMn (14 nm), the first magnetization pinned layer 6 formed of $CO_{70}Fe_{30}$ (3 nm), the tunnel barrier layer 8 formed of MgO (1.0 nm), the magnetic recording layer 10 formed of $(CO_{70}Fe_{30})_{80}B_{20}$ (3 nm)/Rh (0.8 nm)/$(CO_{70}Fe_{30})_{80}B_{20}$ (3 nm), the non-magnetic metal layer formed of Ru (1 nm), the non-magnetic metal layer 12 formed of the dielectric 11 having AlOx (0.7 nm) and formed of Ru (4 nm), the second magnetization pinned layer 15 formed of $CO_{70}Fe_{30}$ (4 nm)/Ru (0.85 nm)/$CO_{70}Fe_{30}$ (3 nm), and the antiferromagnetic layer 16 formed of PtMn (14 nm) are formed in order from the bottom. The dielectric layer formed of AlOx (0.7 nm) is fabricated by using a patterned self-aligned process.

All of the fifth and sixth samples and the fifth and sixth comparative samples have a junction size of 0.1×0.18 µm². Thereafter, a magnetic field is applied to the long axis direction of the magnetic layer at 350° C. in order to conduct annealing in the magnetic field.

A pulse current having a pulse width of 200 nm is applied to the fifth sample, the fifth comparative sample, the sixth sample, and the sixth comparative sample, and a current (mA) at which the spin is inverted is checked. As a result, the spin is inverted at 0.061 mA in the fifth sample, at 0.22 mA in the fifth comparative sample, at 0.057 mA in the sixth sample, and at 0.26 mA in the sixth comparative sample. Therefore, it is appreciated that the structure of the present example is suitable as a large capacity memory and spin injection writing can be conducted at a low current. As a result of repetitive measurements, spin injection writing up to the number of times of writing of $10^6$ can be ascertained, and the reliability of the present structure can be ascertained. It is found from the present example that the inverted current reducing effect is obtained even if the non-magnetic metal layer 12 having a thickness of approximately 1 nm is present between an upper part of the magnetic recording layer 10 and the dielectric 11.

According to the embodiments of the present invention, it is possible to provide a highly reliable magnetoresistive effect element that operates with low power consumption and low current writing and without element destruction as heretofore described.

Heretofore, embodiments of the present invention have been described with reference to concrete examples. However, the present invention is not limited to these concrete examples. For example, concrete materials of the ferromagnetic material layer, insulation film, antiferromagnetic material layer, non-magnetic metal layer and electrode included in the magnetoresistive effect element, and the layer thickness, shape and dimension that can be suitably selected by those skilled in the art to execute the present invention and obtain similar effects are also incorporated in the scope of the present invention.

In the same way, the structure, material quality, shape and dimension of elements included in the magnetic memory of the present invention that can be suitably selected by those skilled in the art to execute the present invention in the same way and obtain similar effects are also incorporated in the scope of the present invention.

All magnetic memories that can be suitably changed in design and executed by those skilled in the art on the basis of the magnetic memories described above as embodiments of the present invention also belong to the scope of the present invention in the same way.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetoresistive effect element comprising:
    a magnetization free layer which comprises at least two magnetic layers subject to antiferromagnetic coupling and a non-magnetic layer provided between the magnetic layers and of which a magnetization direction is changeable, the non-magnetic layer comprising Ru, Rh, Ir or an alloy of them;
    a tunnel barrier layer provided on one surface of the magnetization free layer;
    a first magnetization pinned layer which is provided on an opposite surface of the tunnel barrier layer from the magnetization free layer and of which a magnetization direction is pinned;
    a non-magnetic metal layer provided on an opposite surface of the magnetization free layer from the tunnel barrier layer, the non-magnetic metal layer comprising Cu, Ag, Au, or an alloy of them; and
    a second magnetization pinned layer which is provided on an opposite surface of the non-magnetic metal layer from the magnetization free layer and of which a magnetization direction is pinned, the first and second magnetization pinned layers being substantially the same in magnetization direction.

2. The magnetoresistive effect element according to claim 1, wherein interlayer coupling energy $J_{EX}$ between the magnetic layers in the magnetization free layer is greater than 0.5 erg/cm².

3. The magnetoresistive effect element according to claim 1, further comprising a dielectric layer provided on a first region in an opposite surface of the magnetization free layer from the tunnel barrier layer, and wherein
    the non-magnetic metal layer is provided on a second region other than the first region in the opposite surface of the magnetization free layer from the tunnel barrier layer, and
    the second magnetization pinned layer is provided so as to cover opposite surfaces respectively of the non-magnetic metal layer and the dielectric layer from the magnetization free layer.

4. The magnetoresistive effect element according to claim 3, wherein an interface between the dielectric layer and the second magnetization pinned layer and an interface between the non-magnetic metal layer and the second magnetization pinned layer are substantially coplanar.

5. The magnetoresistive effect element according to claim 3, wherein an interface between the dielectric layer and the second magnetization pinned layer is located farther from an interface between the tunnel barrier layer and the magnetization free layer than an interface between the non-magnetic metal layer and the second magnetization pinned layer.

6. The magnetoresistive effect element according to claim 3, wherein an interface between the dielectric layer and the magnetization free layer is located nearer an interface between the tunnel barrier layer and the magnetization free layer than an interface between the non-magnetic metal layer and the magnetization free layer.

7. The magnetoresistive effect element according to claim 1, further comprising a dielectric layer provided on a first region in an opposite surface of the non-magnetic metal layer from the magnetization free layer, and wherein
    the second magnetization pinned layer is provided so as to cover a second region other than the first region in the opposite surface of the non-magnetic metal layer from the magnetization free layer and an opposite surface of the dielectric layer from the non-magnetic metal layer.

8. The magnetoresistive effect element according to claim 7, wherein an interface between the dielectric layer and the second magnetization pinned layer and an interface between the non-magnetic metal layer and the second magnetization pinned layer are substantially coplanar.

9. The magnetoresistive effect element according to claim 1, further comprising a dielectric layer provided on a first region in the opposite surface of the magnetization free layer from the tunnel barrier layer, and wherein the non-magnetic metal layer is provided on a second region other than the first region in the opposite surface of the magnetization free layer from the tunnel barrier layer so as to cover an opposite surface of the dielectric layer from the magnetization free layer, and the second magnetization pinned layer is provided on the opposite surface of the non-magnetic metal layer from the magnetization free layer.

10. The magnetoresistive effect element according to claim 9, wherein an interface between the dielectric layer and the magnetization free layer and an interface between the non-magnetic metal layer and the magnetization free layer are substantially coplanar.

11. The magnetoresistive effect element according to claim 1, wherein at least one of the first and second magnetization pinned layers has a three-layer structure comprising a magnetic layer/a non-magnetic layer/a magnetic layer, or a five-layer structure comprising a magnetic layer/a non-magnetic layer/a magnetic layer/a non-magnetic layer/a magnetic layer.

12. The magnetoresistive effect element according to claim 1, further comprising an anti-ferromagnetic film being in contact with at least one of the first and second magnetization pinned layers.

13. A magnetoresistive effect element comprising:

a magnetization free layer which comprises at least two magnetic layers subject to antiferromagnetic coupling and a non-magnetic layer provided between the magnetic layers and of which a magnetization direction is changeable, the non-magnetic layer in the magnetization free layer comprising Ru, Rh or an alloy of them;

a tunnel barrier layer provided on one surface of the magnetization free layer;

a first magnetization pinned layer which is provided on an opposite surface of the tunnel barrier layer from the magnetization free layer and of which a magnetization direction is pinned;

a non-magnetic metal layer provided on an opposite surface of the magnetization free layer from the tunnel barrier layer, the non-magnetic metal layer comprising Ru, Rh or an alloy of them; and a second magnetization pinned layer which is provided on an opposite surface of the non-magnetic metal layer from the magnetization free layer and of which a magnetization direction is pinned, the first and second magnetization pinned layers being substantially opposite to each other in magnetization direction.

14. The magnetoresistive effect element according to claim 13, wherein interlayer coupling energy $J_{EX}$ between the magnetic layers in the magnetization free layer is greater than 0.5 erg/cm$^2$.

15. The magnetoresistive effect element according to claim 13, further comprising a dielectric layer provided on a first region in an opposite surface of the magnetization free layer from the tunnel barrier layer, and wherein the non-magnetic metal layer is provided on a second region other than the first region in the opposite surface of the magnetization free layer from the tunnel barrier layer, and the second magnetization pinned layer is provided so as to cover opposite surfaces respectively of the non-magnetic metal layer and the dielectric layer from the magnetization free layer.

16. The magnetoresistive effect element according to claim 15, wherein an interface between the dielectric layer and the second magnetization pinned layer and an interface between the non-magnetic metal layer and the second magnetization pinned layer are substantially coplanar.

17. The magnetoresistive effect element according to claim 15, wherein an interface between the dielectric layer and the second magnetization pinned layer is located farther from an interface between the tunnel barrier layer and the magnetization free layer than an interface between the non-magnetic metal layer and the second magnetization pinned layer.

18. The magnetoresistive effect element according to claim 15, wherein an interface between the dielectric layer and the magnetization free layer is located nearer an interface between the tunnel barrier layer and the magnetization free layer than an interface between the non-magnetic metal layer and the magnetization free layer.

19. The magnetoresistive effect element according to claim 13, further comprising a dielectric layer provided partially on a first region in an opposite surface of the non-magnetic metal layer from the magnetization free layer, and wherein the second magnetization pinned layer is provided so as to cover a second region other than the first region in the opposite surface of the non-magnetic metal layer from the magnetization free layer and an opposite surface of the dielectric layer from the non-magnetic metal layer.

20. The magnetoresistive effect element according to claim 19, wherein an interface between the dielectric layer and the second magnetization pinned layer and an interface between the non-magnetic metal layer and the second magnetization pinned layer are substantially coplanar.

21. The magnetoresistive effect element according to claim 13, further comprising a dielectric layer provided on a first region in the opposite surface of the magnetization free layer from the tunnel barrier layer, and wherein the non-magnetic metal layer is provided on a second region other than the first region in the opposite surface of the magnetization free layer from the tunnel barrier layer so as to cover an opposite surface of the dielectric layer from the magnetization free layer, and the second magnetization pinned layer is provided on the opposite surface of the non-magnetic metal layer from the magnetization free layer.

22. The magnetoresistive effect element according to claim 21, wherein an interface between the dielectric layer and the magnetization free layer and an interface between the non-magnetic metal layer and the magnetization free layer are substantially coplanar.

23. The magnetoresistive effect element according to claim 13, wherein at least one of the first and second magnetization pinned layers has a three-layer structure comprising a magnetic layer/a non-magnetic layer/a magnetic layer, or a five-layer structure comprising a magnetic layer/a non-magnetic layer/a magnetic layer/a non-magnetic layer/a magnetic layer.

24. The magnetoresistive effect element according to claim 13, further comprising an anti-ferromagnetic film being in contact with at least one of the first and second magnetization pinned layers.

25. A magnetoresistive effect element comprising:
a magnetization free layer which comprises at least two magnetic layers subject to antiferromagnetic coupling and a non-magnetic layer provided between the magnetic layers and of which a magnetization direction is changeable, interlayer coupling energy $J_{EX}$ between the magnetic layers being greater than 0.5 erg/cm$^2$;
a tunnel barrier layer provided on one surface of the magnetization free layer;
a first magnetization pinned layer which is provided on an opposite surface of the tunnel barrier layer from the magnetization free layer and of which a magnetization direction is pinned;
a non-magnetic metal layer provided on an opposite surface of the magnetization free layer from the tunnel barrier layer; and
a second magnetization pinned layer which is provided on an opposite surface of the non-magnetic metal layer from the magnetization free layer and of which a magnetization direction is pinned.

26. The magnetoresistive effect element according to claim 25, further comprising a dielectric layer provided on a first region in an opposite surface of the magnetization free layer from the tunnel barrier layer, and wherein
the non-magnetic metal layer is provided on a second region other than the first region in the opposite surface of the magnetization free layer from the tunnel barrier layer, and
the second magnetization pinned layer is provided so as to cover opposite surfaces respectively of the non-magnetic metal layer and the dielectric layer from the magnetization free layer.

27. The magnetoresistive effect element according to claim 26, wherein an interface between the dielectric layer and the second magnetization pinned layer and an interface between the non-magnetic metal layer and the second magnetization pinned layer are substantially coplanar.

28. The magnetoresistive effect element according to claim 26, wherein an interface between the dielectric layer and the second magnetization pinned layer is located farther from an interface between the tunnel barrier layer and the magnetization free layer than an interface between the non-magnetic metal layer and the second magnetization pinned layer.

29. The magnetoresistive effect element according to claim 26, wherein an interface between the dielectric layer and the magnetization free layer is located nearer an interface between the tunnel barrier layer and the magnetization free layer than an interface between the non-magnetic metal layer and the magnetization free layer.

30. The magnetoresistive effect element according to claim 25, further comprising a dielectric layer provided partially on a first region in an opposite surface of the non-magnetic metal layer from the magnetization free layer, and wherein
the second magnetization pinned layer is provided so as to cover a second region other than the first region in the opposite surface of the non-magnetic metal layer from the magnetization free layer and an opposite surface of the dielectric layer from the non-magnetic metal layer.

31. The magnetoresistive effect element according to claim 30, wherein an interface between the dielectric layer and the second magnetization pinned layer and an interface between the non-magnetic metal layer and the second magnetization pinned layer are substantially coplanar.

32. The magnetoresistive effect element according to claim 25, further comprising a dielectric layer provided on a first region in the opposite surface of the magnetization free layer from the tunnel barrier layer, and wherein
the non-magnetic metal layer is provided on a second region other than the first region in the opposite surface of the magnetization free layer from the tunnel barrier layer so as to cover an opposite surface of the dielectric layer from the magnetization free layer, and
the second magnetization pinned layer is provided on the opposite surface of the non-magnetic metal layer from the magnetization free layer.

33. The magnetoresistive effect element according to claim 32, wherein an interface between the dielectric layer and the magnetization free layer and an interface between the non-magnetic metal layer and the magnetization free layer are substantially coplanar.

34. The magnetoresistive effect element according to claim 25, wherein at least one of the first and second magnetization pinned layers has a three-layer structure comprising a magnetic layer/a non-magnetic layer/a magnetic layer, or a five-layer structure comprising a magnetic layer/a non-magnetic layer/a magnetic layer/a non-magnetic layer/a magnetic layer.

35. The magnetoresistive effect element according to claim 25, further comprising an anti-ferromagnetic film being in contact with at least one of the first and second magnetization pinned layers.

36. A magnetic memory comprising:
a memory cell comprising a magnetoresistive effect element according to claim 1;
a first wiring electrically connected to a first end of the magnetoresistive effect element; and
a second wiring electrically connected to a second end of the magnetoresistive effect element.

37. A magnetic memory comprising:
a memory cell comprising first and second magnetoresistive effect elements according to claim 1;
a first wiring electrically connected to first ends of the first and second magnetoresistive effect elements;
a second wiring electrically connected to a second end of the first magnetoresistive effect element; and
a third wiring electrically connected to a second end of the second magnetoresistive effect element,
wherein a layer arrangement of the first magnetoresistive effect element in a direction directed from the first wiring to the second wiring is opposite to a layer arrangement of the second magnetoresistive effect element in a direction directed from the first wiring to the third wiring.

38. The magnetic memory according to claim 37, comprising:
a first readout transistor having a first end connected to the second wiring;
a second readout transistor having a first end connected to the third wiring; and
a differential amplifier circuit connected to a second end of the first readout transistor and a second end of the second readout transistor.

39. A magnetic memory comprising:
a memory cell comprising a magnetoresistive effect element according to claim 13;
a first wiring electrically connected to a first end of the magnetoresistive effect element; and a second wiring electrically connected to a second end of the magnetoresistive effect element.

40. A magnetic memory comprising:
a memory cell comprising first and second magnetoresistive effect elements according to claim 13;
a first wiring electrically connected to first ends of the first and second magnetoresistive effect elements;
a second wiring electrically connected to a second end of the first magnetoresistive effect element; and
a third wiring electrically connected to a second end of the second magnetoresistive effect element,
wherein a layer arrangement of the first magnetoresistive effect element in a direction directed from the first wiring to the second wiring is opposite to a layer arrangement of the second magnetoresistive effect element in a direction directed from the first wiring to the third wiring.

41. The magnetic memory according to claim 40, comprising:
a first readout transistor having a first end connected to the second wiring;
a second readout transistor having a first end connected to the third wiring; and
a differential amplifier circuit connected to a second end of the first readout transistor and a second end of the second readout transistor.

42. A magnetic memory comprising:
a memory cell comprising a magnetoresistive effect element according to claim 25;
a first wiring electrically connected to a first end of the magnetoresistive effect element; and
a second wiring electrically connected to a second end of the magnetoresistive effect element.

43. A magnetic memory comprising:
a memory cell comprising first and second magnetoresistive effect elements according to claim 25;
a first wiring electrically connected to first ends of the first and second magnetoresistive effect elements;
a second wiring electrically connected to a second end of the first magnetoresistive effect element; and
a third wiring electrically connected to a second end of the second magnetoresistive effect element,
wherein a layer arrangement of the first magnetoresistive effect element in a direction directed from the first wiring to the second wiring is opposite to a layer arrangement of the second magnetoresistive effect element in a direction directed from the first wiring to the third wiring.

44. The magnetic memory according to claim 43, comprising:
a first readout transistor having a first end connected to the second wiring;
a second readout transistor having a first end connected to the third wiring; and
a differential amplifier circuit connected to a second end of the first readout transistor and a second end of the second readout transistor.

* * * * *